(12) United States Patent
Yamazaki et al.

(10) Patent No.: US 7,351,619 B2
(45) Date of Patent: Apr. 1, 2008

(54) PROCESS OF FABRICATING A SEMICONDUCTOR DEVICE

(75) Inventors: Shunpei Yamazaki, Setagaya (JP); Jun Koyama, Sagamihara (JP); Hidehito Kitakado, Kakogawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 430 days.

(21) Appl. No.: 10/831,617

(22) Filed: Apr. 26, 2004

(65) Prior Publication Data

US 2004/0197971 A1 Oct. 7, 2004

Related U.S. Application Data

(62) Division of application No. 09/972,859, filed on Oct. 10, 2001, now Pat. No. 6,737,304, which is a division of application No. 09/523,675, filed on Mar. 10, 2000, now Pat. No. 6,306,694.

(30) Foreign Application Priority Data

Mar. 12, 1999 (JP) ................................. 11-065737

(51) Int. Cl.
*H01L 21/00* (2006.01)
(52) U.S. Cl. ...................... 438/151; 438/164; 438/154
(58) Field of Classification Search ................ 438/151, 438/164, 154
See application file for complete search history.

(56) References Cited

U.S. PATENT DOCUMENTS 5,172,203 A 12/1992 Hayashi 5,242,844 A 9/1993 Hayashi
5,247,190 A 9/1993 Friend et al.

(Continued)

FOREIGN PATENT DOCUMENTS

| JP | 07-130652 | 5/1995 |
|---|---|---|
| JP | 10-092576 | 4/1998 |
| JP | 10-247735 | 9/1998 |
| JP | 11-326954 | 11/1999 |
| WO | WO 90/13148 | 11/1990 |

OTHER PUBLICATIONS

S. Inui et al., *Thresholdless Antiferroelectricity in Liquid Crystals and its Application to Displays*, Journal of Materials Chemistry, vol. 6, No. 4, 1996, pp. 671-673.

(Continued)

*Primary Examiner*—Laura M. Schillinger
(74) *Attorney, Agent, or Firm*—Eric J. Robinson; Robinson Intellectual Property Law Office, P.C.

(57) ABSTRACT

A semiconductor device having high operating performance and reliability is disclosed, and its fabrication process is also disclosed.

In an n-channel type TFT 302, an Lov region 207 is disposed, whereby a TFT structure highly resistant to hot carriers is realized. Further, in an n-channel type TFT 304 forming a pixel portion, Loff regions 217 to 220 are disposed, whereby a TFT structure having a low OFF-current value is realized. In this case, in the Lov region, the n-type impurity element exists at a concentration higher than that of the Loff regions, and the whole of the n-type impurity region (b) which constitutes the Lov region is sufficiently activated by optical annealing, so that a good junction portion is formed between the n-type impurity region and the channel forming region.

5 Claims, 40 Drawing Sheets

U.S. PATENT DOCUMENTS

| | | | |
|---|---|---|---|
| 5,302,966 A | 4/1994 | Stewart | |
| 5,348,903 A | 9/1994 | Pfiester et al. | |
| 5,399,502 A | 3/1995 | Friend et al. | |
| 5,426,064 A | 6/1995 | Zhang et al. | |
| 5,475,238 A | 12/1995 | Hamada | |
| 5,476,802 A | 12/1995 | Yamazaki et al. | |
| 5,491,107 A | 2/1996 | Turner et al. | |
| 5,499,123 A | 3/1996 | Mikoshiba | |
| 5,543,352 A * | 8/1996 | Ohtani et al. | 438/487 |
| 5,548,132 A | 8/1996 | Batra et al. | |
| 5,569,936 A | 10/1996 | Zhang et al. | |
| 5,580,792 A | 12/1996 | Zhang et al. | |
| 5,594,569 A | 1/1997 | Konuma et al. | |
| 5,643,826 A | 7/1997 | Ohtani et al. | |
| 5,696,388 A | 12/1997 | Funada et al. | |
| 5,712,495 A | 1/1998 | Suzawa | |
| 5,770,892 A | 6/1998 | Chan et al. | |
| 5,792,700 A | 8/1998 | Turner et al. | |
| 5,821,559 A | 10/1998 | Yamazaki et al. | |
| 5,828,084 A | 10/1998 | Noguchi et al. | |
| 5,854,494 A | 12/1998 | Yamazaki et al. | |
| 5,856,689 A | 1/1999 | Suzawa | |
| 5,904,508 A | 5/1999 | Codama et al. | |
| 5,904,513 A | 5/1999 | Shimizu et al. | |
| 5,920,362 A | 7/1999 | Lee | |
| 5,923,962 A | 7/1999 | Ohtani et al. | |
| 5,932,893 A | 8/1999 | Miyanaga et al. | |
| 5,998,841 A | 12/1999 | Suzawa | |
| 6,048,781 A | 4/2000 | Turner et al. | |
| 6,078,059 A | 6/2000 | Nakata | |
| 6,130,397 A | 10/2000 | Arai | |
| 6,133,583 A | 10/2000 | Ohtani et al. | |
| 6,140,684 A | 10/2000 | Chan et al. | |
| 6,147,451 A | 11/2000 | Shibata et al. | |
| 6,160,279 A | 12/2000 | Zhang et al. | |
| 6,211,535 B1 | 4/2001 | Yamamoto et al. | |
| 6,232,621 B1 | 5/2001 | Yamazaki et al. | |
| 6,306,694 B1 * | 10/2001 | Yamazaki et al. | 438/151 |
| 6,737,304 B2 * | 5/2004 | Yamazaki et al. | 438/151 |
| 6,808,968 B2 * | 10/2004 | Yamazaki et al. | 438/166 |
| 6,858,480 B2 * | 2/2005 | Nakamura et al. | 438/162 |
| 6,867,077 B2 * | 3/2005 | Nakazawa et al. | 438/153 |
| 6,913,956 B2 * | 7/2005 | Hamada et al. | 438/149 |
| 7,033,871 B2 * | 4/2006 | Nakamura et al. | 438/162 |
| 7,052,943 B2 * | 5/2006 | Yamazaki et al. | 438/166 |
| 7,078,321 B2 * | 7/2006 | Yoshimoto | 438/486 |
| 7,115,453 B2 * | 10/2006 | Nakamura et al. | 438/166 |
| 7,122,450 B2 * | 10/2006 | Yamazaki et al. | 438/486 |
| 2002/0028543 A1 * | 3/2002 | Yamazaki et al. | 438/154 |
| 2004/0197971 A1 * | 10/2004 | Yamazaki et al. | 438/164 |

OTHER PUBLICATIONS

Furue et al., "Characteristics and Driving Scheme of Polymer-Stabilized Monostable FLCD Exhibiting Fast Response Time and High Contrast Ratio with Gray-Scale Capability," SID 98 DIGEST, pp. 782-785, 1998.

Yoshida et al., "A Full-Color Thresholdless Antiferroelectric LCD Exhibiting Wide Viewing Angle with Fast Response Time," SID 97 DIGEST, pp. 841-844, 1997.

Hatano et al., "A Novel Self-aligned Gate-overlapped LDD Poly-si TFT with High Reliability and Performance," IEDM Technical Digest 97, pp. 523-526, 1997.

Schenk et al., "Polymers for Light Emitting Diodes," Sep. 6-9, 1999, pp. 33-37, EuroDisplay '99 Proceedings.

Shimokawa et al., "Characterization of High-Efficiency Cast-Si Solar Cell Wafers by MBIC Measurement," May 1988, pp. 751-758, Japanese Journal of Applied Physics, vol. 27, No. 5.

* cited by examiner

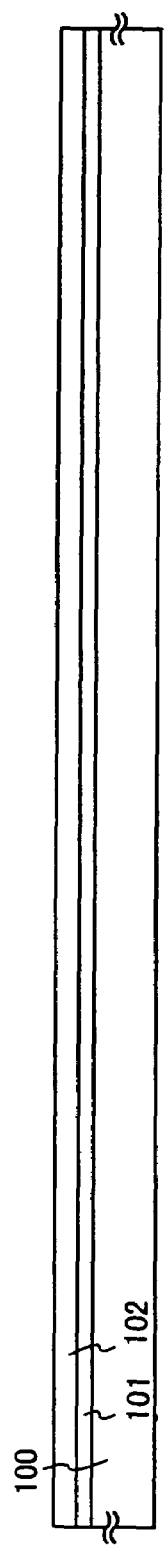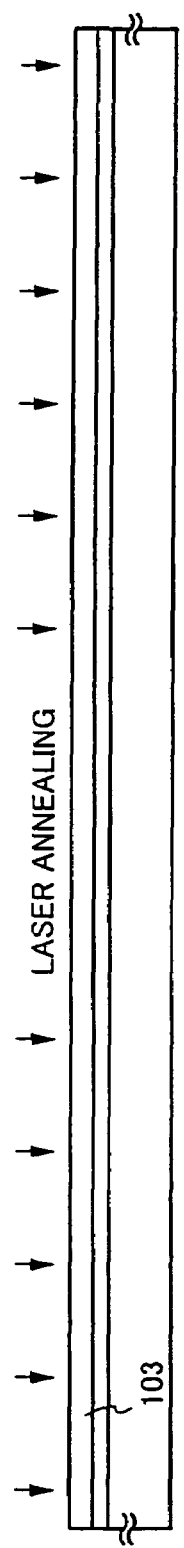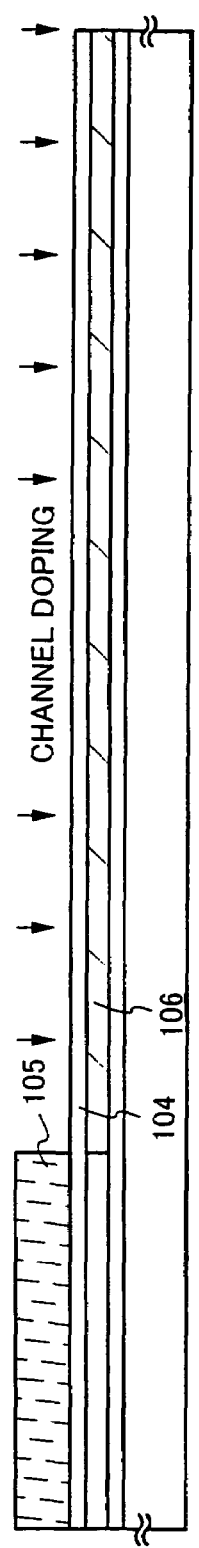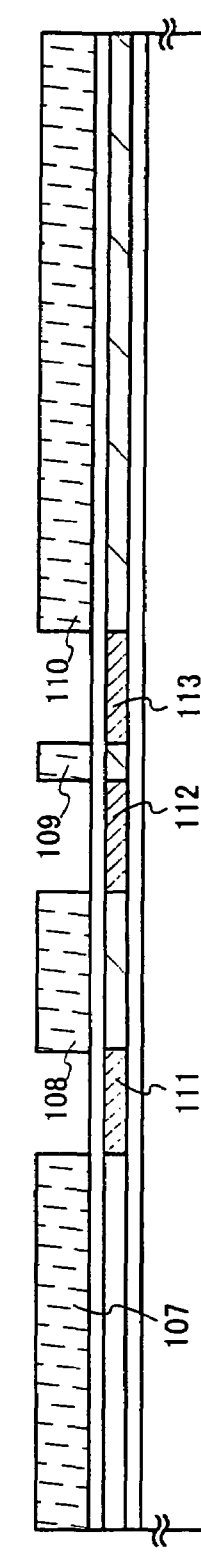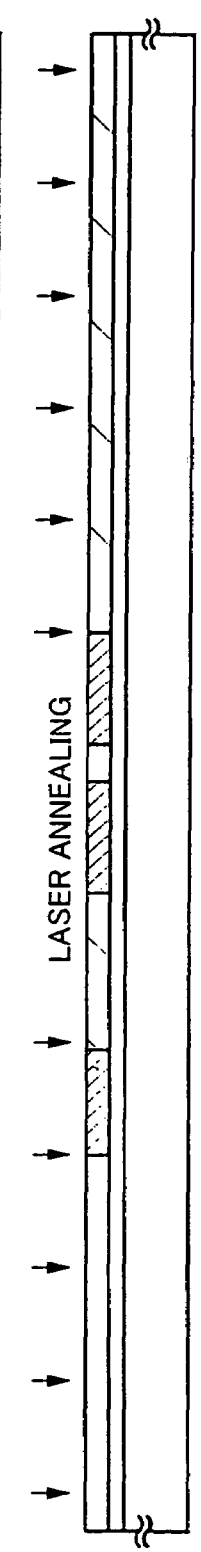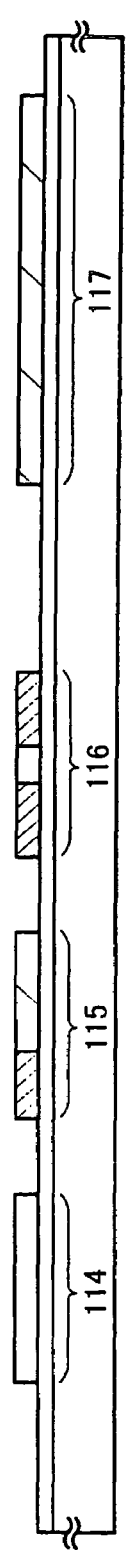

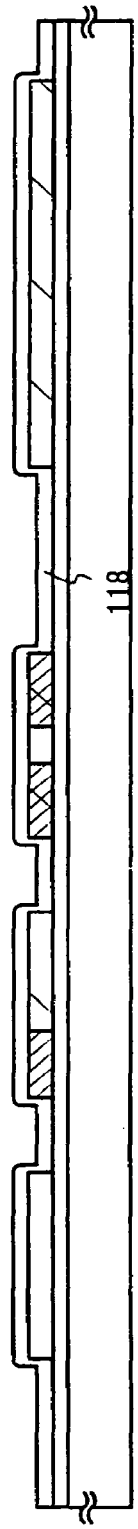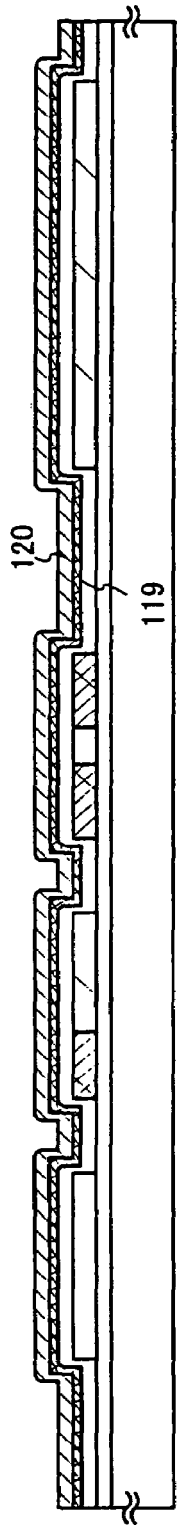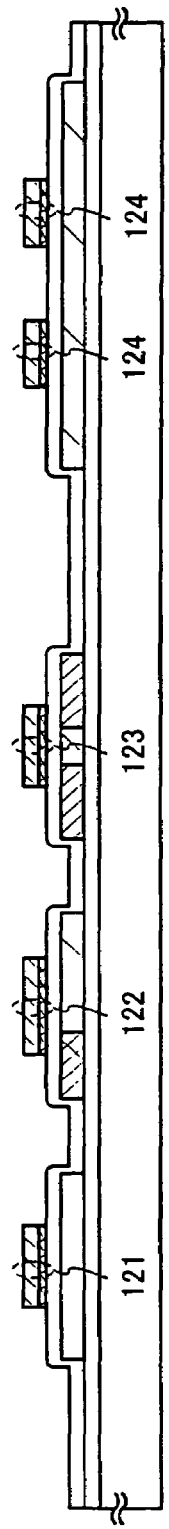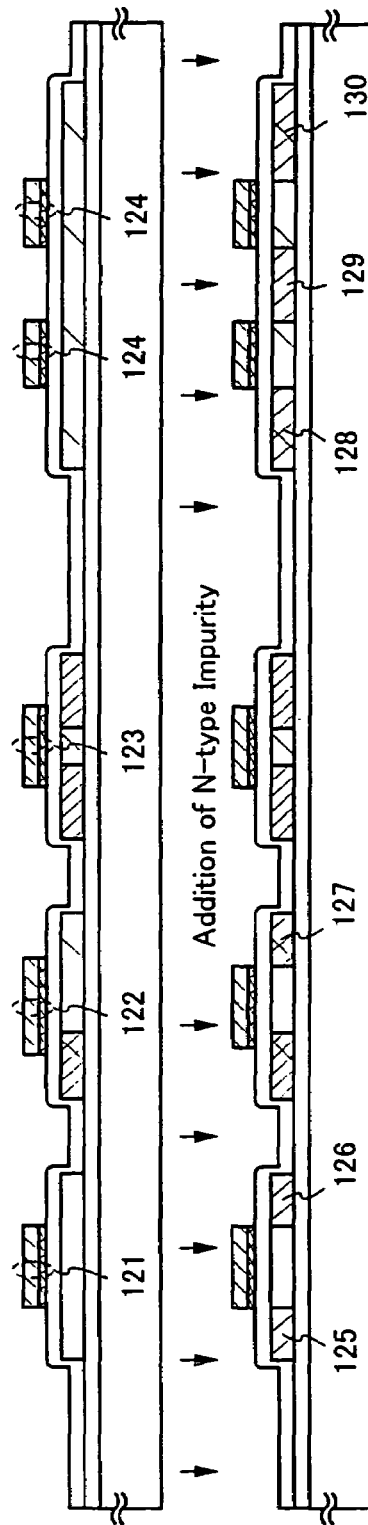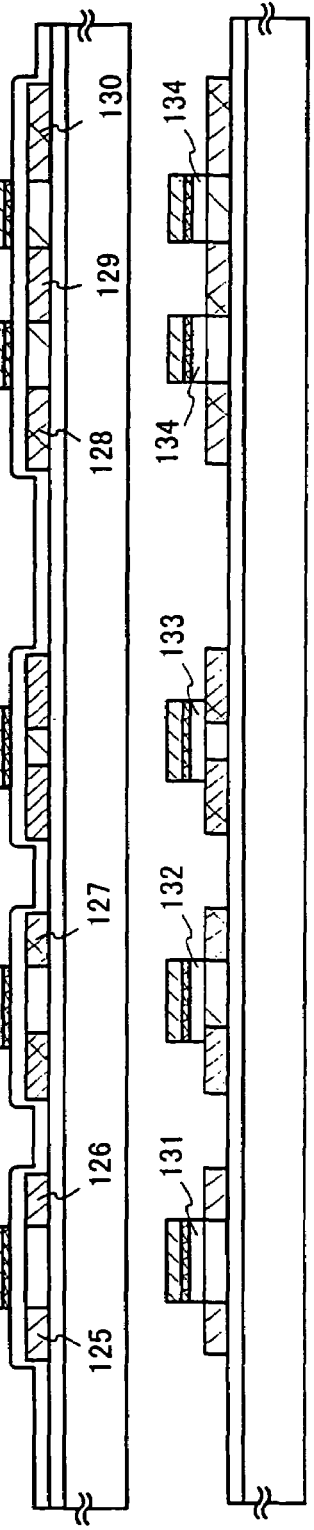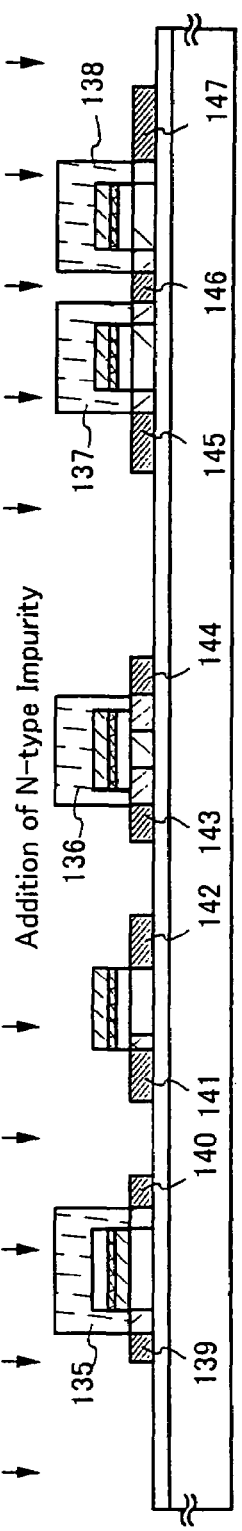

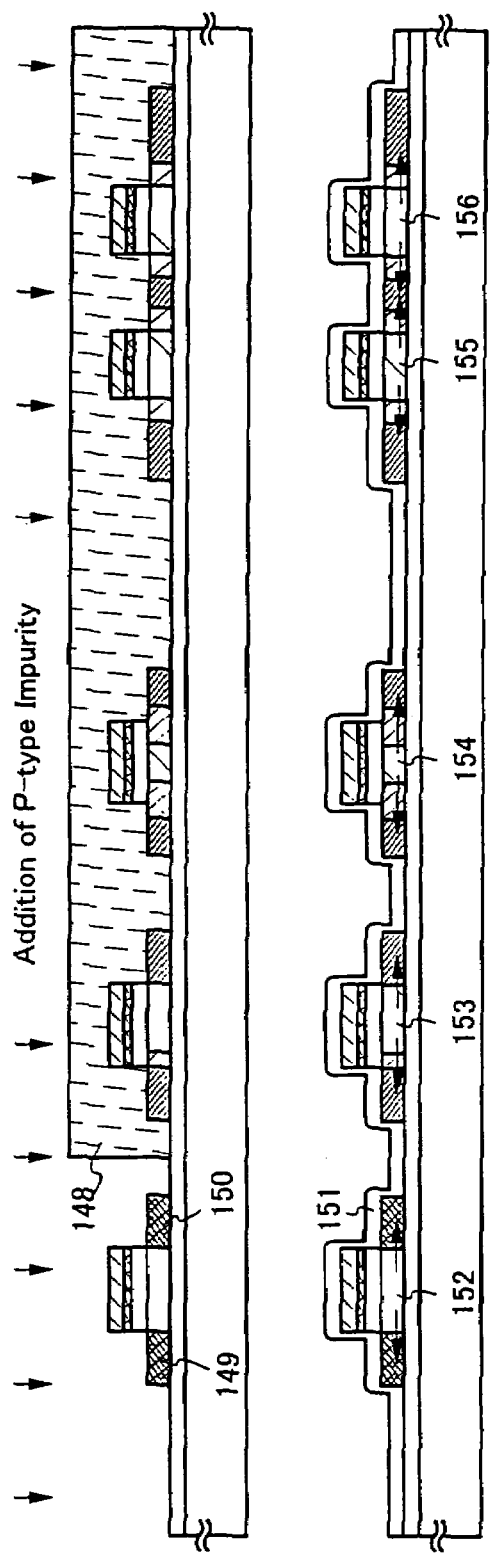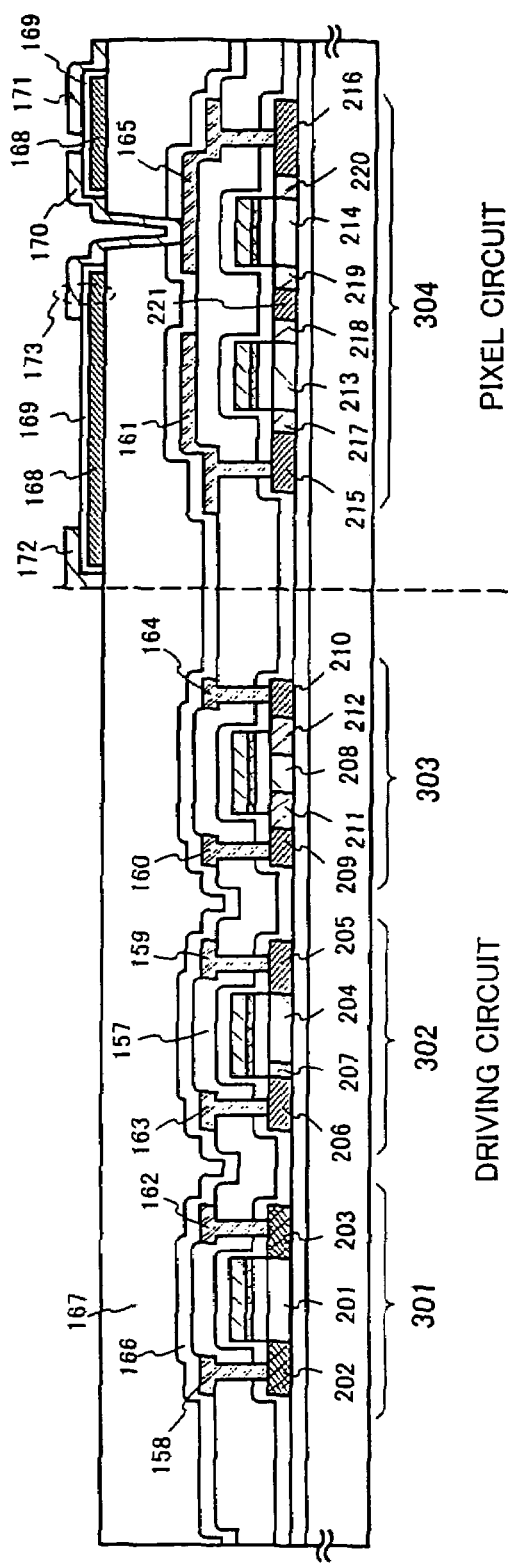

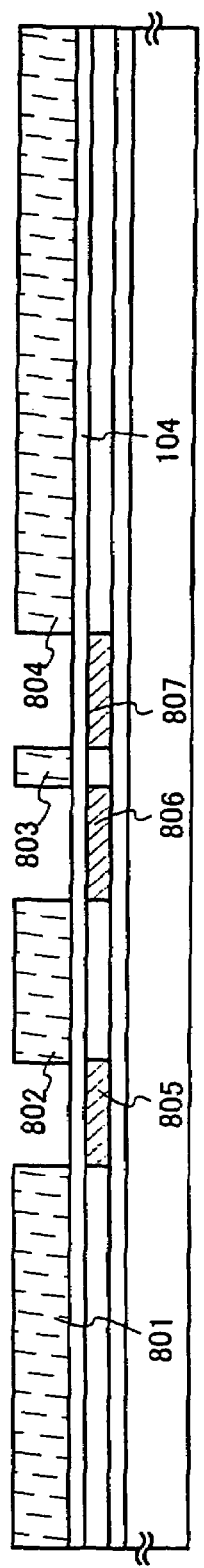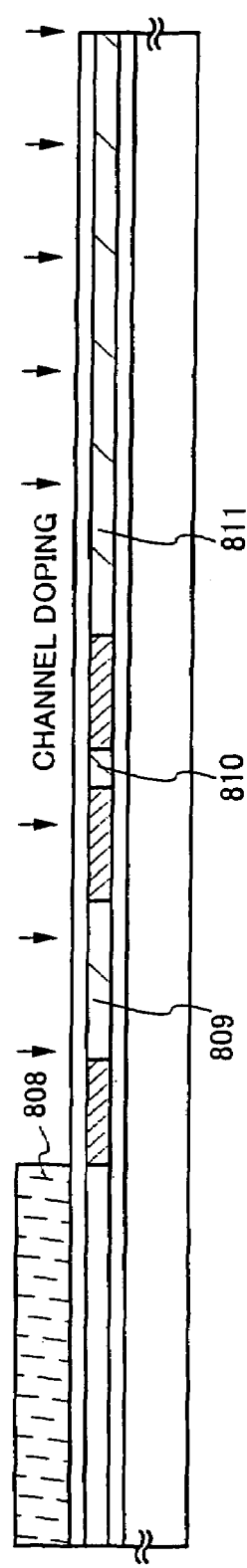

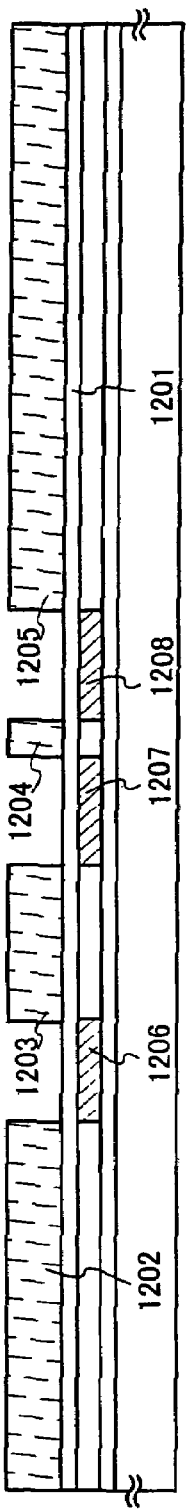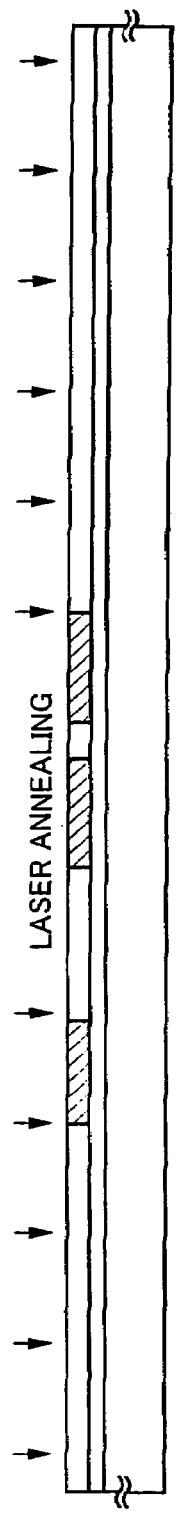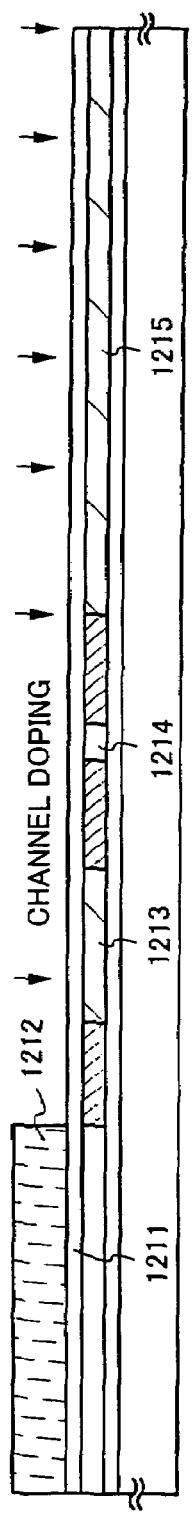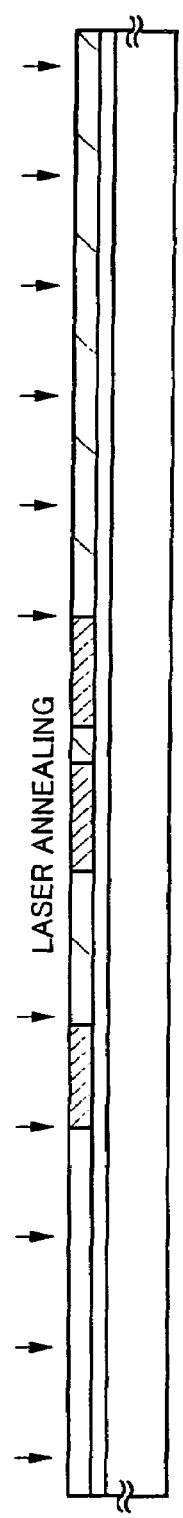

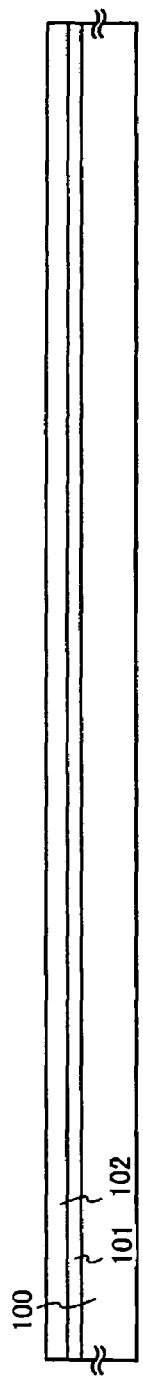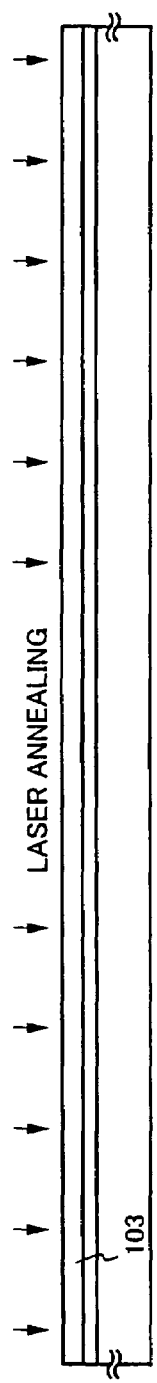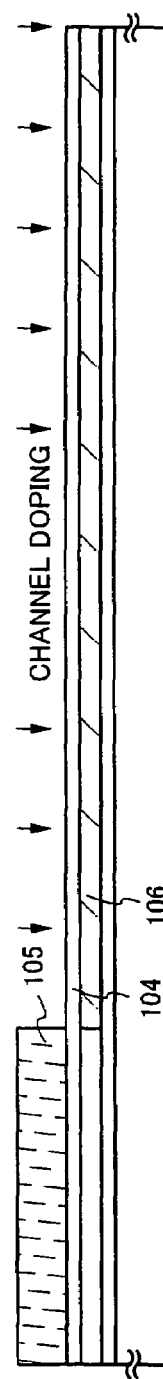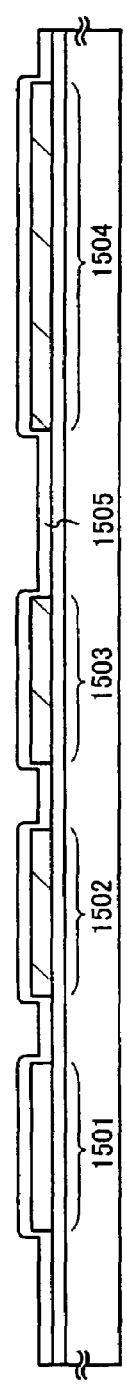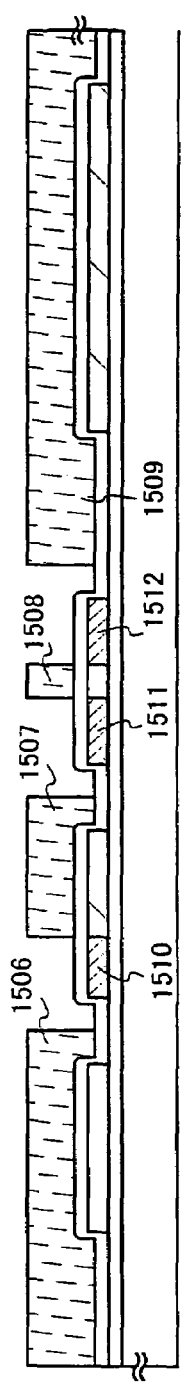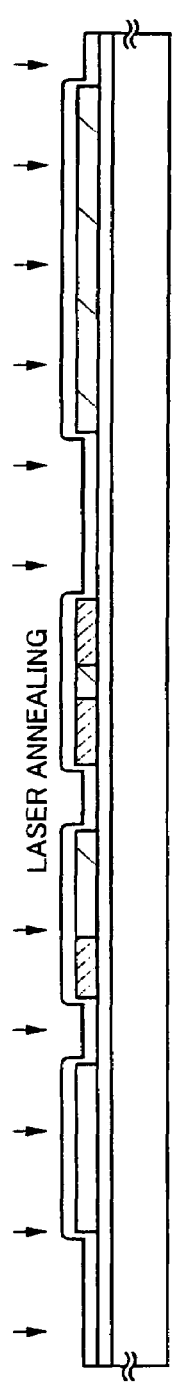

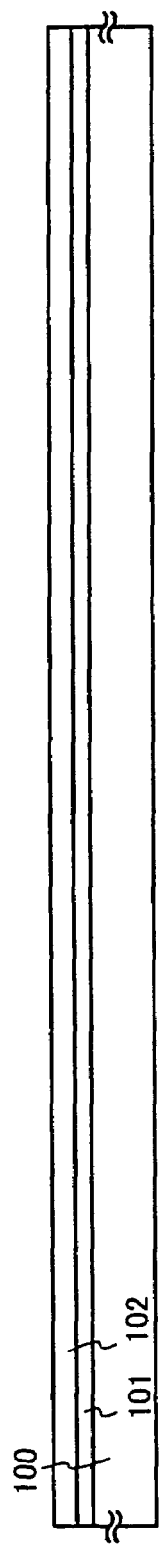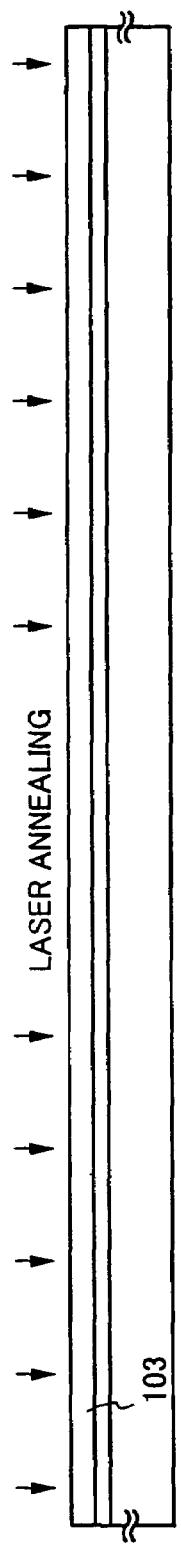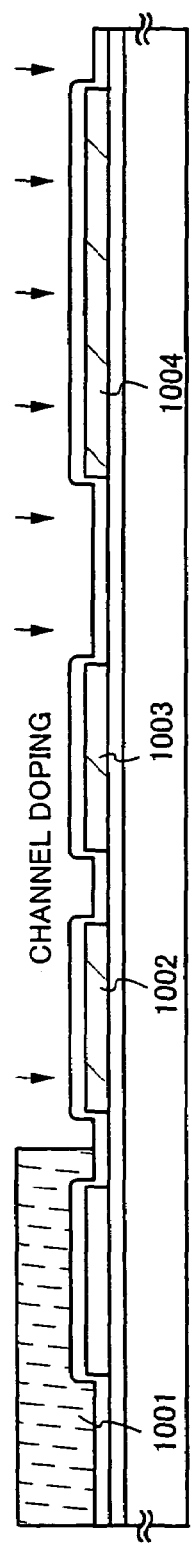

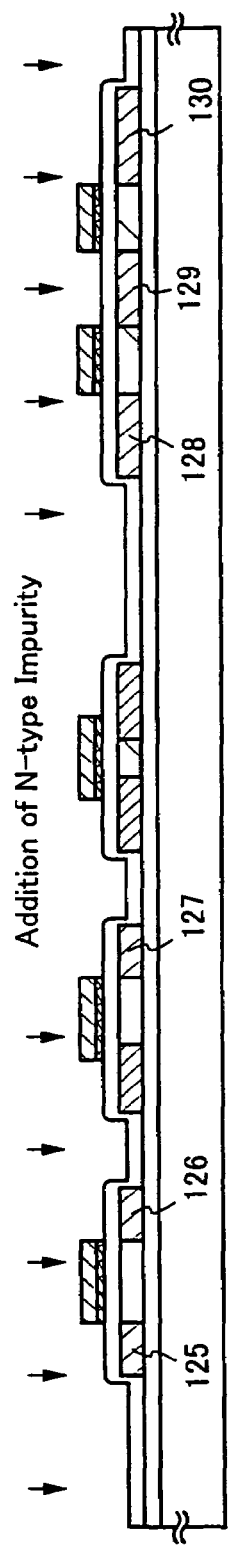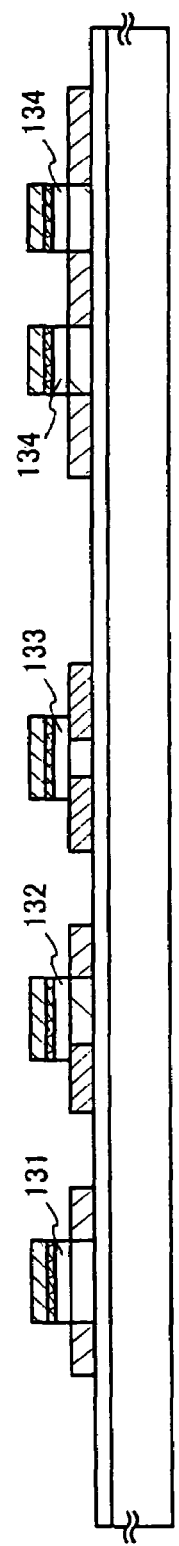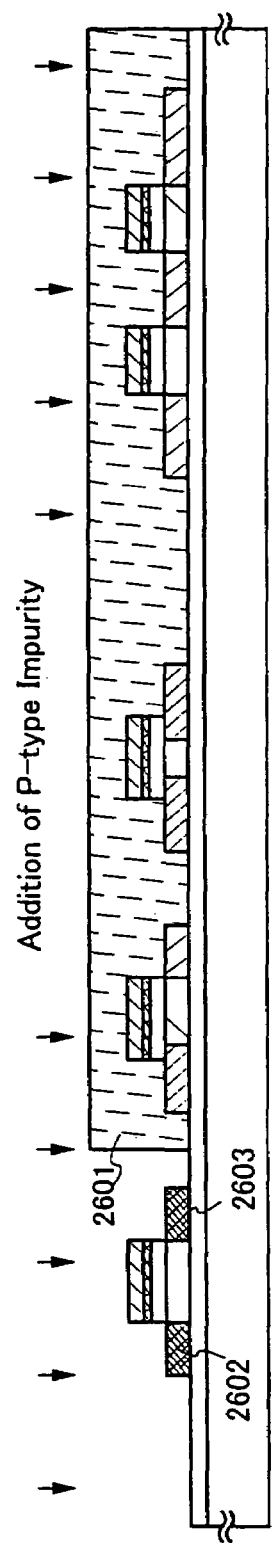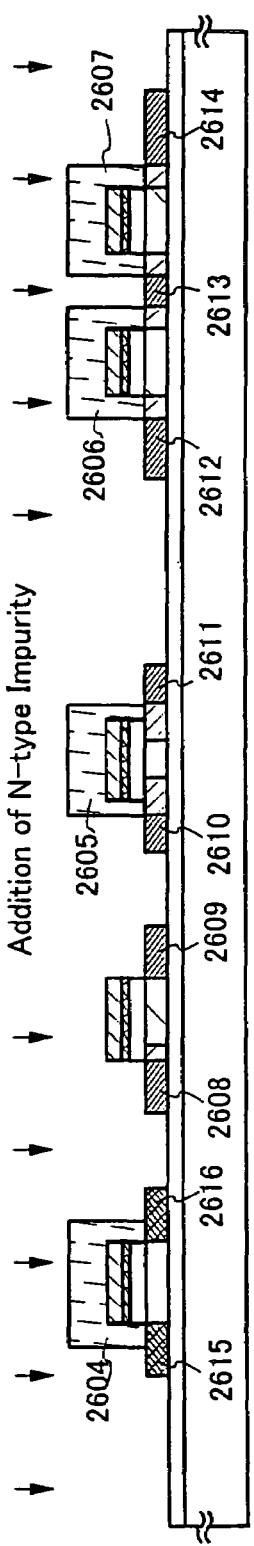

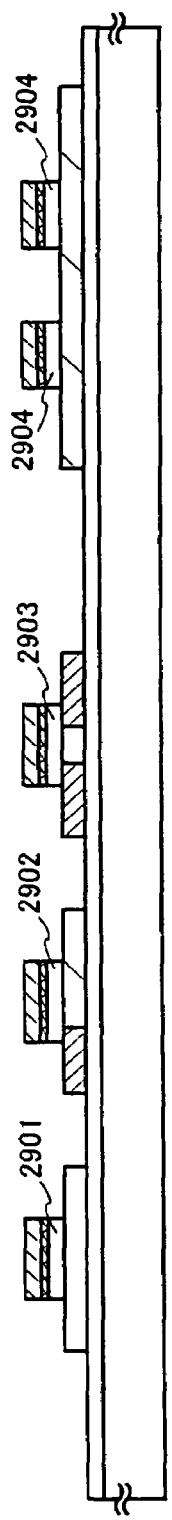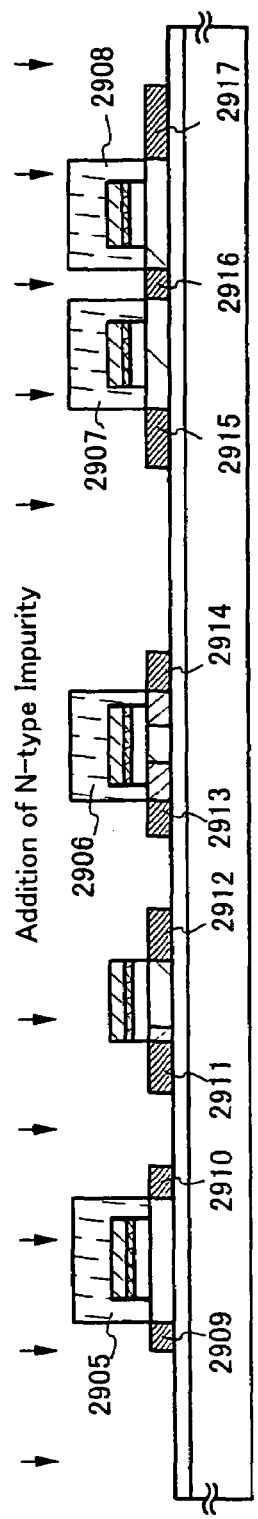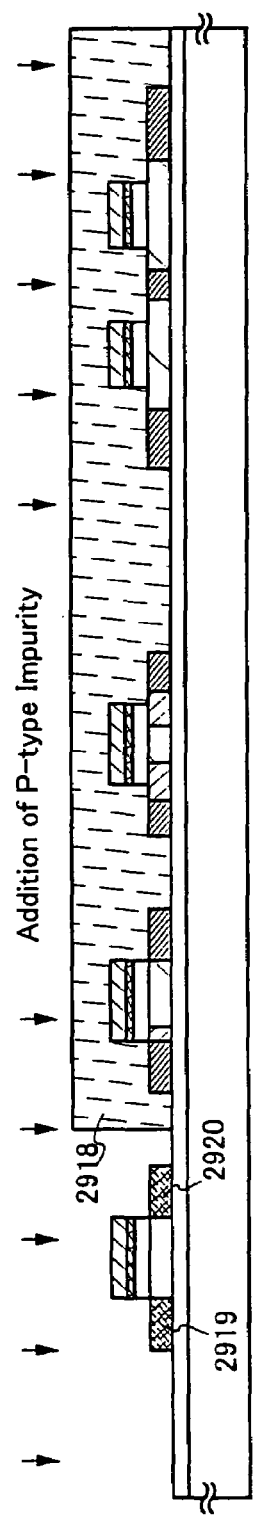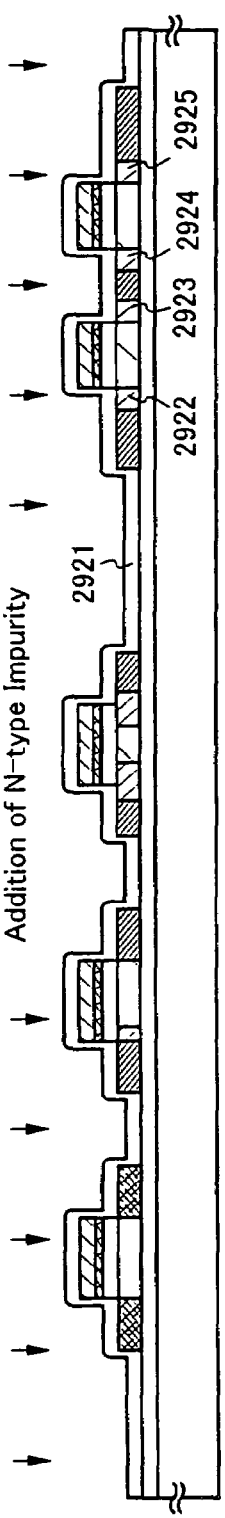

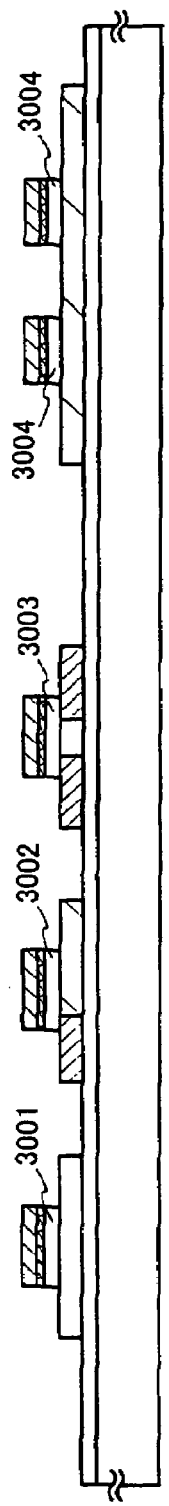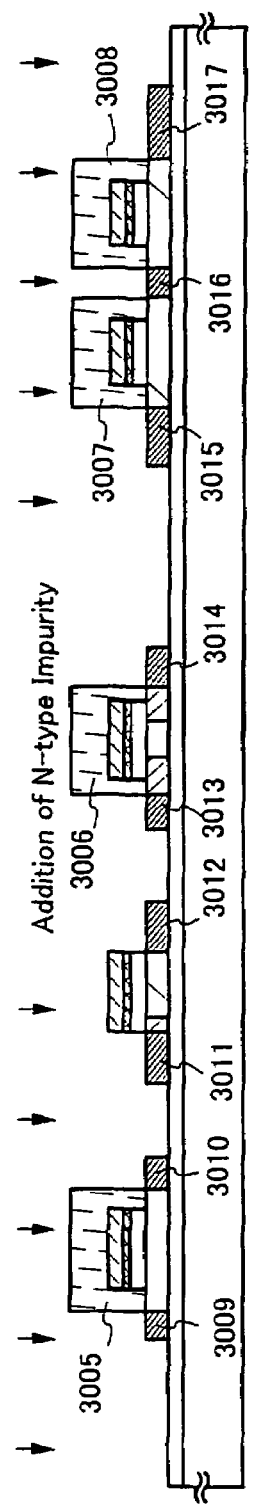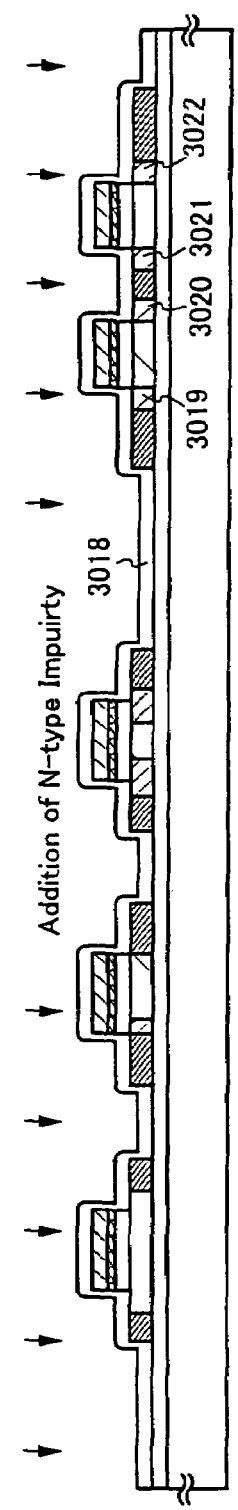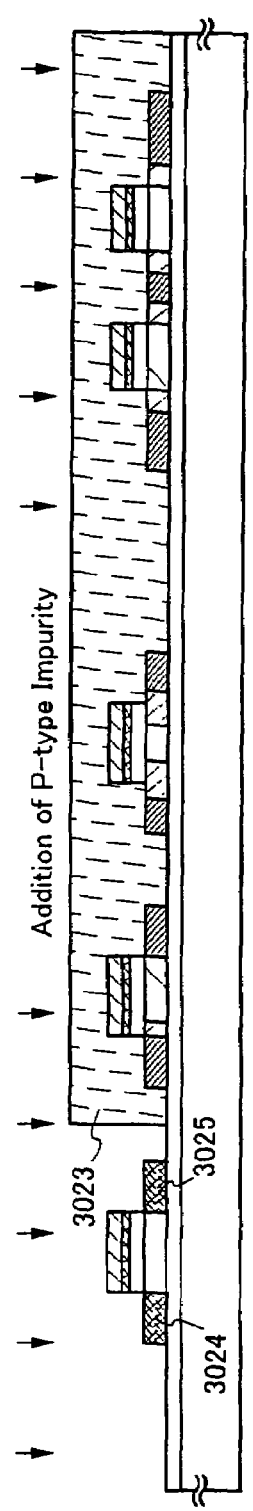
Fig. 30A
Fig. 30B
Fig. 30C
Fig. 30D

PROCESS OF FABRICATING A SEMICONDUCTOR DEVICE

BACKGROUND OF THE INVENTION

1. Field of the Invention

The present invention relates to a semiconductor device which has circuits constituted, over a substrate having an insulating surface, of thin film transistors (hereinafter referred to as TFTs) and its fabricating process. Particularly, the invention relates to an electro-optical device (also called electronic device) represented by a liquid crystal display device or an EL (electroluminescence) display device which is constituted in such a manner that a pixel portion (pixel circuit) and driving circuits (control circuits) disposed in the periphery of the pixel portion are provided on one and the same substrate and an electro-optical appliance (also called an electronic apparatus) presented by an EL (electroluminescence) display device, and an electric appliance (also called electronic apparatus) on which an electro-optical device is mounted.

In this specification, by semiconductor devices, devices in general which function by utilizing the semiconductor characteristics are referred to, and the above-mentioned electro-optical device and an electric appliance on which the electro-optical device is mounted are also covered by the semiconductor devices.

2. Description of the Related Art

The development of semiconductor devices which each comprises a large-area integrated circuit formed of TFTs on a substrate having an insulating surface is being advanced. Known as representative examples of these semiconductor devices are an active matrix type liquid crystal display device, an EL display device, and a contact type image sensor. Particularly, TFTs (hereinafter referred to as polycrystalline silicon TFTs) each constituted in such a manner that a crystalline silicon film (typically, a polycrystalline silicon film) is rendered into an active layer have a high field effect mobility and thus can form various functional circuits.

For example, in an active matrix type liquid crystal display device, a pixel portion which effects image display by every function block and driving circuits such as shift registers, level shifters, buffers and sampling circuits which are based on CMOS circuits are formed on one substrate. Further, in a contact type image sensor, driving circuits such as sample and hold circuits, shift registers, multiplexed circuits for controlling the pixel portion are formed by the use of TFTs.

Since these driving circuits (also known as peripheral driving circuits) do not always have the same operating condition, the characteristics required of the TFTs naturally differ not a little. In the pixel portion, pixel TFTs functioning as switch elements and auxiliary capacitance storage are provided, and a voltage is applied to the liquid crystal to drive it. Here, the liquid crystal needs to be driven by AC, and the system called frame inversion driving is adopted in many cases. Accordingly, for the characteristics required of the TFTs, it was necessary to keep the OFF-current value (the value of the drain current flowing when a TFT is in OFF-operation) sufficiently low.

Further, the buffer, to which a high driving voltage is applied, had to have its withstand voltage enhanced up to such a degree that the buffer would not be broken even if a high voltage was applied thereto. Further, in order to enhance the current driving ability, it was necessary to sufficiently secure the ON-current value (the value of the drain current flowing when the TFT is in ON-operation).

However, there is the problem that the OFF-current value of a polycrystalline silicon TFT is apt to become high. Further, in case of a polycrystalline silicon TFT, there is observed the deterioration phenomenon that its ON-current value falls as in case of a CMOS transistor used in an IC or the like. The main cause therefor lies in the injection of hot carriers; it is considered that the hot carriers generated by the high electric field in the vicinity of the drain cause the deterioration phenomenon.

As a TFT structure for lowering the OFF-current value, the lightly doped drain (LDD) structure is known. This structure is made in such a manner that, between the channel forming region and the source region or the drain region to which an impurity is added at a high concentration, an impurity region having a low concentration is provided. This low concentration impurity region is known as LDD region.

Further, as a structure for preventing the deterioration of the ON-current value due to the injection of hot carriers, there is known the so-called GOLD (Gate-drain Overlapped LDD) structure. In case of this structure, the LDD region is disposed so as to overlap the gate wiring through the gate insulating film, so that this structure is effective for preventing the injection of hot carriers in the vicinity of the drain to enhance the reliability. For example, Mutsuko Hatono, Hajime Akimoto and Takeshi Sakai: IEDM97 TECHNICAL DIGEST, pp. 523-526, 1997, discloses a GOLD structure by the side wall formed of silicon; and it is confirmed that, according to this structure, a very high reliability can be obtained as compared with the TFTs of other structures.

Further, in the pixel portion of an active matrix type liquid crystal display device, a TFT is disposed to each of several ten millions to several hundred millions of pixels, and these TFTs are each provided with a pixel electrode. At the side of the substrate opposed to the pixel electrode through the liquid crystal, an opposite electrode is provided, thus forming a kind of capacitor with the liquid crystal as a dielectric. Then the voltage applied to each of the pixels is controlled by the switching function of the TFT to thereby control the charges to this capacitor, whereby the liquid crystal is driven, and the quantity of transmitted light is controlled, thus displaying an image.

However, the stored capacitance of this capacitor is gradually decreased due to the leakage current caused for causes pertaining to the OFF-current etc., which in turn becomes the cause for varying the quantity of transmitted light to lower the contrast of the image display. Thus, according to the known technique, a capacitor wiring is provided to form in parallel a capacitor (capacitance storage) other than the capacitor constituted with the liquid crystal as its dielectric, whereby the capacitance lost by the capacitor having the liquid crystal as its dielectric was compensated for.

SUMMARY OF THE INVENTION

However, the characteristics required of the pixel TFTs in the pixel portion and the characteristics required of the TFTs (hereinafter referred to as driving TFTs) in the driving circuits such as the shift registers and the buffers are not necessarily identical with each other. For example, in case of a pixel TFT, a large reverse bias (minus, in case of an n-channel type TFT) voltage is applied to the gate wiring, but a driving TFT is never operated with a reverse bias voltage applied thereto. Further, the operating speed of the former TFT can be $1/100$ or lower of the operating speed of the latter TFT.

Further, the GOLD structure has a high effect for preventing the deterioration of the ON-current value, indeed, but, on the other hand, has the defect that the OFF-current value becomes large as compared with the ordinary LDD structure. Accordingly, it could not be considered that the GOLD structure was a desirable structure particularly for the pixel TFT. It has been known that, conversely, the ordinary LDD structure has a high effect for suppressing the OFF-current value but is low in resistance to the injection of hot carriers.

As stated above, it was not always desirable to form all the TFTs with the same structure, in a semiconductor device including a plurality of integrated circuits as in case of an active matrix type liquid crystal display device.

Further, in case, as according to the known technique described above, a capacitance storage using a capacitor wiring is formed in the pixel portion so as to secure a sufficient capacitance, the aperture ratio (the ratio of the image-displayable area to the area of each pixel) had to be sacrificed. Particularly, in case of a small-sized, highly precise panel as is used in a projector type display device, the area per pixel is small, so that the reduction of the aperture ratio due to the capacitor wiring has become a problem.

The present invention relates to a technique for giving solutions to such problems, and it is the purpose of the invention to make the structures of the TFTs disposed in the respective circuits of a semiconductor device appropriate in accordance with the functions of the circuits to thereby enhance the operability and reliability of the semiconductor device. Further, it is the object of the invention to provide a fabrication process for realizing such a semiconductor device.

Another purpose of the invention is to provide a structure, for a semiconductor device having a pixel portion, which structure is constructed in such a manner that the area of the capacitance storage provided to each pixel is reduced to enhance the aperture ratio. Further, the invention provides a process of fabricating such a pixel portion.

In order to solve solutions to the problematic points mentioned above, a semiconductor device including a pixel portion and driving circuits on one and the same substrate according to the present invention is constituted in such a manner that;

the LDD regions of an n-channel type TFT forming each of the driving circuits are formed so as to partially or wholly overlap the gate wiring of the n-channel type TFT through the gate insulating film, the LDD regions of a pixel TFT forming the pixel portion are formed so as not to overlap the gate wiring of the pixel TFT through the gate insulating film, and, in the LDD regions of the n-channel type TFT forming the driving circuit, an n-type impurity element is contained at a concentration higher than that of the LDD regions of the pixel TFT.

Further, in addition to the structure mentioned above, the capacitance storage of the pixel portion may be formed of a light screening film provided on an organic resin film, an oxide of the light screening film and the pixel electrode. By so doing, the capacitance storage can.,be formed by the use of a very small area, so that the aperture ratio of the pixels can be enhanced.

Further, a more detailed structure according to the present invention lies in a semiconductor device including a pixel portion and driving circuits on one and the same substrate, which is characterized in that the driving circuits include a first n-channel type TFT formed in such a manner that the whole of the LDD regions overlaps the gate wiring through the gate insulating film and a second n-channel type TFT formed in such a manner that portions of the LDD regions overlap the gate wiring through the gate insulating film, and, in the pixel portion, there are included pixel TFTs each formed in such a manner that the LDD regions does not overlap the gate wiring through the gate insulating film. It is a matter of course that the capacitance storage in the pixel portion may be formed of a light screening film provided on an organic resin film, an oxide of the light screening film and the pixel electrode.

In the structure mentioned above, in the LDD regions of the n-channel type TFT forming a driving circuit, an element belonging to the group XV of the periodic table is to be contained at a concentration 2 to 10 times as high as that in the LDD regions of the pixel TFT. Further, it is also possible to form the LDD region of the first n-channel type TFT between the channel forming region and the drain region and to form the LDD regions of the second n-channel type TFT at both sides of the channel forming region.

Further, the constitution of the fabrication process according to the invention is as follows:

A process of fabricating a semiconductor device which includes a pixel portion and driving circuits on one and the same substrate, comprising the first step of forming a semiconductor film containing a crystalline structure on the substrate, the second step of subjecting said crystalline structure containing semiconductor film to a first optical annealing, the third step of forming a protective film on the crystalline structure containing semiconductor film which has been subjected to said first optical annealing, the fourth step of adding a p-type impurity element, through said protective film, to those regions of said crystalline structure containing semiconductor film which are to constitute n-channel type TFTs forming said driving circuits, whereby p-type impurity regions (b) are formed, the fifth step of adding an n-type impurity element, through said protective film, to those regions of said crystalline structure containing semiconductor film which are to constitute n-channel type TFTs forming said driving circuits, whereby n-type impurity regions (b) are formed, the sixth step of subjecting, to a second optical annealing, the crystalline structure containing semiconductor film which has undergone the fifth step, the seventh step of patterning the crystalline structure containing semiconductor film which has undergone the sixth step to form active layers, the eighth step of forming a gate insulating film on said active layers, the ninth step of forming gate wirings on said gate insulating film, the tenth step of adding an n-type impurity element to said active layers by the use of said gate wirings as a mask to form n-type impurity regions (c), the eleventh step of etching said gate insulating film by the use of said gate wirings as a mask, the twelfth step of adding an n-type impurity element to said n-channel type TFTs to form n-type impurity regions (a), and the thirteenth step of adding a p-type impurity element to the active layer of said p-channel type TFT to form p-type impurity regions (a).

In this structure, the order of the first step to the 8th step may be suitably changed. In whatever order these steps are carried out, the basic functions of the finally formed TFTs remain unchanged, and thus, the change of the step order does not impair the effects of the invention.

Further, the order of the step of forming the p-type impurity regions (a), the step of forming the n-type impurity regions (a) and the step of forming the n-type impurity regions (b) can also be suitably changed. In this case, in whatever order the steps are carried out, the basic functions of the finally formed TFTs also remain unchanged; and thus, such change in the step order does not impair the effects of the invention.

BRIEF DESCRIPTION OF THE DRAWINGS

FIGS. 1A-1F are diagrams showing some steps for fabricating a pixel portion and a driving circuit.

FIGS. 2A-2F are diagrams showing some steps for fabricating a pixel portion and a driving circuit.

FIGS. 3A-3C are diagrams showing some steps for fabricating a pixel portion and a driving circuit.

FIGS. 8A-8B are diagrams showing some steps for fabricating a pixel portion and a driving circuit.

FIGS. 12A-12D are diagrams showing some steps for fabricating a pixel portion and a driving circuit.

FIGS. 15A-15F are diagrams showing some steps for fabricating a pixel portion and a driving circuit.

FIGS. 16A-16D are diagrams showing some steps for fabricating a pixel portion and a driving circuit.

FIGS. 26A-26D are diagrams showing some steps for fabricating a pixel portion and a driving circuit.

FIGS. 29A-29D are diagrams showing some steps for fabricating a pixel portion and a driving circuit.

FIGS. 30A-30D are diagrams showing some steps for fabricating a pixel portion and a driving circuit.

DESCRIPTION OF THE PREFERRED EMBODIMENTS

Figure 4:
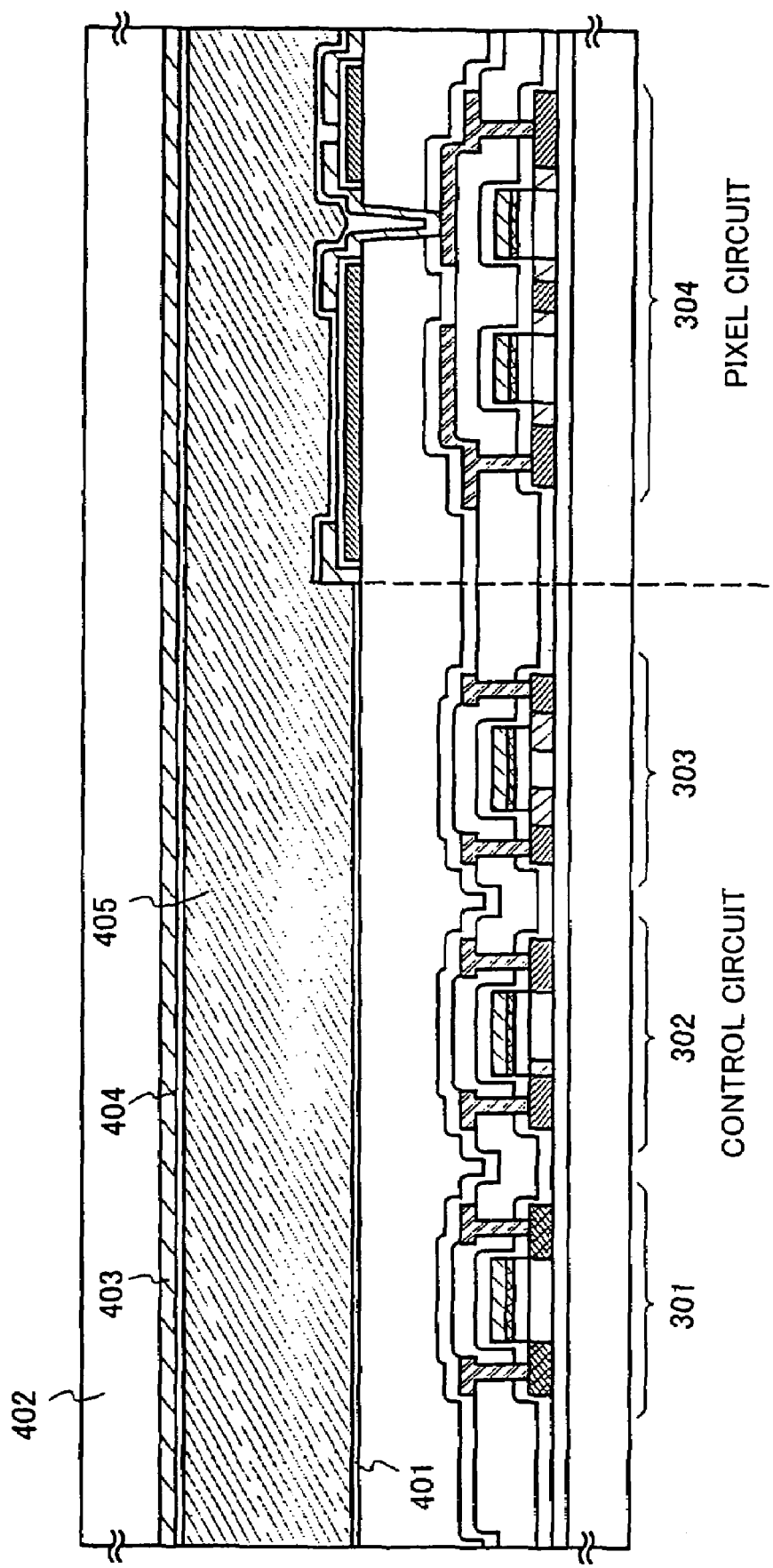
FIG. 4 is a diagram showing the sectional structure of the active matrix type liquid crystal display device.

Preferred embodiments of the present invention will now be described in detail below.

Embodiment 1

An Embodiment of the invention will now described referring to FIGS. 1 to 4. Here, the process of simultaneously fabricating the TFTs in the pixel portion and in the driving circuits provided in the periphery of the pixel portion will be described. However, for simplicity of the description, it is to be assumed that, in the driving circuits, a CMOS circuit which is the basic circuit of a shift register, a buffer, etc. and an n-channel type TFT forming a sampling circuit are shown.

Referring to FIG. 1A, as a substrate 100, a glass substrate or a quartz substrate is preferably used. Besides, there may also be used a substrate formed in such a manner that an insulation film is formed on the surface of a silicon substrate, a metal substrate or a stainless steel substrate. It is also possible to use a plastics substrate (including a plastics film, too) in case the heat resistance thereof permits.

On the surface of the substrate 100 on which the TFTs are formed, a round film 101 which comprises a silicon-containing insulation film (which is a generic name, in this specification, standing for a silicon oxide film, a silicon nitride film, or a silicon oxinitride film) was formed to a thickness of 100 to 400 nm by the plasma CVD method or the sputtering method. Further, by the silicon oxinitride film mentioned in this specification, an insulation film represented by SiOxNy (wherein 0<x and y<1) is referred to; an insulation film containing silicon, oxygen and nitrogen at a predetermined ratio is referred to. Further, the silicon oxinitride film can be made using $SiH_4$, $N_2O$ and $NH_3$ as material gases, and the concentration of the nitrogen contained is preferably set to at least 25 atomic % but less than 50 atomic %.

In this Embodiment, as the ground film 101, a double layer structure film was used which was comprised of a silicon oxinitride film formed to a thickness of 25 to 100 nm, (a thickness of 50 nm, here), and a silicon oxide film formed to a thickness of 50 to 300 nm (a thickness of 150 nm, here), The ground layer 101 is provided for preventing the contamination by the impurities from the substrate; in case a quarts substrate is used, the ground layer may not necessarily be provided.

Next, on the ground layer 101, a semiconductor film with a thickness of 20 to 100 nm containing an amorphous structure (an amorphous silicon film (not shown), in this Embodiment) was formed by a known deposition method. As amorphous structure containing semiconductor films, an amorphous semiconductor film and a microcrystalline semiconductor film are pointed out, and further, a compound semiconductor film containing an amorphous structure such as an amorphous silicon germanium film is also included.

Then, in accordance with the technique disclosed in Japanese Patent Laid-Open No. 130652/1995 (corresponding to U.S. Pat. No. 5,643,826), a crystalline structure containing semiconductor film (a crystalline silicon film, in this Embodiment) 102 was formed. The technique disclosed in Japanese Patent Laid-open No. 130652/1995 pertains to a crystallizing means using a catalytic element (one or more elements selected from among nickel, cobalt, germanium, tin, lead, palladium, iron and copper; typically nickel) for promoting the crystallization of the amorphous silicon film.

More specifically, in the state in which the catalytic element is held on the surface of the amorphous silicon film, heat treatment is carried out to change the amorphous silicon film to a crystalline silicon film. In this Embodiment, the technique according to Embodiment 1 disclosed in Japanese Patent Laid-Open No. 130652/1995 is used, but the technique according to Embodiment 2 may also be used. Among the crystalline silicon films, so-called monocrystalline silicon films and polycrystalline silicon films are also included, but the crystalline silicon film formed in this Embodiment is a silicon film having grain boundaries. (FIG. 1A)

The crystallization step is carried out preferably in such a manner that the amorphous silicon film is heated preferably at 400 to 550° C. for several hours, though it depends on the hydrogen quantity contained, to perform a dehydrogenation treatment, whereby the hydrogen quantity contained is brought down to 5 atomic % or less. Further, the amorphous silicon film may alternatively be formed by the use of another method such as the sputtering method or the evaporation method, in which case it is desirable to sufficiently reduce the impurity elements such as oxygen and nitrogen contained in the film.

Here, the ground film and the amorphous silicon film can be formed by the same deposition method, so that both films may be continuously formed. After the ground film is formed, care should be taken not to allow it to be exposed to the atmospheric air, whereby it, becomes possible to prevent the contamination of the surface; and the dispersion in characteristics of the TFTs fabricated can be reduced.

Next, to the crystalline silicon film 102, the light (laser beam) emitted from a laser beam source was irradiated (which will hereinafter be referred to as laser annealing) to thereby form a crystalline silicon film 103 which had its crystallinity improved. As the laser beam, an excimer laser beam of the pulse oscillation type or the continuous oscillation type is desirable, but the beam of an argon laser of the continuous oscillation type may also be used. Further, the beam shape of the laser beam may either be linear or rectangular. (FIG. 1B)

Further, in place of the laser beam, the light (lamp light) emitted from a lamp may be irradiated (which will hereinafter be referred to as lamp annealing). As the lamp light, the light of a halogen lamp or an infrared lamp can be used.

The step of performing heat treatment by the use of a laser beam or a lamp light is called an optical annealing step. In case of an optical annealing step, high-temperature heat treatment can be effected in a short time, so that, even in case of using a substrate such as a glass substrate which has a low heat resistance, an effective heat treatment step can be carried out with a high throughput. Of course, the purpose of this step is to anneal, and therefore, it can be substituted with a furnace annealing (also known as thermal annealing) using an electric furnace.

In this Embodiment, the beam of a pulse oscillation type excimer laser was treated into a linear beam to carry out a laser annealing step. As the laser annealing condition, an XeCl gas was used as excitation gas, the treating temperature was set to room temperature, the pulse oscillation frequency was set to 30 Hz, and the laser energy density was set to 250 to 500 mJ/cm$^2$ (preferably, 350 to 400 mJ/cm$^2$).

The laser annealing step carried out under the above-mentioned condition exhibits the effect that the amorphous region left after the thermal crystallization is perfectly crystallized, and at the same time, the defects of the already crystallized crystalline region are reduced. Therefore, this step can also be called a step for improving the crystallinity of the semiconductor film by optical annealing or a step for promoting the crystallization of the semiconductor film. Such an effect can also be obtained by optimizing the lamp annealing condition. In this specification, the optical annealing carried out under such a condition will be called a first optical annealing.

Next, a protective film 104 was formed in preparation for the later addition of an impurity onto the crystalline silicon film 103. As the protective film 104, there was used a silicon oxinitride film or a silicon oxide film having a thickness of 100 to 200 nm (preferably, 130 to 170 nm). This protective film 104 is for preventing the crystalline silicon film from being directly exposed to the plasma when an impurity is added and for making it possible to effect a subtle concentration control.

Further, on the protective film 104, a resist mask 105 was formed, and, through the protective film 104, an impurity element which gives the p-type conductivity (hereinafter referred to as p-type impurity element) was added. As the p-type impurity element, there can be used, generally, the elements belonging to the group XIII of the periodic table; typically, boron or gallium. This step (called a channel doping step) is a step for controlling the threshold voltage of the TFTs. Here, boron was added by the ion doping method according to which diborone ($B_2H_6$) was plasma-excited without being mass-separated. Of course, the ion implantation method in which mass separation is effected may also be used.

By this step, an impurity region 106 which contained p-type impurity (boron, in this Embodiment) at a concentration of $1 \times 10^{15}$ to $1 \times 10^{18}$ atoms/cm$^3$ (generally, $5 \times 10^{16}$ to $5 \times 10^{17}$ atoms/cm$^2$) was formed. In this specification, those impurity regions which each contain a p-type impurity element at least within the above-mentioned concentration range will be defined as p-type impurity regions (b). (FIG. 1C)

Next, the resist mask 105 was removed, and resist masks 107 to 110 were newly formed. Then an impurity element which gives the n-type conductivity (hereinafter referred to as n-type impurity element) was added to thereby form impurity regions 111 to 113 which exhibited the n-type conductivity. As the n-type impurity element, there can be used, generally, the elements belonging to the group XV of the periodic table; and typically, phosphorus or arsenic. (FIG. 1D)

These low concentration impurity regions 111 to 113 are the impurity regions which are made to function later as LDD regions in the n-channel type TFTs of a CMOS circuit and a sampling circuit. In the impurity regions formed here, an n-type impurity element is contained at a concentration of $2 \times 10^{16}$ to $5 \times 10^{19}$ atoms/cm$^3$ (generally, $5 \times 10^{17}$ to $5 \times 10^{18}$ atoms/cm$^3$). In this specification, those impurity regions which each contain an n-type impurity element within the above-mentioned concentration range will be defined as n-type impurity regions (b).

Here, phosphorus was added at a concentration of $1 \times 10^{18}$ atoms/cm$^3$ by the use of the ion doping method according to which phosphine (PH$_3$) was plasma-excited without being mass-separated. Of course, the ion implantation method according to which mass separation is effected may also be used. At this step, phosphorus was added to the crystalline silicon film through the protective film 107.

Next, the protective film 104 was removed, and a laser beam irradiation step was again carried out. Here, again, as the laser beam, the beam of a pulse oscillation type or continuous oscillation type excimer laser should desirably be used, but the beam of a continuous oscillation type argon laser may also be used. Further, it does not matter whether the shape of the laser beam is linear or rectangular. However, the aim of this step is to activate the impurity element added, so that it is desirable to irradiate with an energy of such a degree that the crystalline silicon film is not molten. Further, it is also possible to carry out the laser annealing step with the protective film 104 left as it is. (FIG. 1E)

In this Embodiment, the laser annealing step was carried out by treating the beam of a pulse oscillation type excimer laser into a linear beam. The laser annealing condition was set in such a manner that, as the exciting gas, a KrF gas was used, the treating temperature was set to room temperature, the pulse oscillation frequency was set to 30 Hz, and the laser energy density was set to 100 to 300 mJ/cm$^2$ (generally, 150 to 250 mJ/cm$^2$).

The optical annealing step carried out under the above-mentioned condition has the effect that the added impurity element which gives the n or p-type conductivity is activated, and at the same time, the semiconductor film which was made amorphous when the impurity element was added is recrystallized. Further, the above-mentioned condition is desirably determined so as to align the atomic arrangement without melting the semiconductor film and activate the impurity element. Further, this step can be also called the step of activating the impurity element which gives the n-type conductivity or the p-type conductivity, the step of recrystallizing the semiconductor film or the step of carrying out these two steps at the same time. This effect can also be obtained by optimizing the condition of lamp annealing. In this specification, the optical annealing carried out under such a condition will be referred to as a second optical annealing.

By this step, the junction portions to the intrinsic regions (The p-type impurity regions (b) are also regarded substantially as intrinsic) which exist in the boundary portions of the n-type impurity regions (b) 111 to 113, that is, around the n-type impurity regions (b). This fact means that, at the point of time when the TFTs are completed later, the LDD regions and the channel forming region form very good junction portions.

In case of activating the impurity element by this laser beam, the activation by heat treatment may be jointly used. In case of performing activation by heat treatment, the heat treatment is to be performed at about 450 to 550° C. by taking the heat resistance of the substrate into consideration.

Next, the unnecessary portions of the crystalline silicon film were removed to form island-shaped semiconductor films (hereinafter referred to as active layers) 114 to 117. (FIG. 1F)

Next, a gate insulating film 118 was formed covering the active layers 114 to 117. The gate insulating film 118 is to be formed to a thickness of 10 to 200 nm, preferably 50 to 150 nm. In this Embodiment, a silicon oxinitride film was formed to a thickness of 115 nm by the plasma CVD method, using N$_2$O and SiH$_4$ as material. (FIG. 2A)

Next, a conductive film which was to constitute a gate wiring was formed. The gate wiring may be formed of a single-layer conductive film, but it is preferable to form the conductive film as a stacked layer film comprising two layers or three layers as required. In this Embodiment, a stacked layer film comprising a first conductive film 119 and a second conductive film 120 was formed. (FIG. 2B)

Here, as the first conductive film 119 and the second conductive film 120, there can be used a conductive film composed of an element selected from among tantalum (Ta), titanium (Ti), molybdenum (Mo), tungsten (W), chromium (Cr), and silicon (Si) or composed mainly of the above-mentioned element (generally, a tantalum nitride film, a tungsten nitride film, or a titanium nitride film), or an alloy film comprising a combination of the elements mentioned above (generally, an Mo—W alloy, or an Mo—Ta alloy).

The first conductive film 119 is set to a thickness of 10 to 50 nm (preferably, 20 to 30 nm), and the second conductive film 120 is formed to a thickness of 200 to 400 nm (preferably, 250 to 350 nm). In this Embodiment, as the first conductive film 119, a tungsten nitride film (WN) having a thickness of 50 nm was used, and, as the second conductive film 120, a tungsten film having a thickness of 350 nm was used.

Though not shown, it is effective to form a silicon film to a thickness of about 2 to 20 nm on or beneath the first conductive film 119. By so doing, the adhesion of the conductive film formed on the thus formed silicon film can be enhanced, and its oxidation can be prevented.

Next, the first conductive film 119 and the second conductive film 120 were etched at the same time to form gate wirings 121 to 124 having a thickness of 400 nm. In this case, the gate wirings 122 and 123 of the n-channel type TFTs in driving circuits were formed so as to overlap portions of the n-type impurity regions (b) 111 to 113 through the gate insulating film. These overlapped portions will constitute Lov regions later. The gate wiring 124 is shown, in the cross sectional view, as if there were two gate wirings 124, but is actually formed of one continuously connected pattern. (FIG. 2C)

Next, an n-type impurity element (phosphorus, in this Embodiment) was added in a self-alignment manner by the use of the gate wirings 121 to 124 as a mask. Adjustment was made so that, to the thus formed impurity regions 125 to 130, phosphorus could be added at a concentration ½ to 1/10 (generally, ⅓ to ¼) times as high as the concentration of the n-type impurity regions (b) (however, at a concentration 5 to 10 times as high as the concentration of boron added at the foregoing channel doping step; generally, $1 \times 10^{16}$ to $5 \times 10^{18}$ atoms/cm$^3$ and, typically, $3 \times 10^{17}$ to $3 \times 10^{18}$ atoms/cm$^3$). In this specification, those impurity regions which each contain an n-type impurity element within the above-mentioned concentration range will be defined as n-type impurity regions (c). (FIG. 2D)

At this step, phosphorus is also added to all the n-type impurity regions (b) excluding the portions hidden by the gate wirings, at a concentration of $1 \times 10^{16}$ to $5 \times 10^{18}$ atoms/cm$^3$, but this concentration is very low, so that it does not exert influence on the function of the n-type impurity regions (b). Further, to the n-type impurity regions (b) 127 to 130, boron was already added at a concentration $1 \times 10^{15}$ to $1 \times 10^{18}$ atoms/cm$^3$ at the channel doping step, but, at this step, phosphorus is added at a concentration of 5 to 10 times as high as that of boron contained in the p-type impurity regions (b), so that, in this case, also, it can safely be considered that the boron exerts no influence on the function of the n-type impurity regions (b).

Strictly speaking, however, the phosphorus concentration in those portions of the n-type impurity regions (b) 111 to 113 which overlap the gate wirings remains $2 \times 10^{16}$ to $5 \times 10^{19}$ atoms/cm$^3$, whereas, to those portions which do not overlap the gate wirings, phosphorus is added at a concentration of $1 \times 10^{16}$ to $5 \times 10^{18}$ atoms/cm$^3$; and thus, these portions turn out to contain phosphorus at a somewhat higher concentration.

Next, by the use of the gate wirings 121 to 124 as a mask, the gate insulating film 118 was etched in a self-alignment manner. For this etching, the dry etching method was employed, and, as the etching gas, a CHF$_3$ gas was used. However, the etching gas need not necessarily be limited to this gas. In this way, gate insulating films 131 to 134 were formed underneath the gate wirings. (FIG. 2E)

By exposing the active layers as mentioned above, the accelerating voltage can be lowered when the step of adding an impurity element is carried out next. Due to this, the necessary dose can be relatively small, so that the throughput is enhanced. Of course, the impurity regions may also be formed by through-doping, leaving the gate insulating film without etching it.

Next, resist masks 135 to 138 were formed in a state covering the gate wirings, and an n-type impurity (phosphorus, in this Embodiment) was added to form impurity regions 139 to 147 containing phosphorus at a high concentration. Here, also, the ion doping method using phosphine (PH$_3$) was adopted (Of course, the ion implantation method may also be used); and the concentration of phosphorus in these regions was set to $1 \times 10^{20}$ to $1 \times 10^{21}$ atoms/cm$^3$, (generally, $2 \times 10^{20}$ to $5 \times 10^{2l}$ atoms/cm$^3$). (FIG. 2F)

In this specification, those impurity regions which each contain an n-type impurity element within the above-mentioned concentration range will be defined as n-type impurity regions (a). Further, in the regions in which impurity regions 139 to 147 are formed, phosphorus or boron which was added at the preceding step is contained, but, this time, phosphorus is added at a sufficiently high concentration, so that the influence by the phosphorus or boron added at the preceding step can safely be ignored. Accordingly, in this specification, the impurity regions 139 to 147 may be differently referred to as n-type impurity regions (a).

Next, the resist masks 135 to 138 were removed, and a resist mask 148 was newly formed. Then a p-type impurity element (boron, in this Embodiment) was added to form impurity regions 149 and 150 which each contained boron at a high concentration. Here, by the ion doping method using diborane (B$_2$H$_6$) (of course, the ion implantation method may also be adopted), boron was added at a concentration of $3 \times 10^{20}$ to $3 \times 10^{21}$ atoms/cm$^3$ (generally, $5 \times 10^{20}$ to $1 \times 10^{21}$ atoms/cm$^3$). Further, in this Embodiment, those p-type impurity regions which each contain a p-type impurity element within the above-mentioned concentration range will be defined as p-type impurity regions (a). (FIG. 3A)

To portions (the above-mentioned n-type impurity regions (a) 139 and 140) of the impurity regions 149 and 150, phosphorus was already added at a concentration of $1 \times 10^{20}$ to $1 \times 10^{21}$ atoms/cm$^3$, but, the boron added here was added at a concentration three times or more as high as the phosphorus concentration. Due to this, the n-type impurity regions which had previously been formed were perfectly inverted to the p-type conductivity and thus came to function as p-type impurity regions. Accordingly in this specification, the impurity regions 149 and 150 may be referred to differently as p-type impurity regions (a).

Next, after the removal of the resist mask 148, a first interlayer dielectric film 151 was formed. The first interlayer dielectric film 151 is to be formed of an insulation film containing silicon, more specifically, a silicon nitride film, a silicon oxide film or a silicon oxinitride film, or a stacked layer film comprising a combination of them. Further, the thickness of the first interlayer dielectric film 151 is to be set to 100 to 400 nm. In this Embodiment, by the plasma CVD method using SiH$_4$, N$_2$O and NH$_3$ as material gases, a silicon oxinitride film (in which the nitride concentration was 25 to 50 atomic %) was formed to a thickness of 200 nm.

After this, heat treatment was carried out in order to activate the n-type and p-type impurity element which were added at the respective concentrations. This step can be carried out by the use of the furnace annealing method, the laser annealing method or the rapid thermal annealing method (RTA method). In this Embodiment, the activating step was carried out by the furnace annealing method. The heat treatment was carried out in a nitrogen atmosphere at 300 to 650° C., preferably 400 to 550° C. (550° C. in this Embodiment), for four hours. (FIG. 3B)

In this case, the catalytic element (nickel, in this Embodiment) which had been used for crystallization of the amorphous silicon film in this Embodiment moved in the directions indicated by arrows and was gettered into the regions which were formed containing phosphorus at a high concentration at the foregoing step shown in FIG. 2F. This is the phenomenon caused due to the metal element gettering effect of phosphorus, By so doing of which the concentration of the catalytic element in channel forming regions 152 to 156 formed later turned out to be $1 \times 10^{17}$ atoms/cm$^3$ or below (preferably, $1 \times 10^{16}$ atoms/cm$^3$ or below).

Conversely, in the regions which became the catalytic element gettering sites (the regions in which the impurity regions 139 to 147 were formed at the step shown in FIG. 2F), the catalytic element was segregated at a high concentration, coming to exist there at a concentration of $5 \times 10^{18}$ atoms/cm$^3$ or more (generally; $1 \times 10^{19}$ to $5 \times 10^{20}$ atoms/cm$^3$).

Further, heat treatment was carried out in an atmosphere containing 3 to 100% of hydrogen at 300 to 450° C. for 1 to 12 hours, thus performing a step for hydrogenating the active layers. This step is a step for terminating the dangling bonds in the semiconductor layer by the thermally excited hydrogen. As another means for hydrogenation, plasma hydrogenation (wherein the hydrogen excited by plasma is used) may alternatively be performed.

After the activating step was over, a second interlayer dielectric film 157 was formed to a thickness of 500 nm to 1.5 μm on the first interlayer dielectric film 151. In this Embodiment, as the second interlayer dielectric film 157, a silicon oxide film with a thickness of 800 nm was formed by the plasma CVD method. In this way, an interlayer dielectric film with a thickness of 1 μm was formed comprising a stacked layer film which consisted of the first interlayer dielectric film (a silicon oxinitride film) 151 and the second interlayer dielectric film (a silicon oxide film) 157.

As the second interlayer dielectric film 157, it is also possible to use an organic resin film composed of a material such as polyimide, acrylic, polyamide, polyimideamide or BCB (benzocyclobutene).

After this, a contact hole was formed reaching the source region or the drain region of each TFT, and source wirings 158 to 161 and drain wirings 162 to 165 were formed. In order to form a CMOS circuit (not shown), the drain wirings 162 and 163 are connected together to constitute one and same wiring. Further, though not shown, in this Embodiment, this electrode was formed as a stacked layer film comprising a three layer structure formed in such a manner that a Ti film with a thickness of 100 nm, a Ti-containing aluminum film with a thickness of 300 nm, and a Ti film with a thickness of 150 nm were continuously formed. As the source wirings and the drain wirings, stacked layer films each comprising a copper film and a titanium nitride film may also be used.

Next, as a passivation film 166, a silicon nitride film, a silicon oxide film or a silicon oxinitride film was formed to a thickness of 50 to 500 nm (generally, 200 to 300 nm). In this case, in this Embodiment, before the formation of the film, plasma treatment was carried out using a hydrogen containing gas containing $H_2$ or $NH_3$, and, after the formation of the film, heat treatment was carried out. The hydrogen excited by this pretreatment was fed into the first and second interlayer dielectric films. By performing heat treatment in this state, the film quality of the passivation film 166 was improved, and at the same time, the hydrogen added into the first and second interlayer dielectric films was diffused towards the lower layer side, so that the active layers could be effectively hydrogenated.

After the formation of the passivation film 166, a further hydrogenating step may be carried out. For example, in an atmosphere containing 3 to 100% of hydrogen, heat treatment is to be carried out at 300 to 450° C. for 1 to 12 hour(s), or, in case the plasma hydrogenation method was employed, the same effect could also be obtained. Further, an opening may also be formed in the passivation film 166 at the position at which a contact hole for connecting the pixel electrode and the drain electrode is formed later.

Thereafter, a third interlayer dielectric film 167 comprising an organic resin was formed to a thickness of about 1 μm. As the organic resin, polyamide, acrylic, polyamide, polyimideamide or BCB (benzocyclobutene) can be used. As the merits brought about by the use of an organic resin, there can be enumerated the point that the deposition method is simple, the point that its relative dielectric constant is low, so that the parasitic capacitance can be reduced, and the point that, excellent flatness can be obtained. Further, an organic resin film or a organic SiO compound other than the above-mentioned ones can also be used. In this Embodiment, a polyimide of the type which is subjected to thermal polymerization after applied to the substrate, was used and sintered at 300° C. to form the third interlayer dielectric film 167.

Next, in the region which was to constitute the pixel portion, a screening film 168 was formed on the third interlayer dielectric film 167. In this specification, the expression, screening film, is used as meaning a film for screening light and electromagnetic waves.

The screening film 168 was formed of a film composed of an element selected from among aluminum (Al), titanium (Ti) and tantalum (Ta) or a film composed mainly of one of the elements; the film was formed to a thickness of 100 to 300 nm. In this Embodiment, an aluminum film in which 1 wt % of titanium was incorporated, was formed to a thickness of 125 nm.

Further, in case a silicon-containing insulation film represented by an silicon oxide film was formed to a thickness of 5 to 50 nm on the third interlayer dielectric film 167, the adhesion of the screening film formed thereon could be enhanced. Further, in case plasma treatment using a $CF_4$ gas was applied to the surface of the third interlayer dielectric film 167 formed of an organic resin film, the adhesion of the screening film formed on this film could be enhanced through surface modification.

Further, by the use of this aluminum film in which titanium is incorporated, not only the screening film but also other interconnecting wirings can be formed. For example, the interconnecting wirings which connect circuits to each other in the driving circuits. However, in this case, before forming into a film the material to form the screening film or the interconnecting wirings, a contact hole must previously be formed in the third interlayer dielectric film.

Next, on the surface of the screening film 168, an oxide film 169 was formed to a thickness of 20 to 100 nm (preferably, 30 to 50 nm) by the anodic oxidation method or the plasma oxidation method (In this Embodiment the anodic oxidation method was employed). In this Embodiment, as the screening film 168, a film composed mainly of aluminum was used, so that, as the anodic oxide 169, an aluminum oxide film (alumina film) was formed.

For this anodic oxidation treatment, first an ethylene glycol tartrate solution with a sufficiently low alkali ion concentration was prepared. This was a solution made by mixing 15% of an aqueous solution of ammonium tartrate and ethylene glycol at a ratio of 2:8, and, to this solution, ammonia water was added and adjusted so that the pH could become 7±0.5. Then, in this solution, a platinum electrode which was to constitute a cathode was provided, the substrate on which the screening film 168 was formed was immersed into the solution, and, using the screening film 168 as an anode, a DC current of a constant magnitude (several mA to several tens of mA) was applied.

The voltage between the cathode and the anode in the solution varies with time in accordance with the growth of the anodic oxide, but the voltage was raised at a voltage raising rate of 100 V/min with the current kept constant, and, when the rising voltage reached 45 V, the anodic oxidation treatment was terminated. In this way, an anodic oxide 169 with a thickness of about 50 nm could be formed on the surface of the screening film 168. Further, By so doing, the thickness of the screening film 168 became 90 nm. The values pertaining to the anodic oxidation method shown here were given merely by way of example, but the optimum values can naturally change depending on the size of the device fabricated, etc.

Further, here, there is employed the structure constituted in such a manner that, by the use of the anodic oxidation method, an insulation film was provided only on the surface of the screening film, but the insulation film may also be formed by a vapor phase growth method such as the plasma CVD method, the thermal CVD method or the sputtering method. In such a case, the film thickness is preferably set to 20 to 100 nm (more preferably, 30 to 50 nm). Further, a silicon oxide film, a silicon nitride film, a silicon oxinitride film, a DLC (Diamond-Like Carbon) film or an organic resin film may also be used. Further, a stacked layer film comprising a combination of these may also be used.

Next, in the third interlayer dielectric film 167 and the passivation film 166, a contact hole was formed reaching the drain wiring 165 was formed, and a pixel electrode 170 was formed. Pixel electrodes 171 and 172 were the pixel electrodes for the other adjacent pixels. As the pixel electrodes 170 to 172, transparent conductive electrodes are used in case of a transmission type liquid crystal display device, and metal films are used in case of a reflection type liquid crystal display device. Here, in order to constitute a transmission type liquid crystal display device, the pixel electrodes were formed by forming a compound of indium oxide and tin oxide (called ITO) into layers with a thickness of 110 nm by the sputtering method.

Further, the pixel electrode 170 and the screening film 168 overlap each other through the anodic oxide 169 to form a capacitance storage 173. In this case, it is desirable to set the screening film 168 into a floating state (an electrically isolated state) or a fixed potential, preferably a common potential (an intermediate potential of the image signal sent over as data).

In this way, an active matrix substrate which had driving circuits and a pixel portion on one and the same substrate was completed. As shown in FIG. 3C, a p-channel type TFT 301 and n-channel type TFTs 302 and 303 were formed in the driving circuits, and a pixel TFT 304 comprising an n-channel type TFT was formed in the pixel portion.

In the p-channel type TFT 301 of the driving circuit, a channel forming region 201, a source region 202 and a drain region 203 were respectively formed by the p-type impurity regions (a). In actually, however, a region containing phosphorus at a concentration of $1 \times 10^{20}$ to $1 \times 10^{21}$ atoms/cm$^3$ exists in a portion of the source region or the drain region. Further, in this region, the catalytic element gettered at the step shown in FIG. 3B exists at a concentration of $5 \times 10^{18}$ atoms/cm$^3$ or more (generally, $1 \times 10^{19}$ atoms/cm$^3$ to $5 \times 10^{20}$ atoms/cm$^3$).

Further, in the n-channel type TFT 302, a channel forming region 204, a source region 205, a drain region 206 and, at one side (the drain region side) of the channel forming region, an LDD region (in this specification, such a region will be called Lov, wherein ov is suffixed as having the meaning of overlap) 207 overlapping the gate wiring through the gate insulating film was formed. In this case, the Lov region 207 was formed so as to contain phosphorus at a concentration of $2 \times 10^{16}$ to $5 \times 10^{19}$ atoms/cm$^3$ and wholly overlap the gate wiring.

Further, in case of FIG. 3C, the Lov region was disposed only at one side (only at the drain region side) of the channel forming region 204 in order to reduce the resistance component as much as possible, Lov regions may also be disposed at both sides of the channel forming region 204.

Further, in the n-channel type TFT 303, a channel forming region 208, a source region 209 and a drain region 210 were formed, and further, LDD regions 211 and 212 were formed at both sides of the channel forming region. In case of this structure, portions of the LDD regions 211 and 212 were disposed so as to overlap the gate wiring, so that the regions (Lov) regions) overlapping the gate wiring through the gate insulating film and the regions which did not overlap the gate wiring (in this specification, such regions will be referred to as Loff regions, wherein off is added as a suffix meaning offset) were formed.

Figure 5:
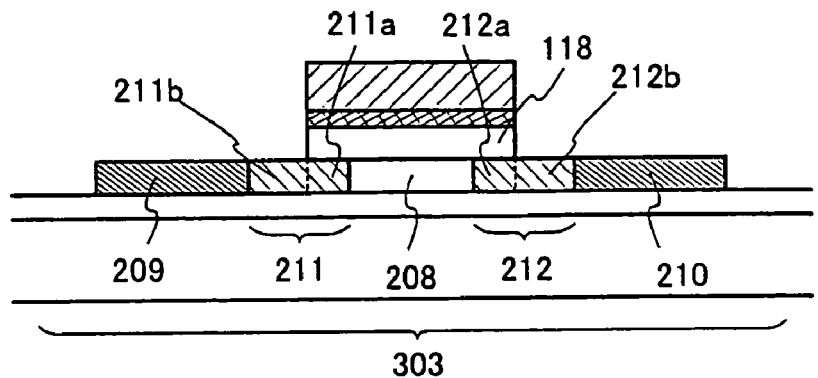
FIG. 5 is a diagram showing the LDD structure of a n-channel type TFT.

Here, the sectional view shown in FIG. 5 is an enlarged view showing the state in which the n-channel type TFT 303 shown in FIG. 3C was fabricated as far as the step shown in FIG. 3B. As shown here, the LDD region 211 can be further divided into an Lov region 211*a* and an Loff region 211*b*. Further, in the Lov region 211*a*, phosphorus is contained at a concentration of $2 \times 10^{16}$ to $5 \times 10^{19}$ atoms/cm$^3$, while, in the Loff region 211*b*, phosphorus is contained at a concentration 1 to 2 times as high (generally, 1.2 to 1.5 times-as high) as the phosphorus concentration of the Lov region 211*a*.

Further, in the pixel TFT 304, there were formed channel forming regions 213 and 214, a source region 215, a drain region 216, Loff regions 217 to 220 and an n-type impurity region (a) 221 adjacent to the Loff regions 218 and 219. In this case, the source region 215 and the drain region 216 were respectively formed of n-type impurity regions (a), and the Loff regions 117 to 220 were formed of n-type impurity regions (c).

In this Embodiment, the structures of the TFTs forming the respective circuits could be optimized in accordance with the circuit specifications required by the pixel portion and the driving circuits, and the operability and reliability of the semiconductor device could be enhanced. More specifically, the n-channel type TFT was constituted in such a manner that, in accordance with the circuit specifications, the LDD regions were positionally made to differ, and the Lov regions or the Loff regions were properly used respectively, whereby a TFT structure made by attaching importance to high-speed operation and to the measure for coping with the hot carriers and a TFT structure made by attaching importance to low OFF-current operation, were realized.

For example, in case of an active matrix type liquid crystal display device, the n-channel type TFT 302 is suited to a driving circuit such as a shift register, a frequency dividing circuit, a signal splitting circuit, a level shifter or a buffer wherein importance is attached to high-speed operation. Namely, in the n-channel type TFT 302, an Lov region is disposed only at one side (the drain region side) of the channel forming region, whereby the n-channel type TFT 302 is brought into a structure in which importance is attached to the measure for coping with the hot carriers, reducing the resistance component at the same time. This is because, in case of the group of circuits mentioned above, the function of the source region does not differ from that of the drain region, and the direction in which the carriers (electrons) move is fixed. However, it is possible to dispose Lov regions at both sides of the channel forming region as required.

Further, the n-channel type TFT 303 is suited to a sampling circuit (also called a transfer gate) wherein importance is attached to both the measure to cope with the hot carriers and low OFF-current operation. Namely, by disposing Lov regions, a measure to cope with the hot carriers is taken, and, by disposing Loff regions, a low OFF-current operation was realized. Further, in case of a sampling circuit, the function of the source region and the drain region is inverted to change the moving direction of the carriers by 180°, so that such a structure as to become line-symmetrical with respect to the gate wiring must be employed. In some cases, it is also feasible that only the Lov regions are provided.

Further, the n-channel type TFT 304 is suited to a pixel portion or a sampling circuit (a sample and hold circuit)

wherein importance is attached to low OFF-current operation. Namely, a Lov region which can become a cause for increasing the OFF-current value is not provided, but only Loff regions are provided, whereby a low OFF-current operation is realized. Further, by using, as the Loff regions, LDD regions having a concentration lower than that of the LDD regions in the driving circuits, there is taken the measure to ensure that, even if the ON-current value somewhat falls, the OFF-current value is thoroughly reduced. Further, it is confirmed that the n-type impurity region (a) 221 is very effective in reducing the OFF-current value.

Further, with respect to the channel length of 3 to 7 μm, the length (width) of the Lov region 207 in the n-channel type TFT 302 is set to 0.5 to 3.0 μm, generally 1.0 to 1.5 μm. Further, the length (width) of the Lov regions 211a and 212a in the n-channel type TFT 303 is set to 0.5 to 3.0 μm, generally 1.0 to 1.5 μm, and the length (width) of the Loff regions 211b, 212b is set to 1.0 to 3.5 μm, generally 1.5 to 2.0 μm. Further, the length (width) of the Loff regions 217 to 220 provided in the pixel TFT 304 is set to 0.5 to 3.5 μm, generally 2.0 to 2.5 μm.

Further, the p-channel type TFT 301 is formed in a self-alignment manner, while the n-channel type TFTs 302 to 304 are formed in a non-self-alignment manner; this point is also a feature of the present invention.

Further, in this Embodiment, as the dielectric of the capacitance storage, an alumina film having a high relative dielectric constant of 7 to 9 was used, whereby the area for forming the required capacitance could be reduced. Further, by using as one electrode of the capacitance storage the screening film formed on the pixel TFT as in case of this Embodiment, the aperture ratio of the image display portion of the active matrix type liquid crystal display device could be enhanced.

Further, the invention need not be limited to the structure of the capacitance storage set forth in this Embodiment. For example, it is also possible to use the capacitance storage structure disclosed in Japanese Patent Laid-Open No. 316567/1997 or Japanese Patent Laid-Open No. 254097/1998 filed by the present applicant.

Embodiment 2

This Embodiment will be described concerning the steps of fabricating an active matrix type liquid crystal display device from the active matrix substrate. As shown in FIG. 4, an alignment film 401 was formed on the substrate in the state shown in FIG. 3C. In this Embodiment, as the alignment film, a polyimide film was used. Further, on an opposite, substrate 402, an opposite electrode 403 comprising a transparent conductive film and an alignment film 404 were formed. Further, on the opposite substrate, a color filter and a screening film may be formed as required.

Next, after the formation of the alignment film, a rubbing treatment was conducted so that the liquid crystal molecules might be oriented with a fixed pre-tilt angle. Then the active matrix substrate on which the pixel portion and the driving circuits were formed and the opposite substrate were bonded together through a sealing material and a spacer (Neither of them is shown) by a known cell compiling step. Thereafter, a liquid crystal 405 was injected between the two substrates and perfectly sealed by a sealing material (not shown). As the liquid crystal, a known liquid crystal material may be used. In this way, the active matrix type liquid crystal display device shown in FIG. 4 was completed.

Figure 6:
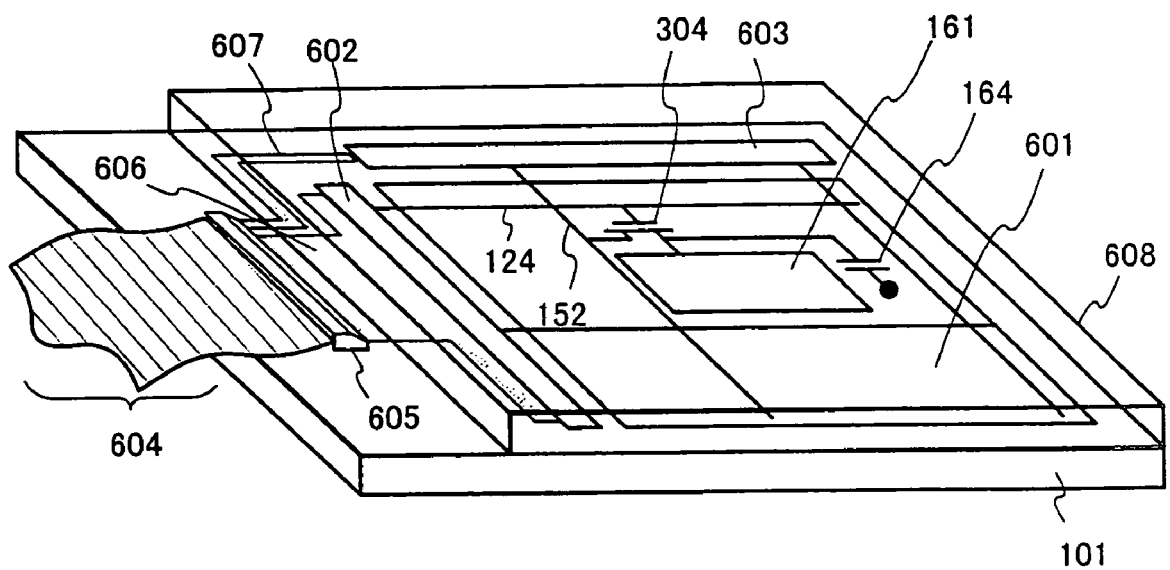
FIG. 6 is a perspective view of an active matrix type liquid crystal display device.

Next, the constitution of this active matrix type liquid crystal display device will be described referring to the perspective view shown in FIG. 6. In FIG. 6, the reference numerals common to those used in FIGS. 1 to 3 are used for associating FIG. 6 with the structural sectional views shown in FIGS. 1 to 3. The active matrix substrate is formed of a pixel portion 601, a scanning (gate) signal driving circuit 602, a picture (source) signal driving circuit 603 which are formed on the glass substrate 101. The pixel TFT 304 in the pixel portion is an n-channel type TFT, and the driving circuits provided therearound are formed on the basis of a CMOS circuit. The scanning signal driving circuit 602 and the image signal driving circuit 603 are connected to the pixel portion 601 through the gate wiring 124 and the source wiring 161, respectively. Further, a terminal 605 to which an FPC 604 is connected and the driving circuits are connected by interconnection wirings 606 and 607.

Embodiment 3

Figure 7:
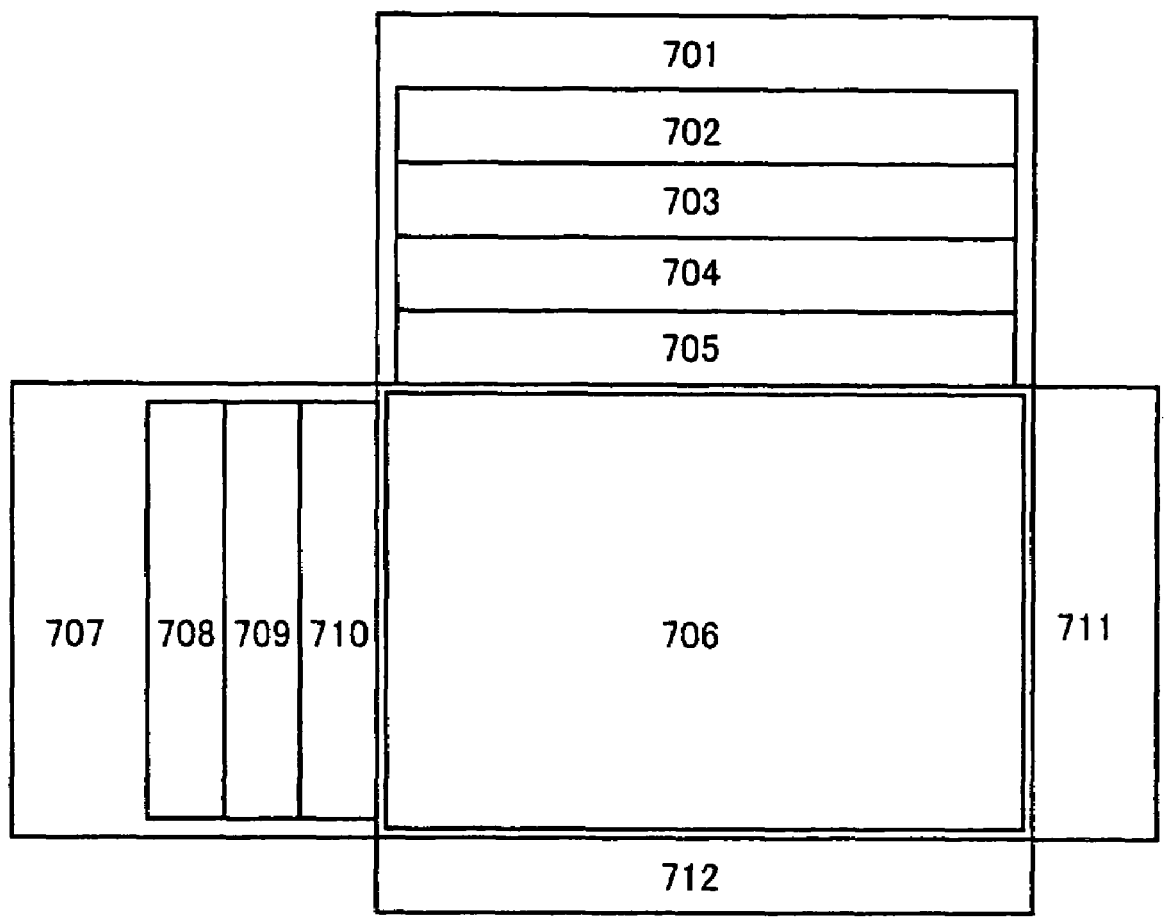
FIG. 7 is a block diagram of the active matrix type liquid crystal display device.

FIG. 7 shows an example of the circuit arrangement of the active matrix substrate set forth through Embodiment 2. The active matrix substrate according to this Embodiment includes an image signal driving circuit 701, a scanning signal driving circuit (A) 707, a scanning signal driving circuit (B) 711, a precharging circuit 712 and a pixel portion 706. In this specification, the driving circuit portion is the generic name given to the circuit portion including the image signal driving circuit 701 and the scanning signal driving circuit 707.

The image signal driving circuit 701 comprises a shift register 702, a level shifter 703, a buffer 704, and a sampling circuit 705. Further, the scanning signal driving circuit (A) 707 comprises a shift register 708, a level shifter 709, and a buffer 710. The scanning signal driving circuit B if of the same constitution.

Here, the driving voltage of the shift registers 702, 708 is 5 to 16 V (generally, 10 V), and, as the n-channel type TFT used in the CMOS circuit forming each of the circuits, the structure shown by 302 in FIG. 3C is suited.

Further, as each of the level shifters 703 and 709 and the buffers 704 and 710, a CMOS circuit including the n-channel type TFT 302 shown in FIG. 3C is suited, though the driving voltage becomes so high as 14 to 16 V. As for the gate wirings, it is effective to render them into a multi-gate structure such as a double gate structure or a triple gate structure, in view of enhancing the reliability of the respective circuits.

Further, in case of the sampling circuit 705, the driving voltage thereof is 14 to 16 V, but the source region and the drain region are inverted, and in addition, it is necessary to reduce the OFF-current value, so that, as the sampling circuit 705, a CMOS circuit including the n-channel type TFT 303 shown in FIG. 3C is suited. In FIG. 3C, only n-channel type TFTs are shown, but, in case the sampling circuit is actually formed, an n-channel and p-channel type TFTs are combined to form the sampling circuit.

Further, in case of the pixel portion 706, its driving voltage is 14 to 16 V, and its OFF-current value is required to be further lower than that of the sampling circuit 705, so that the pixel portion is desirably rendered into a structure in which no Lov region is disposed; and thus, the n-channel type TFT 304 shown in FIG. 3C is desirably used as the pixel TFT.

The constitution of this Embodiment can be easily realized by fabricating TFTs in accordance with the fabrication steps shown in Embodiment 1. Further, although, in this Embodiment, the constitution of only the pixel portion and the driving circuit portion is shown, but, in accordance with the fabrication steps of Embodiment 1, it is also possible to form, beside the above, a signal splitting circuit, a frequency dividing circuit, a D/A converter circuit, an operational amplifier circuit, a gamma-correction circuit, and in addition, signal processing circuits (which may also be referred to as logic circuits) such as a memory circuit and a microprocessor circuit, on one and the same substrate.

As stated above, according to the present invention, a semiconductor device including a pixel portion and driving circuits for controlling the pixel portion, such as, e.g., an electronic device comprising a driving circuit portion and a pixel portion on one and the same substrate can be realized.

Embodiment 4

This Embodiment will be described, by referring to FIG. 8, with respect to a case where the TFTs are fabricated in the order of fabrication steps which differs from that of Embodiment 1. This Embodiment differs from Embodiment 1 only in respect of intermediate steps but identical with Embodiment 1 in respect of the other steps, so that the same reference numerals will be used as far as the same steps are concerned. Further, concerning the impurity elements added, the same impurity elements as those of Embodiment 1 will be used by way of example.

First, the first step to the step of forming the protective film 104 are carried out in accordance with the steps of Embodiment 1. Then, on the protective film 104, resist masks 801 to 804 are formed, and an n-type impurity element is added under the same condition as in case of FIG. 1D. Thus, n-type impurity regions (b) 805 to 807 are formed. (FIG. 8A)

Next, the resist masks 801 to 804 are removed, and a resist mask 808 is newly formed. Then a channel doping step is carried out under the same condition as in case of FIG. 1C. In this way, p-type impurity regions (b) 809 to 811 are formed. (FIG. 8B)

After this, in accordance with the steps of Embodiment 1, the step shown in FIG. 1E and the ensuing steps are carried out. This Embodiment which is constituted as described above can be practiced in case of fabricating the active matrix type liquid crystal display devices according to Embodiments 2 and 3.

Embodiment 5

This Embodiment will be described; by referring to FIG. 9, with respect to a case where the TFTs are fabricated in a step order which differs from that of Embodiment 1. This Embodiment differs from Embodiment 1 only in respect of intermediate steps but identical with Embodiment 1 in respect of the other steps, so that the same reference numerals will be used as far as the same steps are concerned. Further, as for the impurity elements added, the same impurity elements as those used in Embodiment 1 will be used by way of example.

Figure 9A:
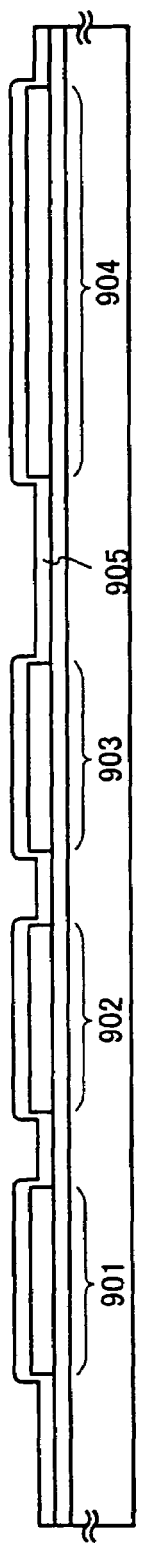
FIGS. 9A-9D are diagrams showing some steps for fabricating a pixel portion and a driving circuit.

First, the first step to the step shown in FIG. 1B are carried out. The crystalline silicon film 103 thus formed is patterned to form active layers 901 to 904, on which a protective film 905 comprising a silicon containing insulation film (a silicon oxide film, in this Embodiment) is formed to a thickness of 120 to 150 nm. (FIG. 9A)

In this Embodiment, the case where, after a laser annealing step (a first optical annealing), the crystalline silicon film is patterned, is disclosed by way of example, but this step order can be reversed.

Figure 9B:
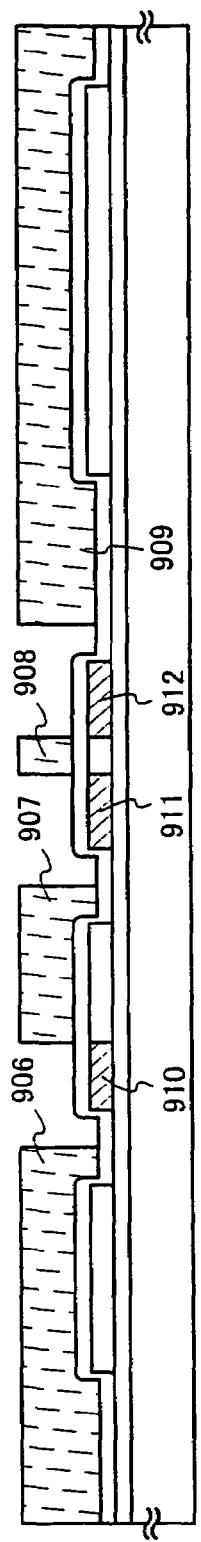

Next, resist masks 906 to 909 are formed, and an n-type impurity element is added under the same condition as in case of FIG. 1D. Thus, n-type impurity regions (b) 910 to 912 are formed. (FIG. 9B)

Figure 9C:
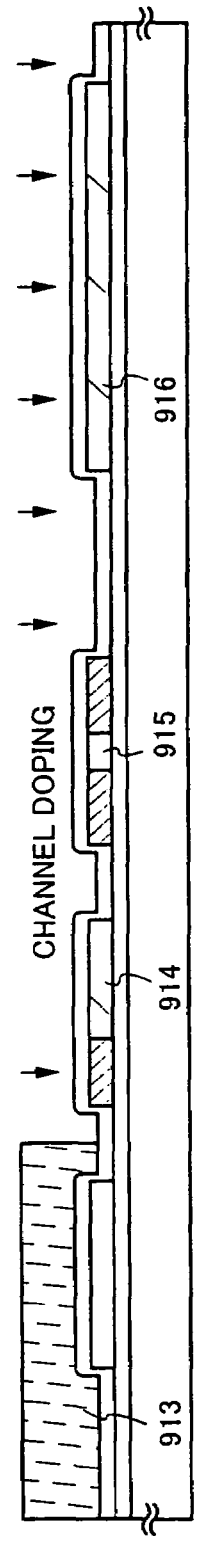

Next, the resist masks 906 to 909 are removed, and a resist mask 913 is newly formed. Then a channel doping step is carried out under the same condition as in case of FIG. 1C. Thus, p-type impurity regions (b) 914 to 916 are formed. (FIG. 9C)

Figure 9D:
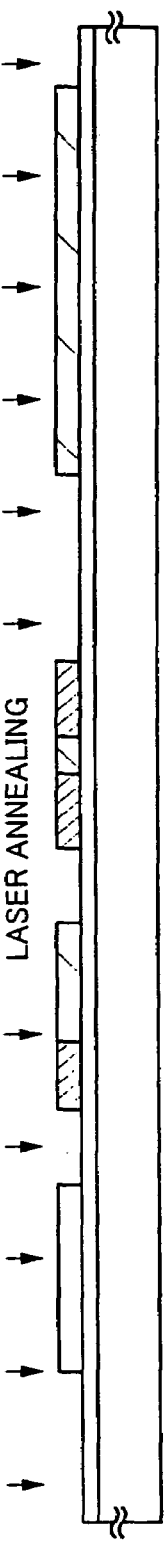

Thereafter, the resist mask 913 is removed, and a laser annealing step (second optical annealing) is carried out under the same condition as in case of FIG. 1E. By so doing, the added n-type or p-type impurity element is effectively activated. (FIG. 9D)

After this, the step shown in FIG. 2A and the ensuing steps are carried out in accordance with the steps of Embodiment 1. This Embodiment which is constituted as described above can be practiced in case of fabricating the active matrix type liquid crystal display devices according to Embodiments 2 an 3.

Embodiment 6

This Embodiment will be described, by referring to FIG. 10, with respect to a case where TFTs are fabricated in a step order differing from that of Embodiment 1. This Embodiment differs only in respect of intermediate steps from Embodiment 1 but identical with Embodiment 1 in respect of the other steps, so that the same reference numerals will be used as far as the same steps are concerned. Further, as for the impurity elements added, the same impurity elements as those used in Embodiment 1 will be used by way of example.

First, the first step to the step shown in FIG. 1B are carried out in accordance with the steps of Embodiment 1, and then, in accordance with the steps of Embodiment 5, the state shown in FIG. 9A is obtained. In this Embodiment, the case where, after a laser annealing step (first optical annealing), the crystalline silicon film is patterned, is set forth by way of example, but this step order can be reversed.

Figure 10A:
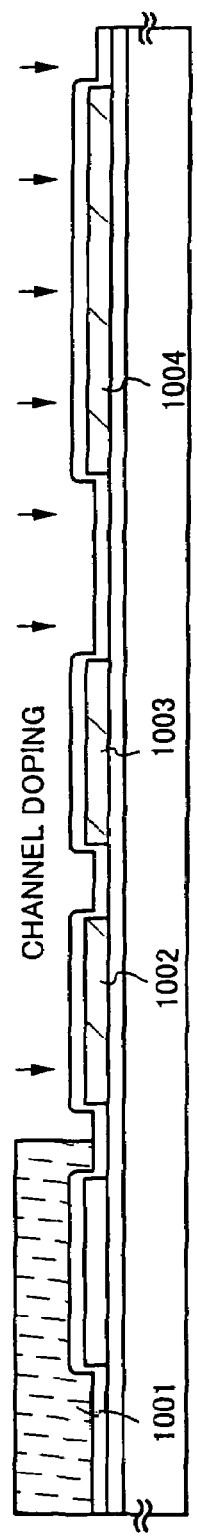
FIGS. 10A-10B are diagrams showing some steps for fabricating a pixel portion and a driving circuit.

Then a resist mask 1001 is formed, and a channel doping step is carried out under the same condition as in case of FIG. 1C. Thus, p-type impurity regions (b) 1002 to 1004 are formed. (FIG. 10A)

Figure 10B:
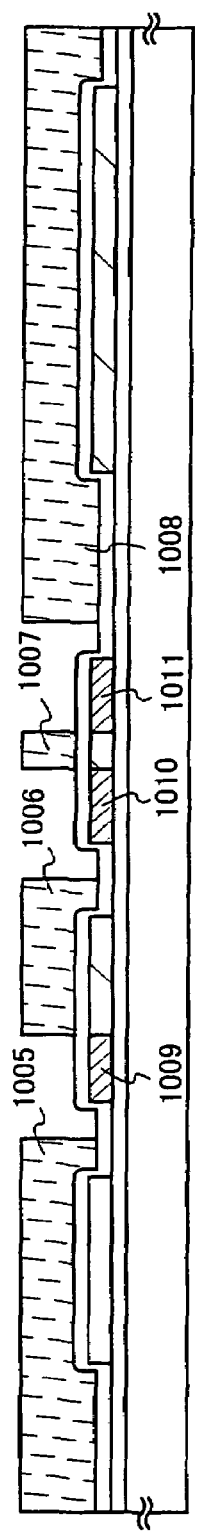

Next, the resist mask 1001 is removed, and resist masks 1005 to 1008 are newly formed. Then an n-type impurity element is added under the same condition as in case of FIG. 1D. Thus, n-type impurity regions (b) 1009 to 1011 are formed. (FIG. 10B)

After this, a laser annealing step (second optical annealing) similar to that set forth in connection with Embodiment 5 and shown in FIG. 9D is carried out to activate the added n-type or p-type impurity element, and thereafter, in accordance of the step order of Embodiment 1, the step shown in FIG. 2A and the ensuing steps are carried out. This Embodiment which is constituted as described above can be practiced in case of fabricating the active matrix type liquid crystal display devices according to Embodiments 2 and 3.

Embodiment 7

This Embodiment will be described by referring to FIG. 11 with respect to a case where the TFTs are fabricated in a step order which differs from that of Embodiment 1. Since this Embodiment differs from Embodiment 1 only in respect of intermediate steps from Embodiment 1 but identical with the latter in respect of the other steps, the same reference numerals will be used as far as the same steps are concerned. Further, as for the impurity elements added, the same impurity elements as those used in Embodiment 1 will be used by way of example.

Figure 11A:
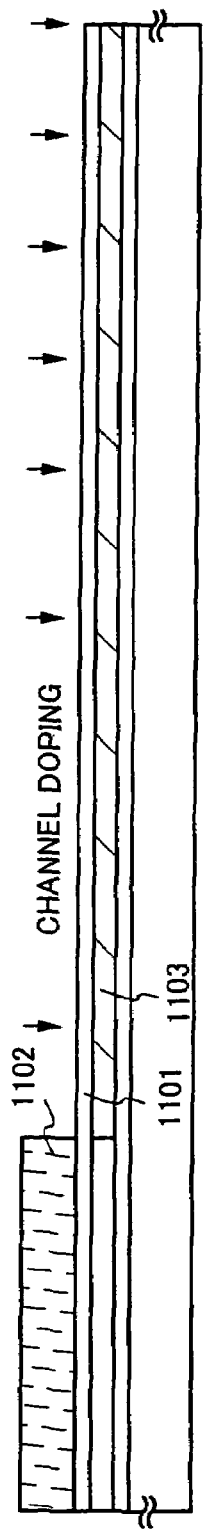
FIGS. 11A-11D are diagrams showing some steps for fabricating a pixel portion and a driving circuit.

First, in accordance with the steps of Embodiment 1, the state shown in FIG. 1A is obtained. Then, on the thus formed crystalline silicon film 102, a protective film 1101 is formed to a thickness of 120 to 150 nm. Further, on the protective film 1101, a resist mask 1102 is formed, and a channel doping step is carried out under the same condition as in case of FIG. 1C. Thus, a p-type impurity region (b) 1103 is formed. (FIG. 11A)

Next, the resist mask 1102 and the protective film 1101 are removed, and a laser annealing step (first optical annealing) is carried out under the same condition as in case of FIG. 1B. By this step, the crystalline silicon film hidden by the resist mask 1102 is improved in its crystallinity, and, in the p-type impurity region (b) 1103, the non-crystallized silicon film is recrystallized, and at the same time, the added p-type impurity element is activated. (FIG. 11B)

Next, a protective film 1106 is again formed to a thickness of 120 to 150 nm, and resist masks 1107 to 1110 are formed. An n-type impurity element is then added under the same condition as in case of FIG. 1D. Thus, n-type impurity regions (b) 1111 to 1113 are formed. (FIG. 11C) Next, the resist masks 1107 to 1110 and the protective film 1106 are removed, and a laser annealing step (second optical annealing) is carried out under the same condition as in case of FIG. 1E. By so doing, the added n-type or p-type impurity element is effectively activated. (FIG. 11D)

Figure 11B:
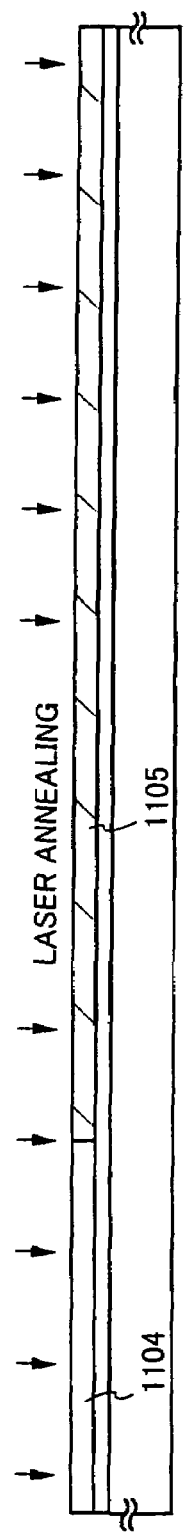
Figure 11C:
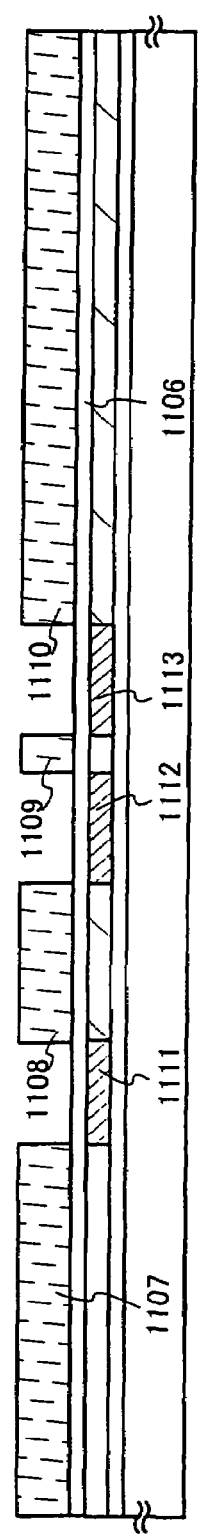
Figure 11D:
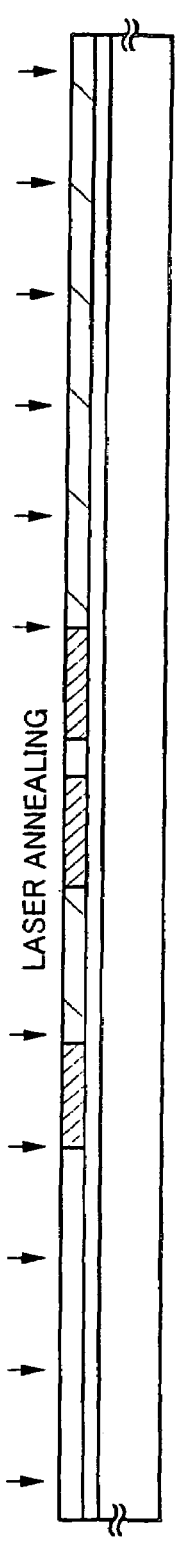

The step shown in FIG. 11B can also be carried out in a state leaving the protective film 1101. In this case, the step of newly forming the protective film 1106 can be omitted, but, since the laser beam is attenuated through the protective film, so that it is necessary to set the laser energy density to a somewhat higher value. The protective film 1101 can be further left even until the laser annealing step shown in FIG. 11D is carried out. In this case, the laser energy density is set also by taking the protective film into consideration.

After this, the step shown in FIG. 1F and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 8

This Embodiment will be described by referring to FIG. 12 with reference to a case where the TFTs are fabricated in a step order which differs from that of Embodiment 1. This Embodiment differs from Embodiment 1 only in respect of intermediate steps but similar to the latter in respect of the other steps, so that the same reference numerals will be used as far as the same steps are concerned. Further, as for the added impurity elements, the same impurity elements as those used in Embodiment 1 will be used by way of example.

First, in accordance with the steps of Embodiment 1, the state shown in FIG. 1A is obtained. Then, on the thus formed crystalline silicon film 102, a protective film 1201 is formed to a thickness of 120 to 150 nm. Further, on this protective film 1201, resist masks 1202 to 1205 are formed, and an n-type impurity element is added under the same condition as in case of FIG. 1D. Thus, n-type impurity regions (b) 1206 to 1208 are formed. (FIG. 12A)

Next, the resist masks 1202 to 1205 and the protective film 1201 are removed, and a laser annealing step (first optical annealing) is carried out under the same condition as in case of FIG. 1B is carried out. By this step, the crystalline silicon film which has been hidden by the resist masks 1202 to 1205 is improved in its crystallinity; in the p-type impurity regions (b) 1206 to 1208, the non-crystallized silicon film is recrystallized; and at the same time, the added n-type impurity element is activated. (FIG. 12B)

Next, a protective film 1211 is again formed to a thickness of 120 to 150 nm, and a resist mask 1212 is formed. A channel doping step is then carried out under the same condition as in case of FIG. 1C. Thus, p-type impurity regions (b) 1213 to 1215 are formed. (FIG. 12C)

Next, the resist mask 1212 and the protective film 1211 are removed, and a laser annealing step (second optical annealing) is carried out under the same condition as in case of FIG. 1E. By so doing, the added n-type or p-type impurity element is effectively activated. (FIG. 12D)

The step shown in FIG. 12B can also be carried out in a state leaving the protective film 1201. In this case, the step of forming the protective film 1211 newly can be omitted, but the laser beam is attenuated through the protective film, so that the laser energy density must be set to a somewhat higher value. Further, the protective film 1201 can be further left even until the laser annealing step shown in FIG. 12D is carried out. In this case, the laser energy density is also set by taking the protective film into consideration.

After this, in accordance with the steps of Embodiment 1, the step shown in FIG. 1F and the ensuing steps are carried out. This Embodiment which is constituted as described above can be practiced in case of fabricating the active matrix type liquid crystal display devices according to Embodiments 2 and 3.

Embodiment 9

This Embodiment will be described with respect to a case where the TFTs are fabricated in a step order which differs from that of Embodiment 1. Since this Embodiment is basically identical with Embodiment 7, so that FIG. 11 will be referred to in the description to follow. Further, as for the impurity elements, the same impurity elements as those used in Embodiment 7 will be used by way of example.

The feature of this Embodiment lies in the point that the laser annealing step (first optical annealing) referred to in the description of Embodiment 7 and shown in FIG. 11B is omitted, but the step is jointly fulfilled by the laser annealing step shown in FIG. 11D. In this case, the laser annealing step shown in FIG. 11D needs to be changed to the first optical annealing, but, by this measure, the number of steps can be reduced.

After the state shown in FIG. 11D is obtained, the state shown in FIG. 1F and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 10

This Embodiment will be described with respect to a case where the TFTs are fabricated in a step order which differs from that of Embodiment 1. Since this Embodiment is basically identical with Embodiment 8, the description thereof will be made referring to FIG. 12. Further, as for the impurity elements added, the same impurity elements as those used in Embodiment 8 are used by way of example.

The feature of this Embodiment lies in the point that the laser annealing step (first optical annealing) referred to in the description of Embodiment 8 and shown in FIG. 12B is omitted, but the step is jointly fulfilled by the laser annealing step shown in FIG. 12D. In this case, the laser annealing step shown in FIG. 12D needs to be changed to the first optical annealing, but, by this measure, the number of steps can be reduced.

After the state shown in FIG. 12D is obtained, the step shown in FIG. 1F and the ensuing steps are carried out in accordance with the steps of Embodiment 1. This Embodiment which is constituted as described above can be practiced in case of fabricating the active matrix type liquid, crystal display deices according to Embodiments 2, 3.

Embodiment 11

This Embodiment will be described by referring to FIG. 13 with reference to a case where the TFTs are fabricated in a step order which differs from that of Embodiment 1. Since this Embodiment differs from Embodiment 1 only in respect of intermediate steps but identical with the latter in respect of the other steps, the same reference numerals will be used as long as the same steps are concerned. Further, as for the added impurity elements, the same impurity elements as those used in Embodiment 1 will be used by way of example.

Figure 13A:
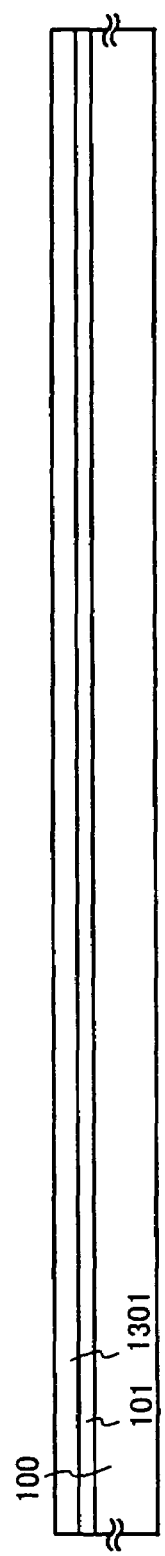
FIGS. 13A-13E are diagrams showing some steps for fabricating a pixel portion and a driving circuit.

First, in accordance with the steps of Embodiment 1, the ground film 101 is formed on the substrate 100, and, on this ground film 101, a semiconductor film containing an amorphous component is formed. In this Embodiment, an amorphous silicon film 1301 is formed to a thickness of 30 nm by the plasma CVD method. (FIG. 13A)

Figure 13B:
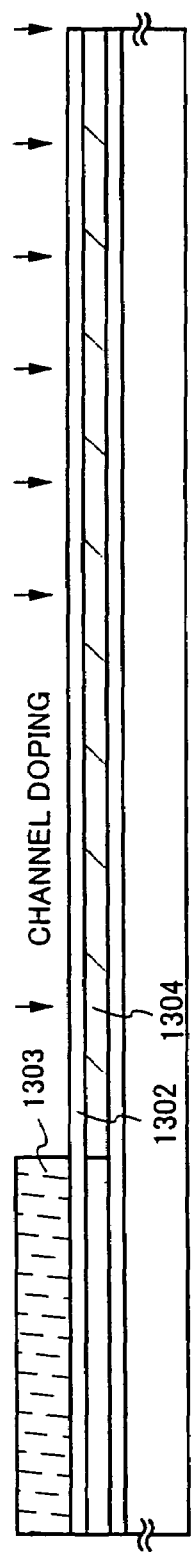

Next, after a protective film 1302 comprising an insulation film containing silicon is formed to a thickness of 120 to 150 nm, a resist mask 1303 is formed. Then a channel doping step is carried out under the same condition as in case of FIG. 1C. Thus, a p-type impurity region (b) 1304 is formed. (FIG. 13B)

Figure 13C:
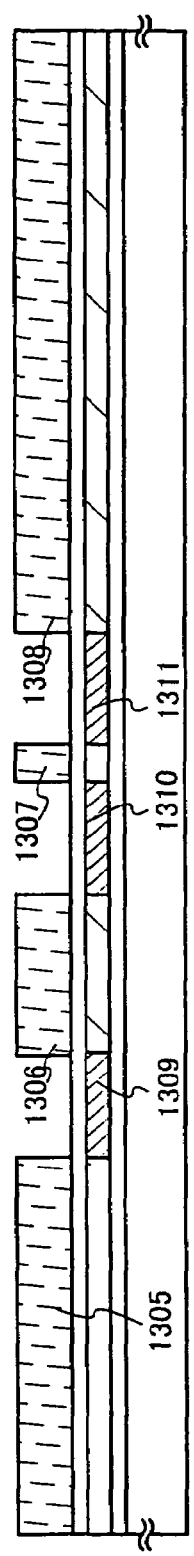

Next, the resist mask 1303 is removed, and resist masks 1306 to 1308 are newly formed. Then an n-type impurity element is added under the same condition as that shown in FIG. 1D. Thus, n-type impurity regions (b) 1309 to 1311 are formed. (FIG. 13C)

Figure 13D:
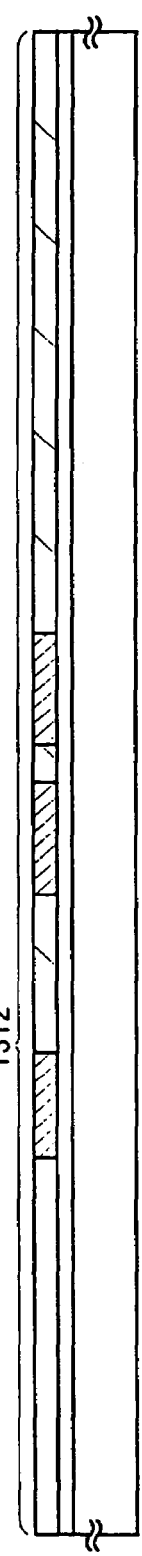

Next, after the protective film 1302 is removed, the amorphous silicon film into which an n-type or a p-type impurity element has been added, is crystallized in accordance with the technique disclosed in Japanese Patent Laid-Open No. 130652/1995 to obtain a crystalline silicon film 1312. (FIG. 13D)

In case of effecting the crystallization by the use of the technique according to Embodiment 2 disclosed in Japanese Patent Laid-Open No. 130652/1995, it is possible to leave the protective film 1302 as it is. That is to say, it is possible to utilize the protective film 1302 as a mask film when a catalytic element for promoting the crystallization is selectively added.

Figure 13E:
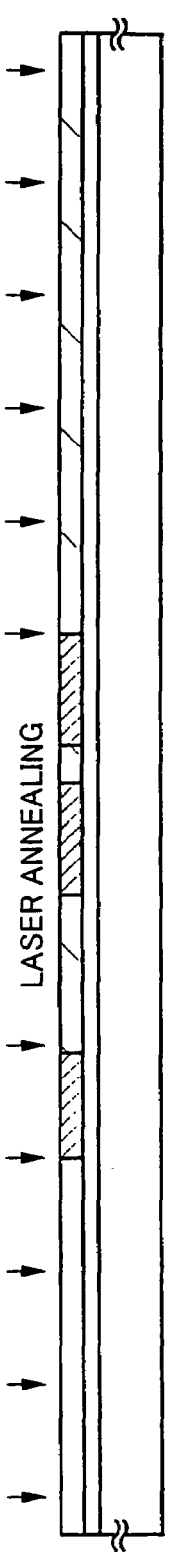

Next, a laser annealing step (first optical annealing) is carried out under the same condition as in case of FIG. 1B. By this step, the crystalline silicon film to which the impurity element has not been added is improved in its crystallinity, while, in the region to which the impurity element has been added, the non-crystallized silicon film is recrystallized, and at the same time, the added n-type or p-type impurity element is activated. This step is desirably carried out after the thermal oxide film formed on the surface of the crystalline silicon film 1312 by the crystallization step shown in FIG. 13D is removed. (FIG. 13E)

After this, the step shown in FIG. 1F and the ensuing steps are carried out in accordance with the steps of Embodiment 1. This Embodiment which is constituted as described above can be practiced in case of fabricating the active matrix type liquid crystal display device according to Embodiments 2 and 3.

Embodiment 12

This Embodiment will be described, by referring to FIG. 14, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as far as the same steps are concerned. Further, as for the added impurity elements, the same impurity elements as those used in Embodiment 1 will be used by way of example.

Figure 14A:
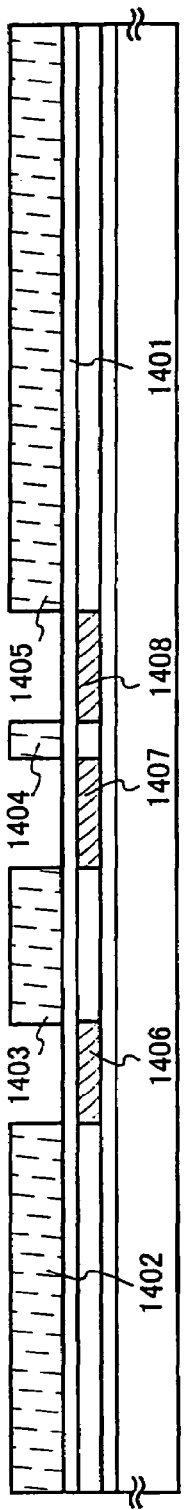
FIGS. 14A-14D are diagrams showing some steps for fabricating a pixel portion and a driving circuit.

First, the state shown in FIG. 13A is obtained in accordance with the steps of Embodiment 11. Next, after a protective film 1401 which comprises an insulation film containing silicon is formed to a thickness of 120 to 150 nm, resist masks 1402 to 1405 are formed. An n-type impurity element is then added under the same condition as in case of FIG. 1D. Thus, n-type impurity regions (b) 1406 to 1408 are formed. (FIG. 14A)

Figure 14B:
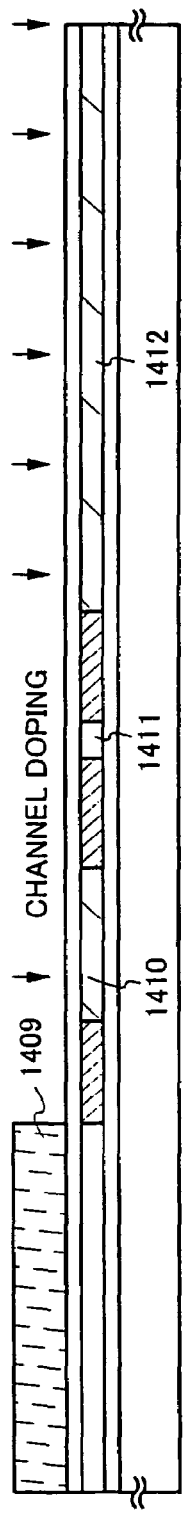

Next, the resist masks 1402 to 1405 are removed, and a resist mask 1409 is newly formed. Then, under the same condition as in case of FIG. 1C, a channel doping step is carried out. Thus, p-type impurity regions (b) 1410 to 1412 are formed. (FIG. 14B)

Figure 14C:

Next, after the protective film 1401 is removed, the amorphous silicon film to which an n-type or p-type impurity element has been added is crystallized in accordance with the technique disclosed in Japanese Patent Laid-Open No. 130652/1995, whereby a crystalline silicon film 1413 is obtained. (FIG. 14C)

In case of effecting the crystallization by the use of the technique according to Embodiment 2 described in Japanese Patent Laid-Open No. 130652/1995, it is possible to leave the protective film 1401 as it is. That is, it is possible to utilize the protective film 1401 as a mask film when a catalytic element for promoting the crystallization is selectively added.

Figure 14D:
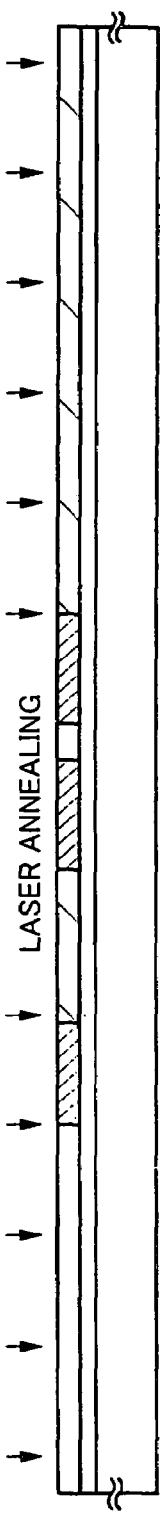

Next, under the same condition as in case of FIG. 1B, a laser annealing step (first optical annealing) is carried out. By this step, the crystalline silicon film to which the impurity element has not been added is improved in its crystallinity, while, in the region to which the impurity element has been added, the non-crystallized silicon film is recrystallized, and at the same time, the added n-type or p-type impurity element is activated. This step is preferably carried out after the thermal oxide film formed on the surface of the crystalline silicon film 1413 by the crystallization step shown in FIG. 14C is removed. (FIG. 14D)

After this, the step shown in FIG. 1F and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 13

This Embodiment will be described, by referring to FIG. 15, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as far as the same steps are concerned. Further, as for the impurity elements added, the same impurity elements as those used in Embodiment 1 will be used by way of example.

First, in accordance with the steps of Embodiment 1, the state shown in FIG. 1C is obtained (FIGS. 15A to 15C). Here, a laser annealing step (second optical annealing) may be carried out under the same condition as in case of FIG. 1E to thereby activate the p-type impurity element which was added at the channel doping step.

Next, the crystalline silicon film is patterned to form active layers 1501 to 1504. On these active layers, a gate insulating film 1505 is formed to a thickness of 80 to 150 nm (110 nm, in this Embodiment). As the gate insulating film 1505, an insulation film containing silicon can be used, but, in this Embodiment, a silicon oxinitride film is used. (FIG. 15D)

Next, resist masks 1506 to 1509 are formed. An n-type impurity element is then added as in case of FIG. 1D. However, in case the impurity element is added through an insulation film having a different thickness, it is necessary to set an accelerating voltage different from that in case of FIG. 1D. Thus, n-type impurity regions (b) 1510 to 1512 are formed. (FIG. 15E)

Next, the resist masks 1506 to 1509 are removed, and a laser annealing step (second optical annealing) is carried out. By so doing, the added n-type or p-type impurity element is effectively activated. Further, the interfaces between the active layers and the gate insulating film are also improved. In case of this Embodiment, it is necessary to irradiate the laser beam through a gate insulating film with a thickness of 110 nm, so that, by taking this into consideration, the laser annealing condition must be set. (FIG. 15F)

After this, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 14

This Embodiment will be described, by referring to FIG. 16, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as far as the same steps are concerned. Further, as for the impurity elements added, the same impurity elements as those used in Embodiment 1 will be used by way of example.

First, in accordance with the steps of Embodiment 1, the first step to the step shown in FIG. 1B are carried out (FIG. 16A, FIG. 16B), and, in accordance with the steps of Embodiment 5, the state shown in FIG. 9A is obtained (FIG. 16C). In this Embodiment, there is disclosed an example of the case where, after the laser annealing step (first optical annealing), the crystalline silicon film is patterned, but this step order can be reversed. Further, in this Embodiment, there is disclosed an example of the case where the channel doping step is carried out after the active layer forming step, but this step order can be reversed. Then, in accordance with the steps of Embodiment 6, the state shown in FIG. 10A is obtained (FIG. 16D).

Next, from the state shown in FIG. 16D, the resist mask 1001 and the protective film 905 are removed, and a gate insulating film 1505 is formed in the same manner as the step described in connection with Embodiment 13 and shown in FIG. 15A. After this, the steps shown in FIG. 15A to 15C are carried out in accordance with Embodiment 13, and thereafter, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 15

This Embodiment will be described, by referring to FIG. 17, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements as those used in Embodiment 1 will be used by way of example.

Figure 17A:
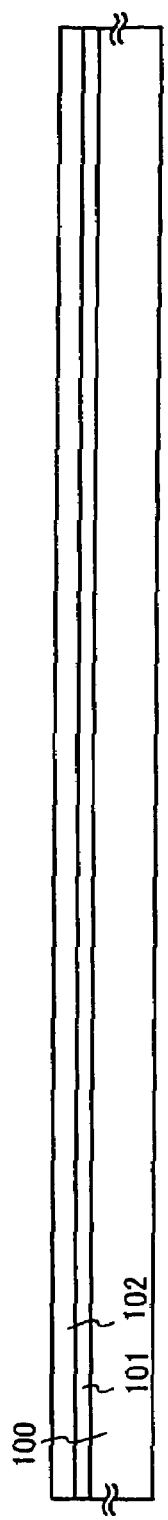
FIGS. 17A-17D are diagrams showing some steps for fabricating a pixel portion and a driving circuit.
Figure 17B:
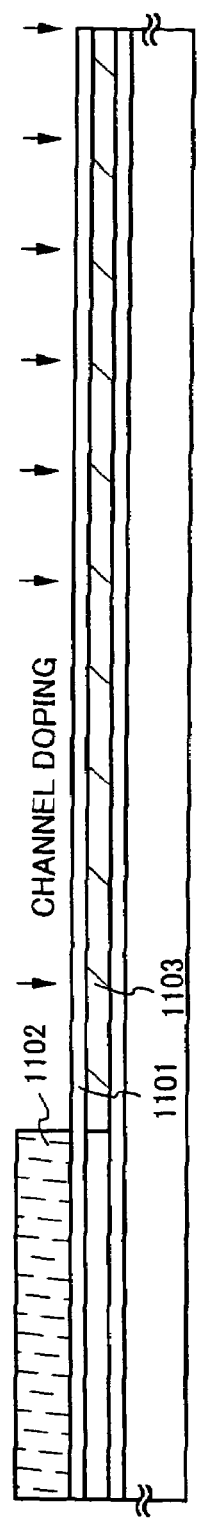
Figure 17C:
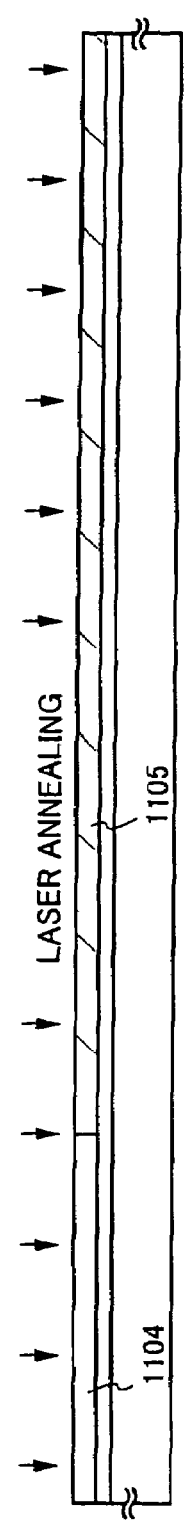
Figure 17D:
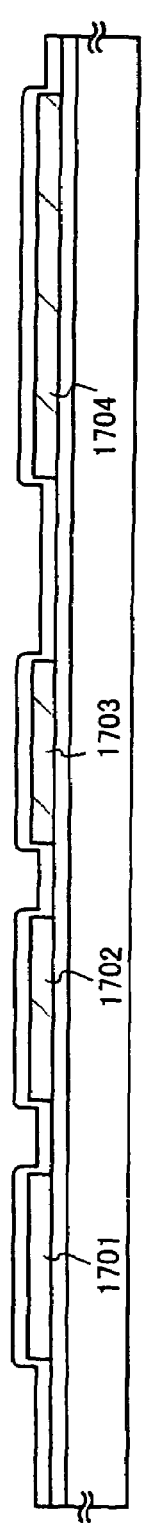

First, the first step to the step shown in FIG. 1A are carried out in accordance with the steps of Embodiment 1 (FIG. 17A), and, in accordance with the step order of Embodiment 7, the first step to the step shown in FIG. 11B are carried out (FIGS. 17B and 17C). Next, the crystalline silicon film which has undergone a laser annealing step (first optical annealing) is patterned to form active layers 1701 to 1704. (FIG. 17D)

In this Embodiment, there is disclosed an example of the case where the crystalline silicon film is patterned after the laser annealing step (first optical annealing, but this step order can be reversed.

Next, a gate insulating film 1505 is formed in the same manner as the step described in connection with Embodiment 13 and shown in FIG. 15A. After this, the steps shown in FIGS. 15A to 15C are carried out in accordance with Embodiment 13, and thereafter, in accordance with the steps of Embodiment 1, the step shown in FIG. 2B and the ensuing steps are carried out. This Embodiment which is constituted as described above can be practiced in case of fabricating the active matrix type liquid crystal display device according to Embodiments 2 and 3.

Embodiment 16

This Embodiment will be described with respect to a case where the TFTs are fabricated in a step order which differs from that of Embodiment 1. Since this Embodiment is basically identical with Embodiment 15 and will therefore be described referring to FIG. 17. Further, as for the impurity elements added, the same impurity elements as those used in Embodiment 15 will be used by way of example.

The feature of this Embodiment lies in the point that the laser annealing step (first optical annealing) described in connection with Embodiment 15 and shown in FIG. 17C is omitted, but the same step is fulfilled jointly by a laser annealing step which is carried out after the formation of the n-type impurity regions (b). In this case, the condition for the laser annealing step performed after the n-type impurity regions (b) are formed needs to be changed to the first optical annealing, but, by this measure, the number of steps can be reduced. In case of this Embodiment, however, the laser beam must be irradiated through a gate insulating film with a thickness of 110 nm, so that the laser annealing condition must be set by taking this into consideration.

A laser annealing step (first optical annealing) is carried out after the n-type impurity regions (b) are formed, and then, the step shown in FIG. 2B and the ensuing steps are carried out in accordance with the steps of Embodiment 1. This Embodiment which is constituted as described above can be practiced in case of fabricating the active matrix type liquid display deices according to Embodiments 2 and 3.

Embodiment 17

This Embodiment will be described, by referring to FIG. 18, with respect to the case the TFTs are fabricated in a step order which differs from that of Embodiment 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements as those used in Embodiment 1 will be used by way of example.

Figure 18A:
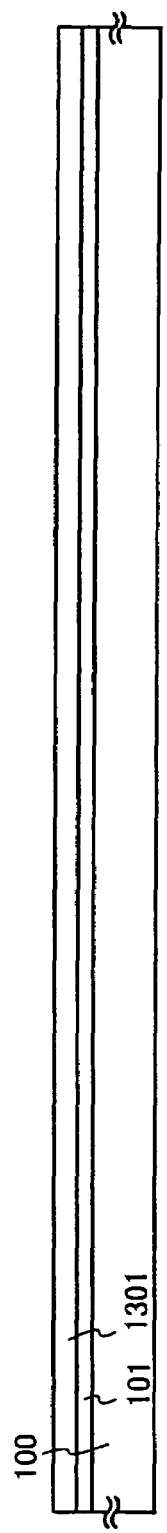
FIGS. 18A-18D are diagrams showing some steps for fabricating a pixel portion and a driving circuit.
Figure 18B:
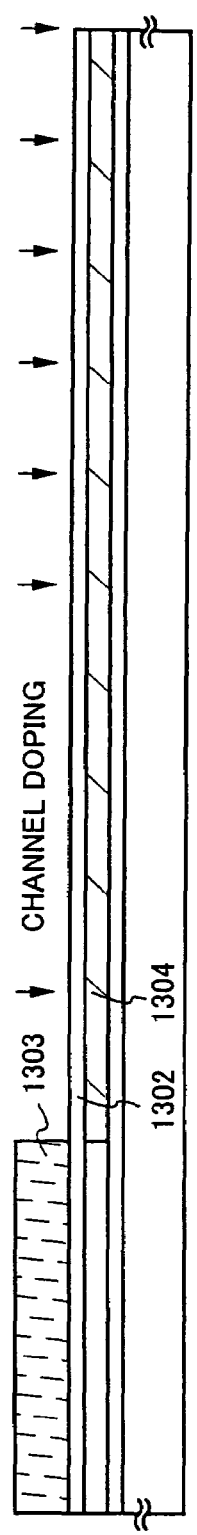
Figure 18C:
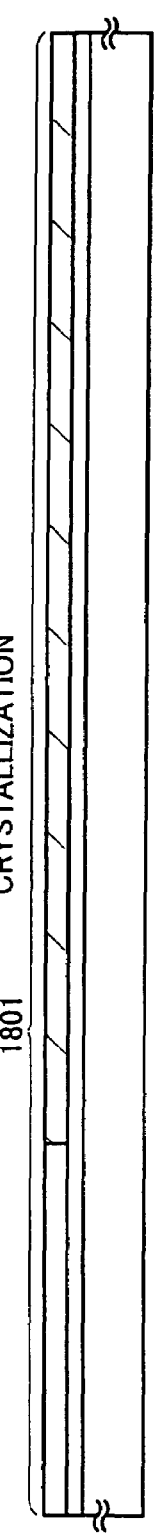

First, in accordance with the steps of Embodiment 11, the state shown in FIG. 13B is obtained (FIGS. 18A and 18B). Next, the resist mask 1303 is removed, and, in accordance with the technique disclosed in Japanese Patent Laid-Open No. 130652/1995, the amorphous silicon film to which an n-type or p-type impurity element has been added is crystallized to obtain a crystalline silicon film 1801. (FIG. 18C)

In case of effecting the crystallization by the use of the technique according to Embodiment 2 described in Japanese Patent Laid-Open No. 130652/1995, it is possible to leave the protective film 1302 as it is. That is, the protective film can be utilized as a mask film when a catalytic element for promoting the crystallization is selectively added.

Figure 18D:
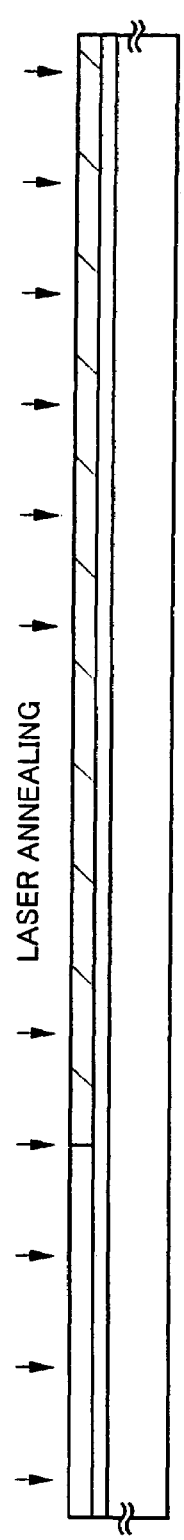

Next, a laser annealing step (first optical annealing) is carried out under the same condition as in case of FIG. 1B. By this step, the crystalline silicon film to which no impurity element has been added is improved in its crystallinity, while, in the region to which the impurity element has been added, the non-crystallized silicon film is recrystallized, and at the same time, the n-type or p-type impurity element added is activated. It is preferable that this step is carried out after the removal of the thermal oxide film formed on the surface of the crystalline silicon film 1801 through the crystallization step shown in FIG. 18C. (FIG. 18D)

After this, the steps shown in FIGS. 15A to 15C are carried out in accordance with Embodiment 13, and thereafter, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 18

This Embodiment will be described, by referring to FIG. 19, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements as those used in Embodiment 1 will be used by way of example.

Figure 19A:
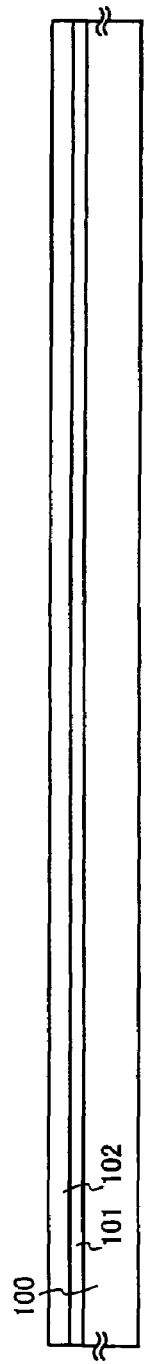
FIGS. 19A-19F are diagrams showing some steps for fabricating a pixel and a driving circuit.
Figure 19B:
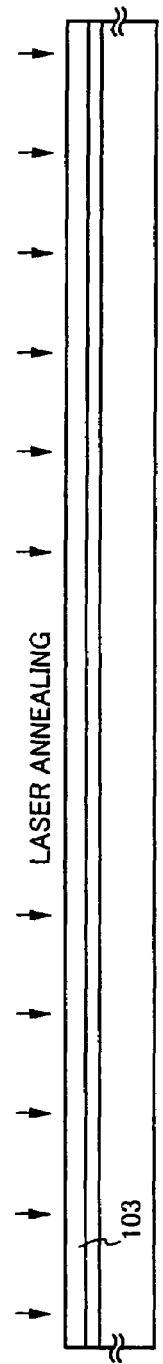
Figure 19C:
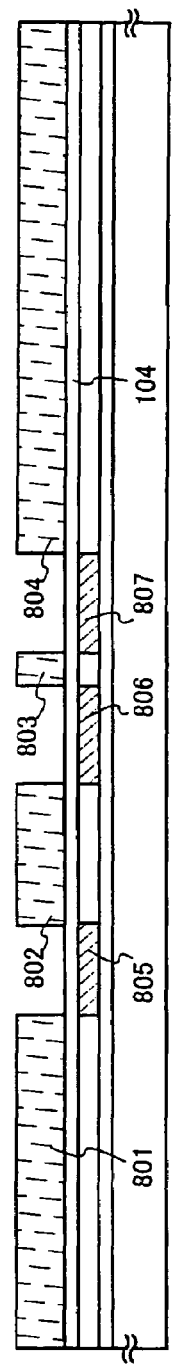

First, the state shown in FIG. 1B is obtained in accordance with the steps of Embodiment 1 (FIGS. 19A and 19B). Further, in accordance with the steps of Embodiment 4, the state shown in FIG. 8A is obtained (FIG. 19C). Here, a laser annealing step (second optical annealing) may be carried out under the same condition as used in case of FIG. 1E to activate the n-type impurity element which was added at the step shown in FIG. 19C.

Figure 19D:
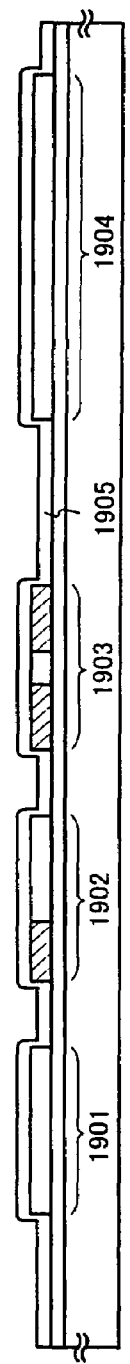

Next, the crystalline silicon film is patterned to form active layers 1901 to 1904. Further, on these active layers, a gate insulating film 1905 is formed to a thickness of 80 to 150 nm (110 nm, in this Embodiment). As the gate insulating film 1905, an insulation film containing silicon can be used, but, in this Embodiment, a silicon oxinitride film is used. (FIG. 19D)

Figure 19E:
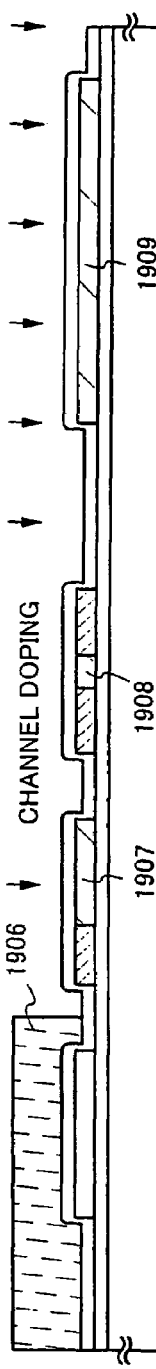

Next, a resist mask 1906 is formed. Then a p-type impurity element is added as in case of FIG. 1C. However, in case the impurity element is added through an insulation film having a different thickness, the accelerating voltage must be set to a value different from that in case of FIG. 1C. Thus, p-type impurity regions (b) 1907 to 1909 are formed. (FIG. 19E)

Figure 19F:
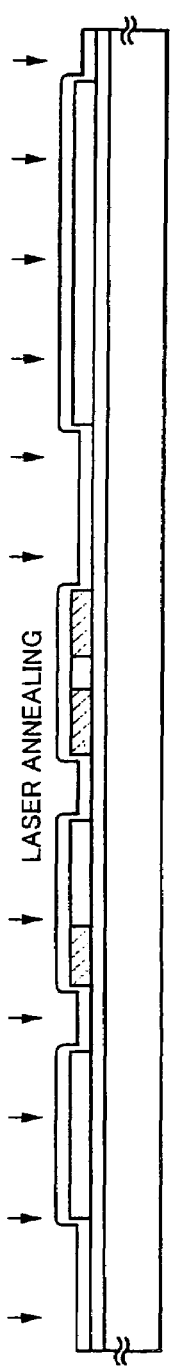
Figure 20A:
FIGS. 20A-20D are diagrams showing some steps for fabricating a pixel portion and a driving circuit.
Figure 20B:
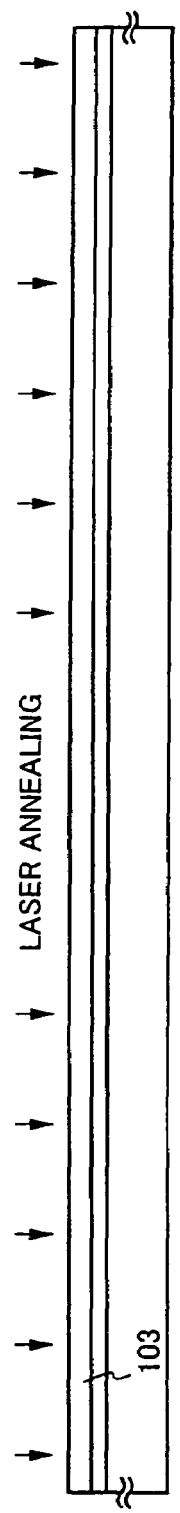
Figure 20C:
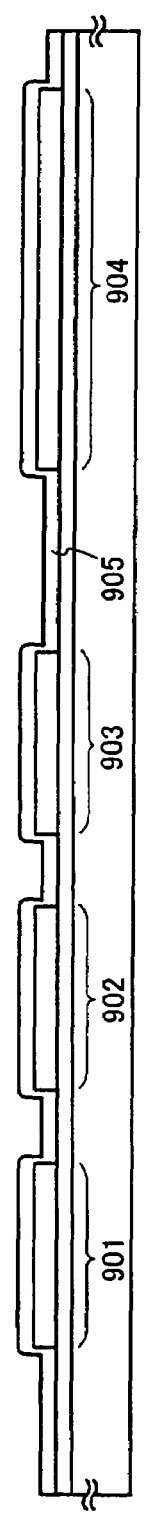
Figure 20D:
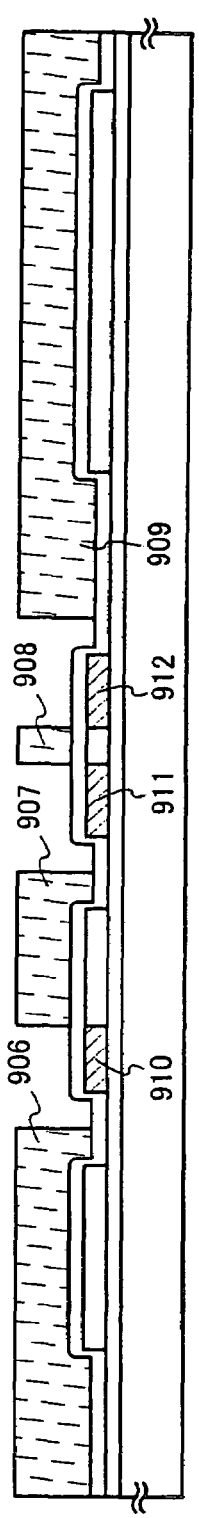

Next, the resist mask 1906 is removed, and a laser annealing step (second optical annealing) is carried out. By so doing, the added n-type or p-type impurity element is effectively activated. Further, the interfaces between the active layers and the gate insulating film are also improved. In case of this Embodiment, it is necessary to irradiate the laser beam through the gate insulating film with a thickness of 110 nm, so that the laser annealing condition must be set by taking this into consideration. (FIG. 19F)

After this, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 19

This Embodiment will be described, by referring to FIG. 20, with respect to a case where the TFTs are fabricated in a step order which differs from that of FIG. 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements as those used in Embodiment 1 will be used by way of example.

First, in accordance with the steps of Embodiment 1, the first step to the step shown in FIG. 1B are carried out, and then, the state shown in FIG. 9B is obtained in accordance with Embodiment 5. In this Embodiment 19, there is disclosed an example of the case where, after the laser annealing step (first optical annealing), the crystalline silicon film is patterned, but this step order can be reversed. Further, in this Embodiment, the n-type impurity regions (b) are formed after the formation of the active layers, but this order can also be reversed.

After this, the steps shown in FIG. 19D to 19F are carried out in accordance with Embodiment 18, and thereafter, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 20

Figure 21A:
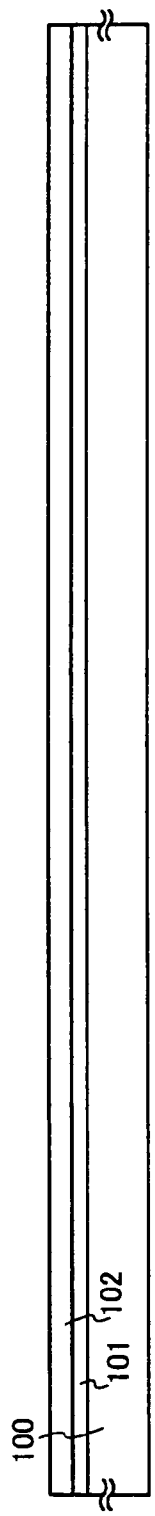
FIGS. 21A-21C are diagrams showing some steps for fabricating a pixel portion and a driving circuit.

This Embodiment will be described, by referring to FIG. 21, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements as those used in Embodiment 1 will be used by way of example.

Figure 21B:
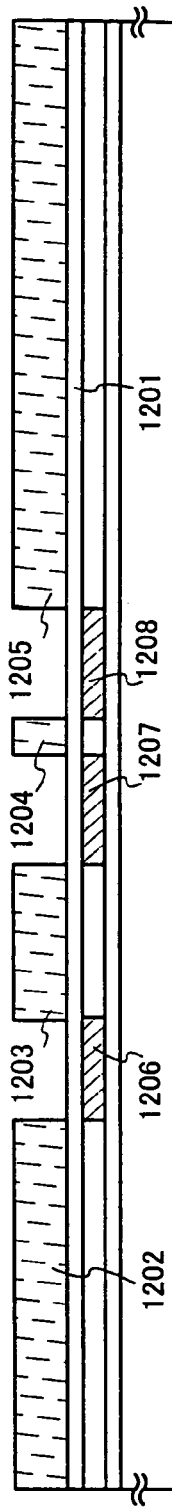
Figure 21C:
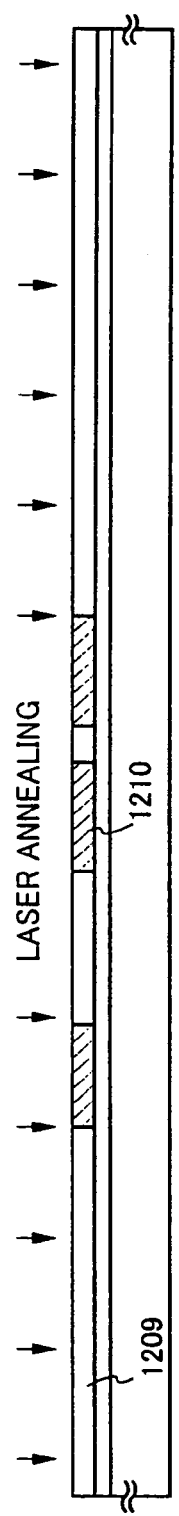

First, in accordance with the steps of Embodiment 1, the first step to the step shown in FIG. 1A are carried out (FIG. 21A), and then, in accordance with Embodiment 8, the state shown in FIG. 12B is obtained (FIGS. 21B and 21C). In this Embodiment, there is disclosed an example of the case where, after the laser annealing step (first optical annealing), the crystalline silicon film is patterned, but this step order can be reversed.

After this, the steps shown in FIGS. 19D to 19F are carried out in accordance with Embodiment 18, and thereafter, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 21

This Embodiment will be described with respect to a case where the TFTs are fabricated in a step order which differs from that of Embodiment 1. Since this Embodiment is basically identical with Embodiment 20, the description will be made referring to FIG. 21. Further, as for the impurity elements added, the same impurity elements as those used in Embodiment 20 will be used by way of example.

In this Embodiment, the laser annealing step (first optical annealing) described in connection with Embodiment 20 and shown in FIG. 21C is omitted, but this same step is jointly carried out by the laser annealing step performed after the n-type impurity regions (b) are formed. In this case, the condition for the laser annealing step carried out after the formation, of the n-type impurity regions (b) must be changed to the first optical annealing, but, by so doing, the number of steps can be reduced. In case of this Embodiment, however, it is necessary to irradiate the laser beam through the gate insulating film having a thickness of 110 nm, so that, by taking this into consideration, the laser annealing condition must be set.

In case the laser annealing step (first optical annealing) is carried out after the n-type impurity regions (b) are formed, the step shown in FIG. 2B and the ensuing steps are subsequently carried out in accordance with the steps of Embodiment 1. This Embodiment which is constituted as described above can be practiced in case of fabricating the active matrix type liquid crystal display devices according to Embodiments 2 and 3.

Embodiment 22

This Embodiment will be described, by referring to FIG. 22, with respect to a case where the TFTs are fabricated in a step order which differs from the step order of Embodiment 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements as those used in Embodiment 1 will be used by way of example.

Figure 22A:
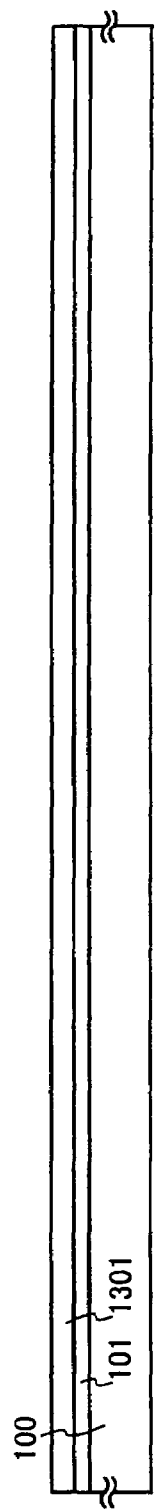
FIGS. 22A-22D are diagrams showing some steps for fabricating a pixel portion and a driving circuit.
Figure 22B:
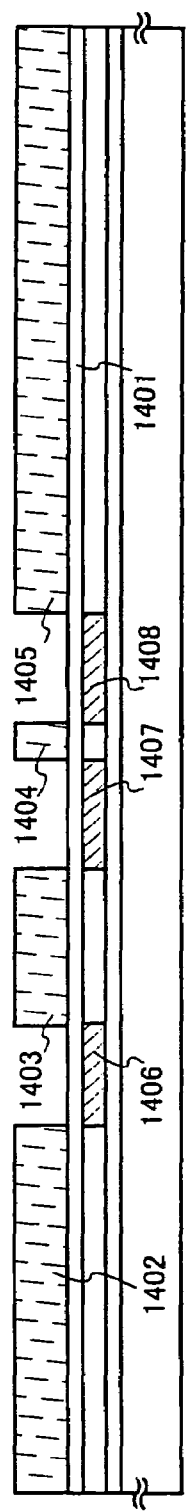

First, in accordance with the steps of Embodiment 11, the first step to the step shown in FIG. 13A are carried out (FIG. 22A), and then, in accordance with Embodiment 12, the state shown in FIG. 14A is obtained (FIG. 22B).

Figure 22C:

Next, after the removal of the protective film 1401, the amorphous silicon film to which an n-type impurity element has been added is crystallized in accordance with the technique disclosed in Japanese Patent Laid-Open No. 130653/1995, whereby a crystalline silicon film 2201 is obtained. (FIG. 22C)

In case of effecting the crystallization by the use of the technique according to Embodiment 2 described in Japanese Patent Laid-Open No. 130652/1995, it is possible to leave the protective film 1401 as it is. It is because the protective film can be utilized as a mask film when a catalytic element for promoting the crystallization is selectively added.

Figure 22D:
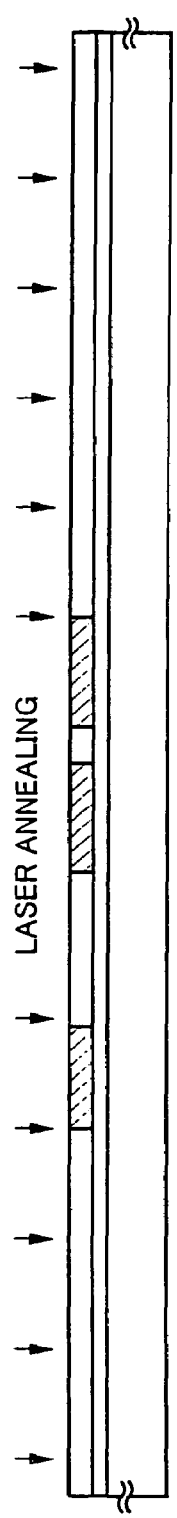

Next, under the same condition as in case of FIG. 1B, a leaser annealing step (first optical annealing) is carried out. By this step, the crystalline silicon film to which the impurity element has not been added is improved in its crystallinity, while, in the region to which the impurity element has been added, the non-crystallized silicon film is recrystallized, and at the same time, the n-type impurity element added is activated. It is preferable that this step is carried out after the thermal oxide film formed on the surface of the crystalline silicon film 2201 through the crystallization step shown in FIG. 22C. (FIG. 22D)

After this, the steps shown in FIG. 19D to 19F are carried out in accordance with Embodiment 18, and thereafter, the step shown in FIG. 2B and the ensuing steps are carried out in accordance with the steps of Embodiment 1. In this Embodiment, there is disclosed an example of the case where, after the laser annealing step (FIG. 22D), the crystalline silicon film is patterned, but this order can be reversed. Further, this Embodiment which is constituted as described above can be practiced in case of fabricating the active matrix type liquid crystal display devices according to Embodiments 2 and 3.

Embodiment 23

This Embodiment will be described, by referring to FIG. 23, with respect to a case where the TFTs are fabricated in a step order which differs from that of Embodiment 1. Since this Embodiment differs from Embodiment 1 only in respect of intermediate steps but identical with the latter in respect of the other steps, the same reference numerals will be used as long as the same steps are concerned. Further, as for the impurity elements added, the same impurity elements used in Embodiment 1 will also be used by way of example.

Figure 23A:
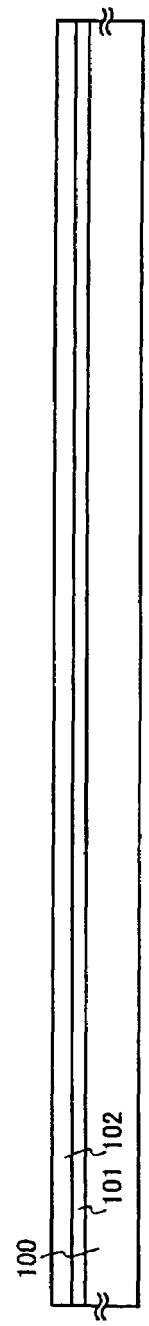
FIGS. 23A-23F are diagrams showing some steps for fabricating a pixel portion and a driving circuit.
Figure 23B:
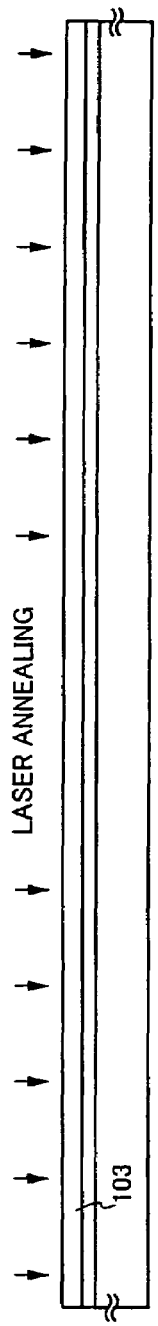

First, the first step to the state shown in FIG. 1B are carried out in accordance with the steps of Embodiment 1 (FIGS. 23A and 23B). Next, the crystalline silicon film 103 is patterned in the same manner as in case of Embodiment 5 to form active layers 901 to 904. In this Embodiment, there is disclosed an example of the case where, after the laser annealing step (first optical annealing), the crystalline silicon film is patterned, but this order can be reversed.

Figure 23C:
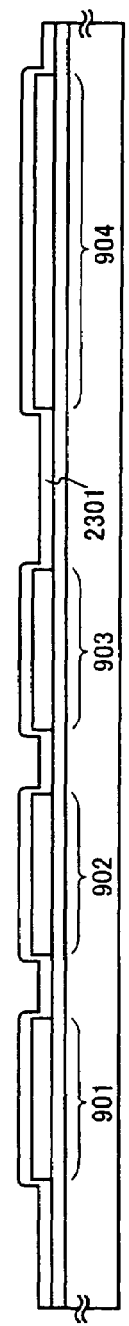

Then, on these active layers, a gate insulating film 2301 is formed to a thickness of 80 to 150 nm (110 nm, in this Embodiment). As the gate insulating film 2301, an insulation film containing silicon can be used, but, in this Embodiment, a silicon oxinitride film is used. (FIG. 23C)

Next, resist masks 2302 to 2305 are formed. Then an n-type impurity element is added as in case of FIG. 1D. However, in case the impurity element is added through an insulation film having a different thickness, the accelerating voltage must be set to a value different from that in case of FIG. 1D. Thus, n-type impurity regions (b) 2306 to 2308 are formed. (FIG. 23D)

Next, the resist masks 2302 to 2305 are removed, and a resist mask 2309 is newly formed. Then a channel doping step is carried out under the same condition as in case of FIG. 1C. However, in case of adding the impurity element through an insulation film having a different thickness, it is necessary to set the accelerating voltage to a value different from that in case of FIG. 1C. Thus, p-type impurity regions (b) 2310 to 2312 are formed. (FIG. 23B)

Figure 23D:
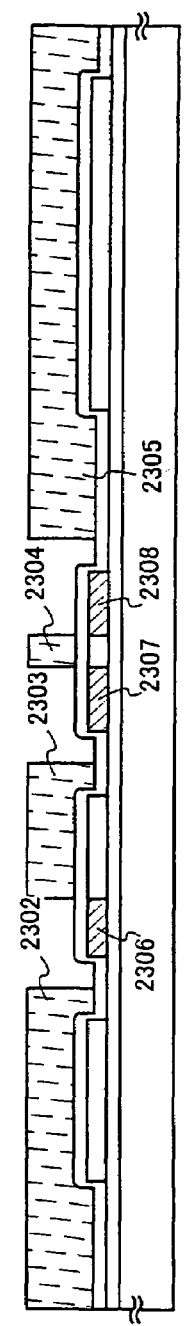
Figure 23E:
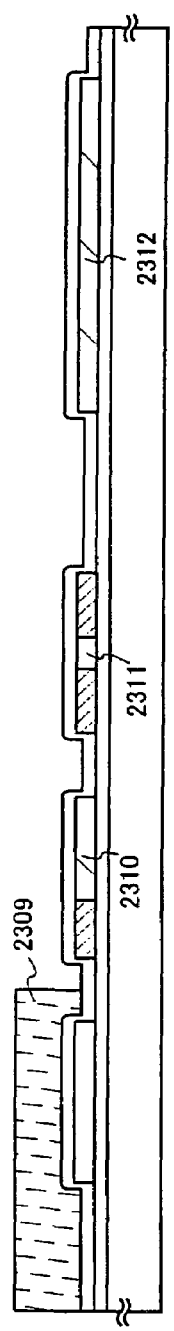

In this Embodiment, the step shown in FIG. 23D and the step shown in FIG. 23E can be reversed in step order.

Figure 23F:
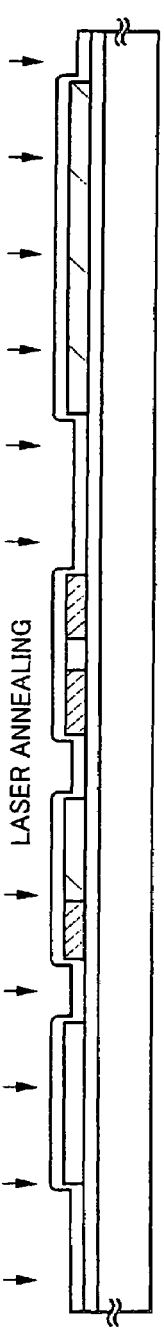

Next, the resist mask 2309 is removed, and a laser annealing step (second optical annealing) is carried out. By so doing, the n-type or p-type impurity element added is effectively activated. Further, the interfaces between the active layers and the gate insulating film are also improved. In case, of this Embodiment, it is necessary to irradiate the laser beam through a gate insulating film with a thickness of 110 nm, so that, by taking this into consideration, the laser annealing condition must be set. (FIG. 23F)

After this, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 24

This Embodiment will be described with respect to a case where the TFTs are fabricated in a step order which differs from that of FIG. 1. Since this Embodiment is basically identical with Embodiment 23 and will therefore be described referring to FIG. 23. Further, as for the impurity elements added, the same impurity elements as those used in Embodiment 23 will also be used by way of example.

The feature of this Embodiment lies in the point that the laser annealing step (first optical annealing) described in connection with Embodiment 23 and shown in FIG. 23B is omitted, but the same step is jointly fulfilled by a laser annealing step (FIG. 23F) which is performed after the n-type impurity regions (b) are formed. In this case, the condition for the laser annealing step carried out after the n-type impurity regions (b) are formed needs to be changed to a first optical annealing, but, by this measure, the number of steps can be reduced. In case of this Embodiment, however, it is necessary to irradiate a laser beam through the gate insulating film with a thickness of 110 nm, so that, by taking this into consideration, the laser annealing condition must be set.

After the laser annealing step (first optical annealing) shown in FIG. 23F is carried out, the step shown in FIG. 2B and the ensuing steps are carried out in accordance with the steps of Embodiment 1. This Embodiment which is constituted as described above can be practiced in case of fabricating the active matrix type liquid crystal display devices according to Embodiments 2 and 3.

Embodiment 25

This Embodiment will be described, by referring to FIG. 24, with respect to the steps for forming a semiconductor film which is to constitute the active layers of the TFTs. The crystallizing means used in this Embodiment is the technique according to Embodiment 1 described in Japanese Patent Laid-Open No. 130652/1995.

First, on a substrate (a glass substrate, in this Embodiment) 2401, there are formed a ground film 2402 comprising a silicon oxinitride film with a thickness of 200 nm and an amorphous semiconductor film (an amorphous silicon film, in this Embodiment) 2403 with a thickness of 200 nm. This step may be carried out in such a manner that the ground film and the amorphous semiconductor film are continuously formed without being exposed to the atmospheric air.

Figure 24A:
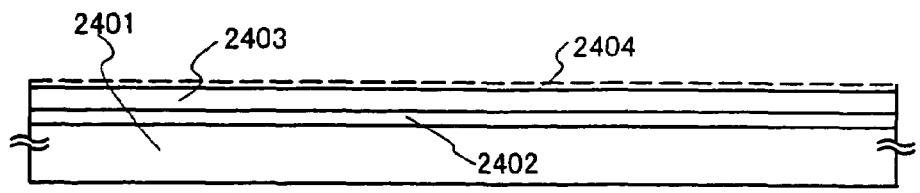
FIGS. 24A-24D are diagrams showing some steps for fabricating a crystalline semiconductor film.

Next, an aqueous solution (aqueous solution of nickel acetate) containing a catalytic element (nickel, in this Embodiment) of 10 ppm in terms of weight is applied by spin coating to form a catalytic element containing layer 2404 over the whole surface of the amorphous semiconductor film 2403. As the catalytic elements which can be used here, there are, besides nickel, metals such as germanium (Ge), iron (Fe), palladium (Pd), tin (Sn), lead (Pb), cobalt (Co), platinum (Pt), copper (Qu) and gold (Au). (FIG. 24A)

Although, in this Embodiment, the method of adding nickel by spin coating is used, it is also possible to employ the means of forming, on the amorphous semiconductor film, a thin film (nickel film, in this Embodiment) comprising a catalytic element, by the use of the evaporation method or the sputtering method.

Figure 24B:
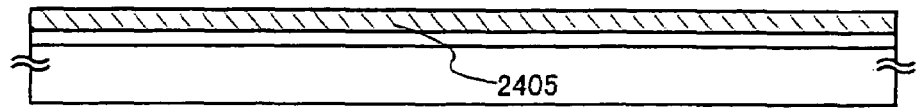

Next, prior to the step of crystallization, a heat treatment step is carried out at 400 to 500° C. for about 1 hour to eliminate the hydrogen from within the film, and then, heat treatment is carried out at 500 to 650° C. (preferably, 550 to 570° C.) for 4 to 12 hours (preferably, 4 to 6 hours). In this Embodiment, the heat treatment is carried out at 550° C. for 4 hours to form a crystalline semiconductor film (a crystalline silicon film, in this Embodiment) 2405. (FIG. 24B)

Here, a laser annealing step (first optical annealing) similar to the laser annealing step described in connection with Embodiment 1 and shown in FIG. 1E may be carried out to improve the crystallinity of the crystalline semiconductor film 2405.

Figure 24C:
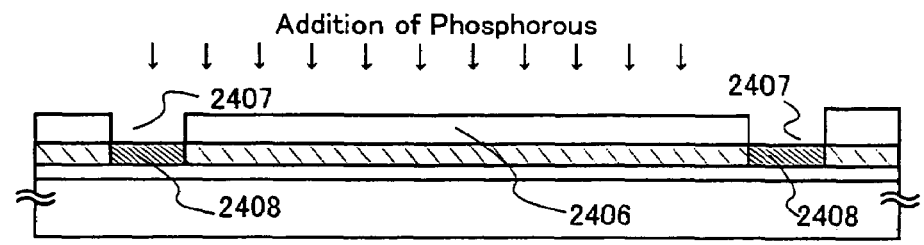

Next, a gettering step for removing from the crystalline silicon film the nickel used at the crystallization step. First, a mask insulation film 2406 is formed to a thickness of 150 nm on the surface of the crystalline semiconductor film 2405, and openings 2407 are formed by patterning. Then there is carried out the step of adding an element belonging to the group XV of the periodic table (phosphorus, in this Embodiment) to the thus exposed crystalline semiconductor film. By this step, gettering regions 2408 containing phosphorus at a concentration of $1\times10^{19}$ to $1\times10^{20}$ atoms/cm$^3$ are formed. (FIG. 24C)

Figure 24D:
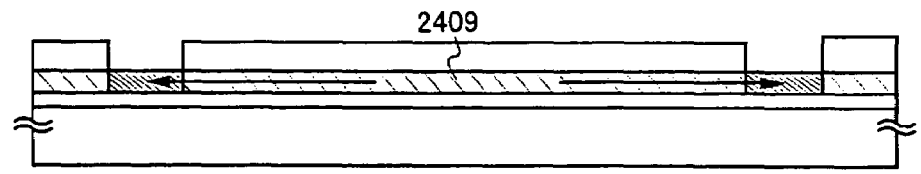

Next, heat treatment is carried out in a nitrogen atmosphere at 450 to 650° C. (preferably, 500 to 550° C.) for 4 to 24 hours (preferably 6 to 12 hours). By this heat treatment step, the nickel in the crystalline semiconductor film is moved in the directions indicated by arrows, and, by the gettering function of the phosphorus, the nickel is captured in the gettering regions 2408. Namely, since the nickel is removed from within the crystalline semiconductor film, the concentration of the nickel contained in the crystalline semiconductor film 2409 can be reduced down to $1\times10^{17}$ atoms/cm$^3$ or below, preferably as low as $1\times10^{16}$ atoms/cm$^3$. (FIG. 24D)

The thus formed crystalline semiconductor film 2409 is constituted of a crystalline semiconductor film with a very excellent crystallinity by the use of a catalytic element (nickel, here) for promoting the crystallization. Further, after the crystallization, the catalytic element is removed by the gettering function of the phosphorus; and thus, the concentration of the catalytic element remaining in the crystalline semiconductor film 2409 (excluding the gettering regions) is $1 \times 10^{17}$ atoms/cm$^3$ or below, preferably $1 \times 10^{16}$ atoms/cm$^3$.

The feature of this Embodiment lies in the point that, after a crystalline semiconductor film crystallized by the use of a catalytic element is formed, gettering regions (regions containing at a high concentration an impurity element belonging to the group XV of the periodic table) are formed in the regions which are not used as active regions, and, by heat treatment, the catalytic element which has been used for the crystallization is subjected to gettering.

The constitution of this Embodiment can be freely combined with any of the constitutions disclosed through Embodiments 1, 4 to 24. Further, it is also effective to practice this Embodiment in case of fabricating the active matrix type liquid crystal display devices according to Embodiments 2 and 3.

Embodiment 26

This Embodiment will be described, by referring to FIG. 25, with respect to the step of forming a semiconductor film which is to constitute the active layers of the TFTs. More specifically, the technique disclosed in Japanese Patent Laid-Open No. 247735/1998 (corresponding to U.S. patent application Ser. No. 09/034,041) is used.

First, on a substrate (a glass substrate, in this Embodiment) 2501, there are formed a ground layer 2502 comprising a silicon oxinitride film with a thickness of 200 nm and an amorphous semiconductor film (an amorphous silicon film, in this Embodiment) 2503. This step may be carried out in such a manner that the ground layer and the amorphous semiconductor film are continuously formed without being exposed to the atmospheric air.

Next, a mask insulation film 2504 comprising a silicon oxide film is formed to a thickness of 200 nm, and an opening 2505 is formed.

Figure 25A:
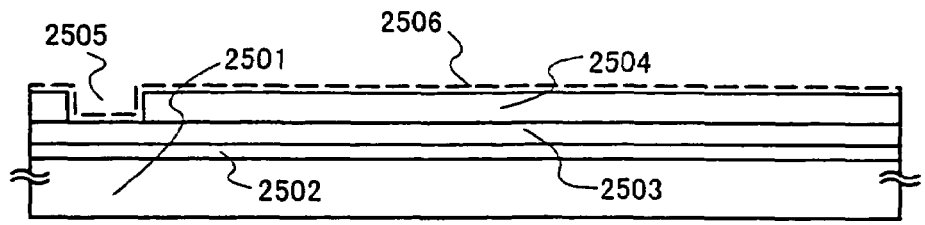
FIGS. 25A-25D are diagrams showing some steps for fabricating a crystalline semiconductor film.

Next, an aqueous solution (aqueous solution of nickel acetate) containing a catalytic element (nickel, in this Embodiment) of 100 ppm in terms of weight is applied by the spin coating method to form a catalytic element containing layer 2506. In this case, the catalytic element containing layer 2506 is selectively contacted with the amorphous semiconductor film 2503, in the region in which the opening 2505 is formed. As the catalytic elements usable here, there are, besides nickel (Ni), metals such as germanium (Ge), iron (Fe), palladium (Pd), Tin (Sn), lead (Pb), cobalt (Co), platinum (Pt), copper (Cu) and gold (Au). (FIG. 25A)

Further, in this Embodiment, the method of adding nickel by spin coating is used, but it is also possible to adopt the means of forming on the amorphous semiconductor film a thin film (a nickel film, in this Embodiment) comprising a catalytic element by the use of evaporation method or the sputtering method.

Figure 25B:
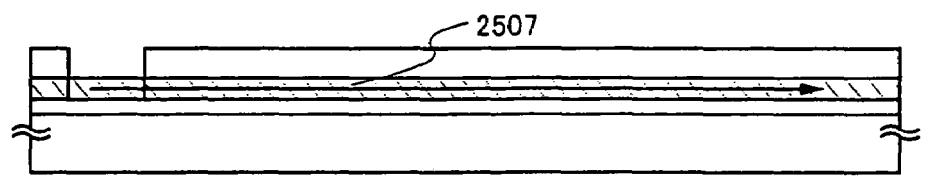

Next, a heat treatment step is carried out at 400 to 500° C. for about 1 hour prior to a crystallization step, and, after the hydrogen is eliminated from within the film, heat treatment is carried out at 500 to 650° C. (preferably, 550 to 600° C.) for 6 to 16 hours (preferably 8 to 14 hours). In this Embodiment, the heat treatment is carried out at 570° C. for 14 hours. As a result, crystallization proceeds, from the opening 2505 as a staring point, in a direction (the direction indicated by an arrow) approximately parallel to the substrate, whereby there is formed a crystalline semiconductor film (a crystalline silicon film, in this Embodiment) 2507 in which the macroscopic crystal growth direction is uniform. (FIG. 25B)

Figure 25C:
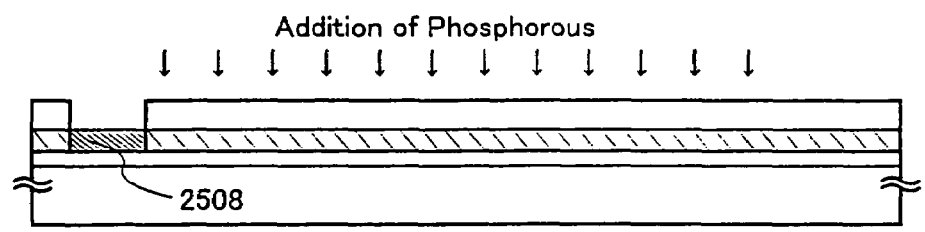

Next, a gettering step is carried out for removing from the crystalline silicon film the nickel used at the crystallization step. In this Embodiment, first the step of adding an element (phosphorus, in this Embodiment) belonging to the group XV of the periodic table by the use, as a mask, of the mask insulation film 2504 formed a while ago is carried out, and a gettering region 2508 is formed, which contains phosphorus at a concentration of $1 \times 10^{19}$ to $1 \times 10^{20}$ atoms/cm$^3$, in the crystalline semiconductor film exposed in the opening 2508. (FIG. 25C)

Figure 25D:
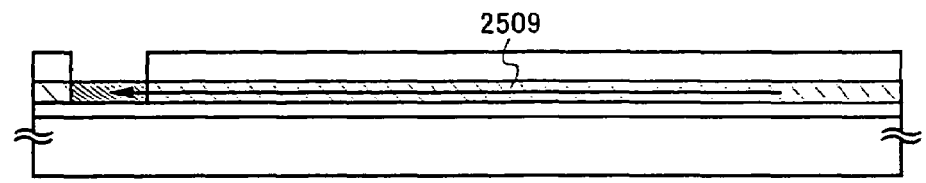

Next, a heat treatment step is carried out in a nitrogen atmosphere at 450 to 650° C. (preferably 500 to 550° C.) for 4 to 24 hours (preferably 6 to 12 hours). By this heat treatment step, the nickel in the crystalline semiconductor film is moved in the direction indicated by an arrow and captured in the gettering region 2508 by the gettering function of the phosphorus. Thus, from within the crystalline semiconductor film, the nickel is removed, so that the concentration of nickel contained in the crystalline semiconductor film 2509 can be reduced to as low as $1 \times 10^{17}$ atoms/cm$^3$ or below, preferably $1 \times 10^{16}$ atoms/cm$^3$. (FIG. 25D)

The crystalline semiconductor film 2509 formed as mentioned above turns out to be constituted of a crystalline semiconductor film having very good crystallinity, by crystallizing the film through the selective addition of a catalytic element (nickel, here) for promoting the crystallization. More specifically, the crystalline semiconductor 2509 has a crystalline structure in which rod-like or pillar-like crystals are arranged side by side with a specific orientation. Further, after the crystallization, the catalytic element is removed by the gettering function of the phosphorus; and thus, the concentration of the catalytic element remaining in the crystalline semiconductor film 2509 is $1 \times 10^{17}$ atoms/cm$^3$ or below, preferably $1 \times 10^{16}$ atoms/cm$^3$.

The feature of this Embodiment lies in the point that, after the crystalline semiconductor film crystallized by the use of a catalytic element is formed, a gettering region (a region containing at a high concentration an impurity element belonging to the group XV of the periodic table) is formed in a region which is not used as active region, and, by heat treatment, the catalytic element used for the crystallization is subjected to gettering.

The constitution of this Embodiment can be freely combined with the constitution according to any of Embodiments 1, 4 to 24. Further, the constitution of this Embodiment can be practiced in case of fabricating the active matrix type liquid crystal display devices according to Embodiments 2 and 3.

Embodiments 27

This Embodiment will be described, by referring to FIG. 26, with respect to a case where the TFTs are fabricated in a step order which differs from that of Embodiment 1. Since this Embodiment is identical with Embodiment 1 in respect of the first step to an intermediate step, so that the same reference numerals will be used as long as the same steps are concerned. Further, as for the impurity elements added, the same impurity elements as those used in Embodiment 1 will be used by way of example.

First, the state shown in FIG. 2C is obtained in accordance with the steps of Embodiment 1. Next, the step of adding an n-type impurity element (phosphorus, in this Embodiment) under the same condition as used in case of FIG. 2D. Thus, n-type impurity regions (c) 125 to 130 are formed. In this connection, phosphorus is added also to the already formed n-type impurity regions (b) at the same time, but the concentration of phosphorus added at this step is sufficiently low as compared the phosphorus contained in the n-type impurity regions (b) and therefore not shown here. (FIG. 26A)

Next, the gate insulating film is etched in a self-alignment manner by the use of the gate wirings as a mask. For this etching, the dry etching method is employed, and, as the etching as, a $CHF_3$ gas is used. However, the etching gas need not be limited to this gas. In this way, gate insulating films 131 to 134 are formed underneath the gate wirings. (FIG. 26B)

Next, a resist mask 2601 is formed, a p-type impurity element (boron, in this Embodiment) is added under the same condition as in case of FIG. 3A. By this step, p-type impurity regions 2602, 2603 are formed. (FIG. 26C)

Next, resist masks 2604 to 2607 are formed, and an n-type impurity element (phosphorus, in this Embodiment) is added under the same condition as in case of FIG. 2F. By this step, n-type impurity regions (a) 2608 to 2614 are formed. In this case, the phosphorus is also added to portions (the regions indicated by numerals 2615 and 2616) of the p-type impurity regions (a) 2602, 2603 at a concentration of $1 \times 10^{20}$ to $1 \times 10^{21}$ atoms/$cm^3$, but this phosphorus concentration is sufficiently low as compared with the concentration of boron contained in the p-type impurity regions (a) and therefore not shown here. (FIG. 26D)

After this, by carrying out the step shown in FIG. 3B and the ensuing steps in accordance with the steps of Embodiment 1, an active matrix substrate of the structure described in connection with FIG. 3C. In case this Embodiment is practiced, the concentration of the impurity element contained in the impurity regions formed in the active regions finally may differ from that of Embodiment 1 in some cases due to the change in the order of the steps. However, the substantial functions of the respective impurity regions do not vary, so that, as the description of the final structure obtained in case this Embodiment is practiced, the description of the structure shown in FIG. 3C can be directly referred to.

Further, the constitution of this Embodiment can be freely combined with the constitution of any of Embodiments 1, 4 to 24. Further, the constitution of this Embodiment can be also effectively practiced in case of fabricating the active matrix type liquid crystal display devices according to Embodiments 2 and 3.

Embodiment 28

This Embodiment will be described, by referring to FIG. 27, with respect to a case where the TFTs are fabricated in a step order which differs from that of Embodiment 1. Since this Embodiment is identical with Embodiment 1 in respect of the steps ranging from the first step to an intermediate step, the same reference numerals will be used as long as the same steps are concerned. Further, as for the impurity elements added, the same impurity elements used in Embodiment 1 will also be used by way of example.

Figure 27A:
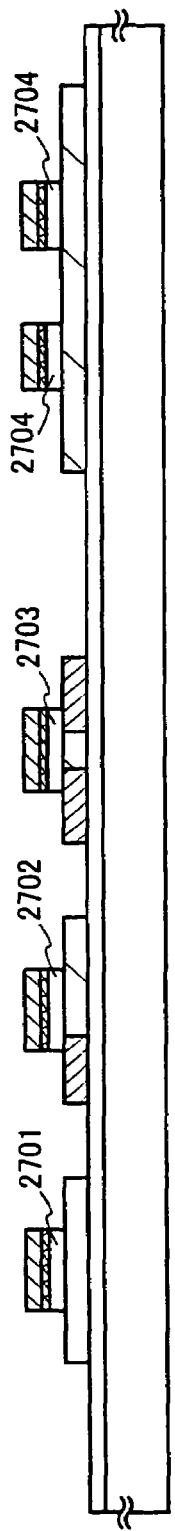
FIGS. 27A-27D are diagrams showing some steps for fabricating a pixel portion and a driving circuit.

First, the state shown in FIG. 2C is obtained in accordance with the steps of Embodiment 1. Next, the gate insulating film is etched in a self-alignment manner by the use of the gate wirings as a mask. For the etching, the dry etching method is employed, and, as the etching gas, a $CHF_3$ gas is used. However, the etching gas need not be limited to this gas. In this way, gate insulating films 2701 to 2704 are formed underneath the gate wirings. In the pixel TFT, the gate insulating films are etched to the same pattern as in case of the gate wirings, so that they are designated by the same reference numerals. (FIG. 27A)

Figure 27B:
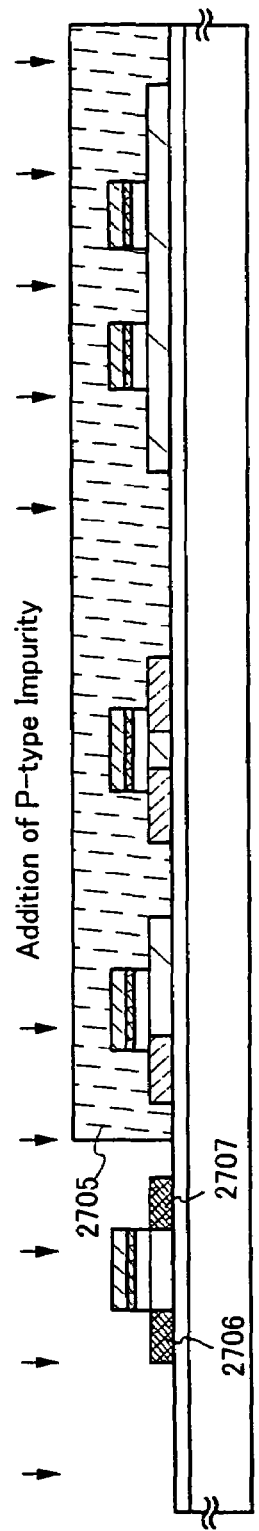

Next, a resist mask 2705 is formed, and a p-type impurity element (boron, in this Embodiment) is added under the same condition as in case of FIG. 3A. By this step, p-type impurity regions (a) 2706 and 2707 are formed. (FIG. 27B)

Figure 27C:
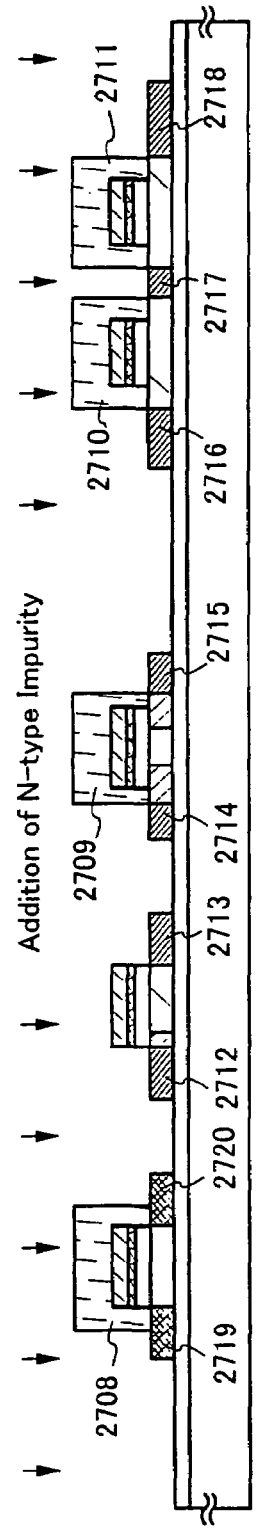

Next, resist masks 2708 to 2711 are formed, and an n-type impurity element (phosphorus, in this Embodiment) is added under the same condition as in case of FIG. 2F. By this step, n-type impurity regions (a) 2713 to 2718 are formed. In this case, the phosphorus is also added to portions (the regions indicated by numerals 2719 and 2720) of the p-type impurity regions (a) 2706 and 2707, but the concentration of this phosphorus is sufficiently low as compared with the concentration of the boron contained in the p-type impurity regions (a) and therefore not shown. (FIG. 27C)

Figure 27D:
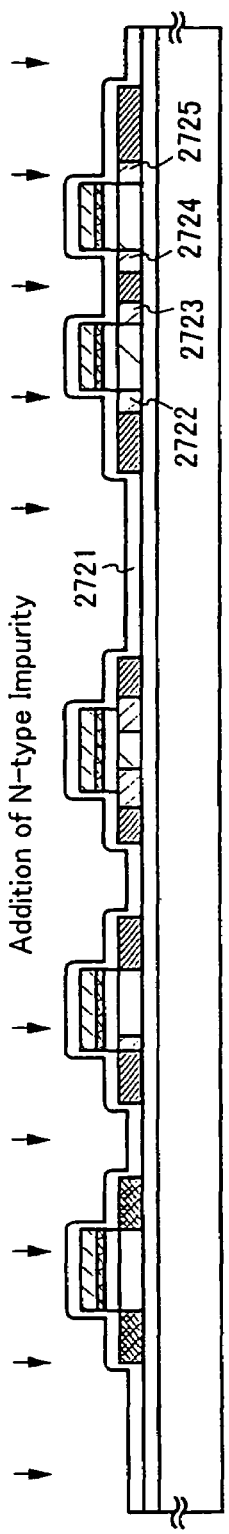

Next, the resist masks 2708 to 2711 are removed, and a protective film 2721 which comprises an insulation film containing silicon is formed to a thickness of 130 nm. Then, under the same condition as in case of FIG. 2D, the step of adding an n-type impurity element (phosphorus, in this Embodiment) is carried out. In this way, n-type impurity regions (c) 2722 to 2725 are formed. Although, also to the n-type impurity regions (b), n-type impurity regions (a) and p-type impurity regions (a) which are already formed, the phosphorus is added at the same time, the concentration of the phosphorus added here is sufficiently low as compared with the concentration of the impurity elements contained in the other impurity regions and therefore not shown. (FIG. 27D)

After this, the step shown in FIG. 3B and the ensuing steps are carried out in accordance with the steps of Embodiment 1, whereby an active matrix substrate of the structure described in connection with FIG. 3C can be fabricated. In case this Embodiment is practiced, the concentrations of the impurity elements contained in the impurity regions formed finally in the active regions may differ from those of Embodiment 1 in some cases. However, the substantial functions of the respective impurity regions do not differ, so that, as the description of the final structure in case this Embodiment is practiced, the description of the structure shown in FIG. 3C can be directly referred to.

Further, the constitution of this Embodiment can be freely combined with the constitution of any of Embodiments 1, 4 to 24. Further, the constitution of this Embodiment can also be effectively practiced in case of fabricating the active matrix type liquid crystal display devices according to Embodiments 2 and 3.

Embodiment 29

This Embodiment will be described, by referring to FIG. 28, with respect to a case where the TFTs are fabricated in a step order which differs from that of Embodiment 1. Since this Embodiment is identical with Embodiment 1 in respect of the steps ranging from the first step to an intermediate step, the same reference numerals will be used as long as the same steps are concerned. Further, as for the impurity elements added, the same impurity elements used in Embodiment 1 will also be used by way of example.

Figure 28A:
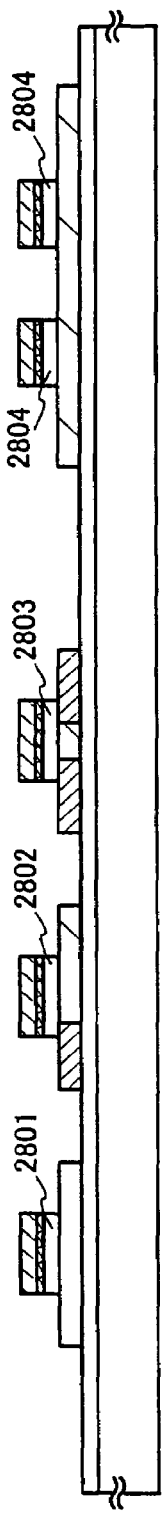
FIGS. 28A-28D are diagrams showing some steps for fabricating a pixel portion and a driving circuit.

First, the state shown in FIG. 2C is obtained in accordance with the steps of Embodiment 1. Next, the gate insulating film is etched in a self-alignment manner by the use of the gate wirings as a mask. For this etching, the dry etching method is employed, and, as the etching gas, a $CHF_3$ gas is used. However, the etching gas need not be limited to this gas. In this way, gate insulating films 2801 to 2804 are formed underneath the gate wirings. Further, in the pixel TFT, the gate insulating films are etched to the same pattern as in case of the gate wirings, so that they are designated by the same reference numeral. (FIG. 28A)

Figure 28B:
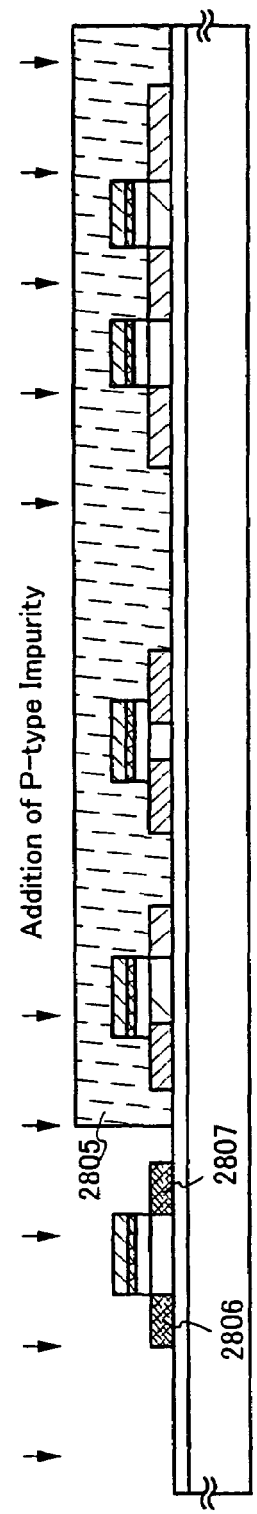

Next, a resist mask 2805 is formed, and a p-type impurity element (boron, in this Embodiment) is added under the same condition as in case of FIG. 3A. By this step, p-type impurity regions (a) 2806 and 2807 are formed. (FIG. 28B)

Figure 28C:
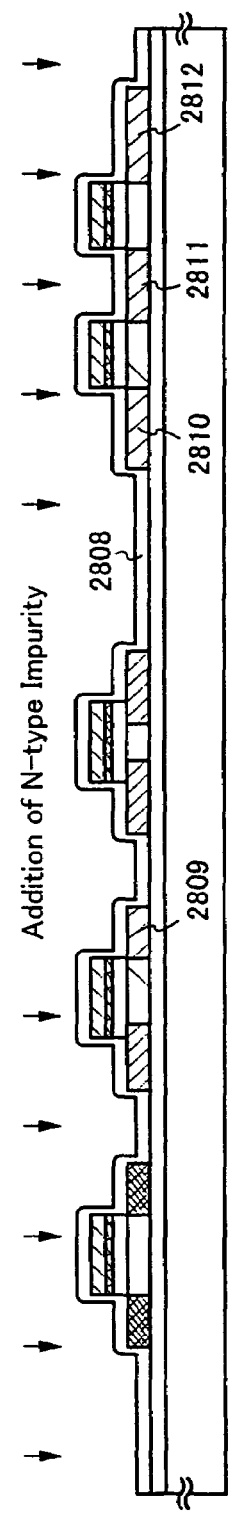

Next, the resist mask 2805 is removed, and a protective film 2808 which comprises an insulation film containing silicon is formed to a thickness of 130 nm. Then, under the same condition as in case of FIG. 2D, the step of adding of an n-type impurity element (phosphorus, in this Embodiment) is carried out. In this way, n-type impurity regions (c) 2809 to 2812 are formed. Although, also to the n-type impurity regions (b) and p-type impurity regions (a) which are already formed, the phosphorus is added at the same time, the concentration of the phosphorus added here is sufficiently low as compared with the concentrations of the impurity elements contained in the other impurity regions and therefore not shown here. (FIG. 28C)

Figure 28D:
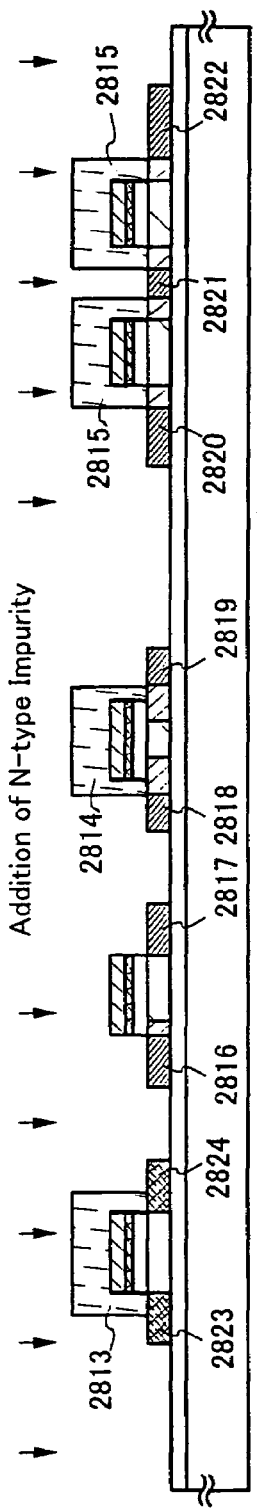

Next, after the protective film 2808 is removed, resist masks 2813 to 2815 are formed, and an n-type impurity element (phosphorus, in this Embodiment) is added under the same condition as in case of FIG. 2F. By this step, n-type impurity regions (a) 2816 to 2822 are formed. Although the phosphorus is added also to portions (the regions indicated by numerals 2823 and 2824) of the p-type impurity regions (a) 2806 and 2807, the phosphorus concentration of these portions is sufficiently low as compared with the concentration of boron contained in the p-type impurity regions (a) and therefore not shown. (FIG. 28D)

After this, the step shown in FIG. 3B and the ensuing steps are carried out in accordance with the steps of Embodiment 1, whereby an active matrix substrate of the structure described in connection with FIG. 3C can be fabricated. In case this Embodiment is practiced, the concentrations of the impurity elements contained in the impurity regions finally formed in the active regions may differ from those in Embodiment 1 in some cases. However, the substantial functions of the respective impurity regions do not differ, so that, as the description of the final structure in case this Embodiment is practiced, the description of the structure shown in FIG. 3C can be directly referred to.

Further, the constitution of this Embodiment can be freely combined with the constitution of any of Embodiments 1, 4 to 24. Further, the constitution of this Embodiment can also be effectively practiced in case of fabricating the active matrix type liquid crystal display devices according to Embodiments 2 and 3.

Embodiment 30

This Embodiment will be described, by referring to FIG. 29, with respect to a case where the TFTs are fabricated in a step order which differs from that of Embodiment 1. Since this Embodiment is identical with Embodiment 1 in respect of the steps ranging from the first step to an intermediate step, so that the same reference numerals will be used as long as the same steps are concerned. Further, as for the impurity elements added, the same impurity elements used in Embodiment 1 will also be used by way of example.

First, the state shown in FIG. 2C is obtained in accordance with the steps of Embodiment 1. Next, the gate insulating film is etched in a self-alignment manner by the use of the gate wirings as a mask. For this etching, the dry etching method is employed, and, as the etching gas, a $CHF_3$ gas is used. However, the etching gas need not be limited to this gas. In this way, gate insulating films 2901 to 2904 are formed underneath the gate wirings. In the pixel TFT, the gate insulating films are etched to the same pattern as in case of the gate wirings, so that they are designated by the same reference numeral. (FIG. 29A)

Next, resist masks 2905 to 2908 are formed, and an n-type impurity element (phosphorus, in this Embodiment) is added under the same condition as in case of FIG. 2F. By this step, n-type impurity regions (a) 2909 to 2917 are formed. (FIG. 29B)

Next, the resist masks 2905 to 2908 are removed, and a resist mask 2918 is newly formed. Then, under the same condition as in case of FIG. 3A, a p-type impurity element (boron, in this Embodiment) is added. By this step, p-type impurity regions (a) 2919 and 2920 are formed. Since the concentration of the boron added here is sufficiently higher than the concentration of the phosphorus added at the foregoing step shown in FIG. 29B, the n-type impurity regions (a) 2909, 2910 are perfectly reversed to the p-type conductivity. (FIG. 29C)

Next, the resist mask 2918 is removed, and a protective film 2921 which comprises an insulation film containing silicon is formed to a thickness of 130 nm. Then, under the same condition as in case of FIG. 2D, the step of adding an n-type impurity element (phosphorous in this Embodiment) is carried out. In this way, n-type impurity regions (c) 2922 to 2925 are formed. Although, also to the n-type impurity regions (b), the n-type impurity regions (a) and the p-type impurity regions (a) which are already formed, the phosphorus is added at the same time, the concentration of the phosphorus added here is sufficiently low as compared with the concentrations of the impurity elements contained in the other impurity regions and therefore not shown. (FIG. 29D)

After this, the step shown in FIG. 3B and the ensuing steps are carried out in accordance with the steps of Embodiment 1, whereby an active matrix substrate of the structure described in connection with FIG. 3C can be fabricated. In case this Embodiment is practiced, the concentrations of the impurity elements contained in the impurity regions formed finally in the active regions may differ from those in Embodiment 1 in some cases. However, the substantial functions of the respective impurity regions do not differ, so that, as the description of the final structure in case this Embodiment is practiced, the description of the structure shown in FIG. 3C can be directly referred to.

Further, the constitution of this Embodiment can be freely combined with the constitution of any of Embodiments 1, 4 to 24. Moreover, the constitution this Embodiment can also be effectively practiced in case of fabricating the active matrix type liquid crystal display devices according to Embodiments 2 and 3.

Embodiment 31

This Embodiment will be described, by referring to FIG. 30, with respect to a case where the TFTs are fabricated in a step order which differs from that of Embodiment 1. Since this Embodiment is identical with Embodiment 1 in respect of the steps ranging from the first step to an intermediate step, so that the same reference numerals will be used as long as the same steps are concerned. Further as for the impurity elements added, the same impurity elements used in Embodiment 1 will also be used by way of example.

First, the state shown in FIG. 2C is obtained in accordance with the steps of Embodiment 1. Next, the gate insulating film is etched in a self-alignment manner by the use of the gate wirings as a mask. For this etching, the dry etching method is employed, and, as the etching as, a $CHF_3$ gas is used. However, the etching gas need not be limited to this gas. In this way, gate insulating films 3001 to 3004 are formed underneath the gate wirings. In the pixel TFT, the gate insulating films are etched to the same pattern as in case of the gate wirings, so that they are designated by the same reference numeral. (FIG. 30A)

Next, resist masks 3005 to 3008 are formed, and an n-type impurity element (phosphorus, in this Embodiment) is added under the same condition as in case of FIG. 2F. By this step, n-type impurity regions (a) 3009 to 3017 are formed. (FIG. 30B)

Next, the resist masks 2905 to 2908 are removed, and a protective film 3018 which comprises an insulation film containing silicon is formed to a thickness of 130 nm. Then, under the same condition as in case of FIG. 2D, the step of adding an n-type impurity element (phosphorus, in this Embodiment) is carried out. In this way, n-type impurity regions (c) 3019 to 3022 are formed. Although, also to the n-type impurity regions (b) and the n-type impurity regions (a) which are already formed, the phosphorus is added at the same time, the concentration of the phosphorus added here is sufficiently low as compared with the concentrations of the impurity elements contained in the other impurity regions and therefore not shown. (FIG. 30C)

Next, after the protective film 3018 is removed, a resist mask 3023 is formed, and a p-type impurity element (boron, in this Embodiment) is added under the same condition as in case of FIG. 3A. By this step, p-type impurity regions 3024, 3025 are formed. The concentration of the boron added here is sufficiently higher than the concentration of the concentration of the phosphorus added at the foregoing step shown in FIG. 30B, so that the n-type impurity regions (a) 3009, 3010 are perfectly inverted to the p-type conductivity. (FIG. 30D)

After this, the step shown in FIG. 3B and the ensuing steps are carried out in accordance with the steps of Embodiment 1, whereby an active matrix substrate of the structure described in connection with FIG. 3C can be fabricated. In case this Embodiment is practiced, the concentrations of the impurity elements contained in the impurity regions formed finally in the active regions may differ from those in Embodiment 1 in some cases. However, the substantial functions of the respective impurity regions do not differ, so that, as the description of the final structure in case this Embodiment is practiced, the description of the structure shown in FIG. 3C can be directly referred to.

Further, the constitution of this Embodiment can be freely combined with the constitution of any of Embodiments 1, 4 to 24. Moreover, the constitution of this Embodiment can also be effectively practiced in case of fabricating the active matrix type liquid crystal display devices according to Embodiments 2 and 3.

Embodiment 32

In case of the fabrication steps disclosed in connection with Embodiments 1, 4 to 31, there are shown examples each constituted in such a manner that, only to the region which is to constitute n-channel type TFTs, channel doping is made to control the threshold voltage, but it is also possible to apply channel doping to the whole surface without making distinction of the n-channel and p-channel type TFTs. In this case, the number of photo masks used at the fabrication steps is reduced, so that the throughput and yield of the fabrication steps can be enhanced.

Further, it is also possible in some cases to make channel doping to the whole surface and add, to the p-channel or the n-channel type TFT, an impurity element which gives the conductivity type opposite to that of the impurity element which has been added to the whole surface.

The constitution of this Embodiment can be freely combined with the constitution of any of Embodiment 1, 4 to 31. Further, it is also effective to practice this Embodiment in case of fabricating the active matrix type liquid crystal display devices according to Embodiments 2 and 3.

Embodiment 33

The fabrication steps of Embodiments 1, 4 to 32 are based on the premise that, before forming the gate wirings of the n-channel type TFTs, the n-type impurity regions (b) which will function later as Lov regions are formed in advance. Further, the p-type impurity regions (a) and the n-type impurity regions (c) are both alike formed in a self-alignment manner, this constituting a feature of these Embodiments 1, 4 to 32.

However, in order to attain the effect of the invention, it suffices if only the final structure is a structure as shown in FIG. 3C, but the invention is not limited to the process to go through for reaching the final structure. Accordingly, in some cases, the p-type impurity regions (a) and the n-type impurity regions (c) can be formed also by the use of resist masks. In this case, the fabrication steps of the invention are not limited to those of Embodiment 1, 4 to 32, but every combination thereof is possible.

Further, it is a matter of course that the constitution of this Embodiment can be practiced in case of fabricating the active matrix type liquid crystal display devices according to Embodiments 2 and 3.

Embodiment 34

This Embodiment will be described with respect to a case where the invention is applied to a semiconductor device fabricated on a silicon substrate. Typically, the invention can be applied to a reflection type liquid crystal display device using, as the pixel electrode, a metal film having a high reflectance.

This Embodiment is constituted as follows: In Embodiments 1 and 4, an n-type or a p-type impurity element is directly added to the silicon substrate (silicon wafer) to form impurity regions such as LDD region, source region or drain region, in which case, according to this Embodiment, there is only included the step of laser-activating n-type impurity regions (b) after the n-type impurity regions (b) are formed. Therefore, this Embodiment is irrelevant to the order of forming the impurity regions other than the n-type impurity regions (b) or to the order of forming the gate insulating films.

Further, this Embodiment is to be, finally, structured so as to comprise a constitution made in such a manner that at least a pixel portion and driving circuits are provided on one and the same substrate, the LDD regions of the n-channel type TFTs which form the driving circuits are disposed so as to partially or wholly overlap the gate wirings, the LDD regions of the pixel TFT which forms the pixel portion are disposed so as not to overlap the gate wirings, and, in the LDD regions of the n-channel type TFTs which form the driving circuits, an n-type impurity element is contained at a concentration higher than that of the LDD regions of the pixel TFT.

Further, it is a matter of course that the constitution of this Embodiment can be practiced in case of fabricating the active matrix type liquid crystal display devices according to Embodiments 2 and 3.

Embodiment 35

In case of Embodiment 1, the description has been made on the premise that Lov regions and Loff regions are disposed only in the n-channel type TFTs, and the positions thereof are used properly in accordance with the circuit specifications, but, if the TFT size is reduced (The channel length is shortened), then the same thing comes to apply also to the p-channel type TFT.

Namely, if the channel length becomes 2 μm or below, then the short channel effect comes to be actually revealed, so that, in some cases, it becomes necessary to dispose a Lov region also in the p-channel type TFT. As stated above, in the invention, the p-channel type TFT is not limited to the structure shown in Embodiment 1, 4 to 31, but may be of the same structure as that of the n-channel type TFT.

Further, in case of practicing this Embodiment, impurity regions are to be formed which contain a p-type impurity element at a concentration of $2\times10^{16}$ to $5\times10^{19}$ atoms/cm$^3$, as in case the n-type impurity regions (b) are formed in the constitution according to one of Embodiment 1, 4 to 31. Further, it is effective to practice this Embodiment which is constituted as described above, in case of fabricating the active matrix type liquid crystal display devices according to Embodiments 2 and 3.

Embodiment 36

In Embodiments 1, 4 to 31, there are disclosed examples of the case where a catalytic element for promoting crystallization is used, as the method of forming a crystalline structure containing semiconductor film, but this Embodiment relates to the case where a crystalline structure containing semiconductor film is formed by thermal crystallization or laser crystallization without using such a catalytic element.

In case of employing thermal crystallization, an amorphous structure containing semiconductor film is formed, and thereafter, a heat treatment step is carried out at a temperature of 600 to 650° C. for 15 to 24 hours. Namely, by performing heat treatment at a temperature exceeding 600° C., natural nuclei are generated, whereby crystallization proceeds.

Further, in case of employing laser crystallization, after an amorphous structure containing semiconductor film is formed, a laser annealing step is carried out by the first optical annealing as disclosed in Embodiment 1. By so doing, a crystalline structure containing semiconductor film can be formed in a short time. Of course, lamp annealing may be used in place of the laser annealing.

As stated above, the crystalline structure containing semiconductor film used in the present invention can be formed by the use of every known means. This Embodiment which is constituted as described above can be practiced in face of fabricating the active matrix type liquid crystal display devices according to Embodiments 2 and 3.

Embodiment 37

This Embodiment will be described with respect to a case where the TFT are fabricated in a step order which differs from that of Embodiment 1. Since this Embodiment is identical with Embodiment 1 in respect of intermediate steps. Further, as for the impurity elements added, the same impurity elements as those used in Embodiment 1 will be used by way of example.

This Embodiment is constituted in such a manner that, after a semiconductor film containing silicon is formed to a thickness of 10 to 30 nm by the step described in Embodiment 1 and shown in FIG. 2D, an n-type impurity element is added. By so doing, it is possible to prevent the formation of n-type impurity regions (c) underneath the gate wirings, even if some of the n-type impurity element runs around.

Namely, the silicon containing insulation film formed on the side walls of the gate wirings forms an offset corresponding to its film thickness, so that a high resistance region can be formed. By so doing, the OFF-current value can be sufficiently lowered.

This Embodiment can be freely combined with any of Embodiments 1, 4 to 36. Further, it is also effective to practice this Embodiment in case of fabricating the active matrix liquid crystal display devices according to Embodiments 2 and 3.

Embodiment 38

While the second optical annealing is performed in process steps shown in the Embodiments 1, 4-8, 13-15, 17-20, 22, 23, and 27-37, it is possible to omit the second optical annealing. In this case, an activation process can be performed after addition of all impurity elements.

Embodiment 39

Figure 40:
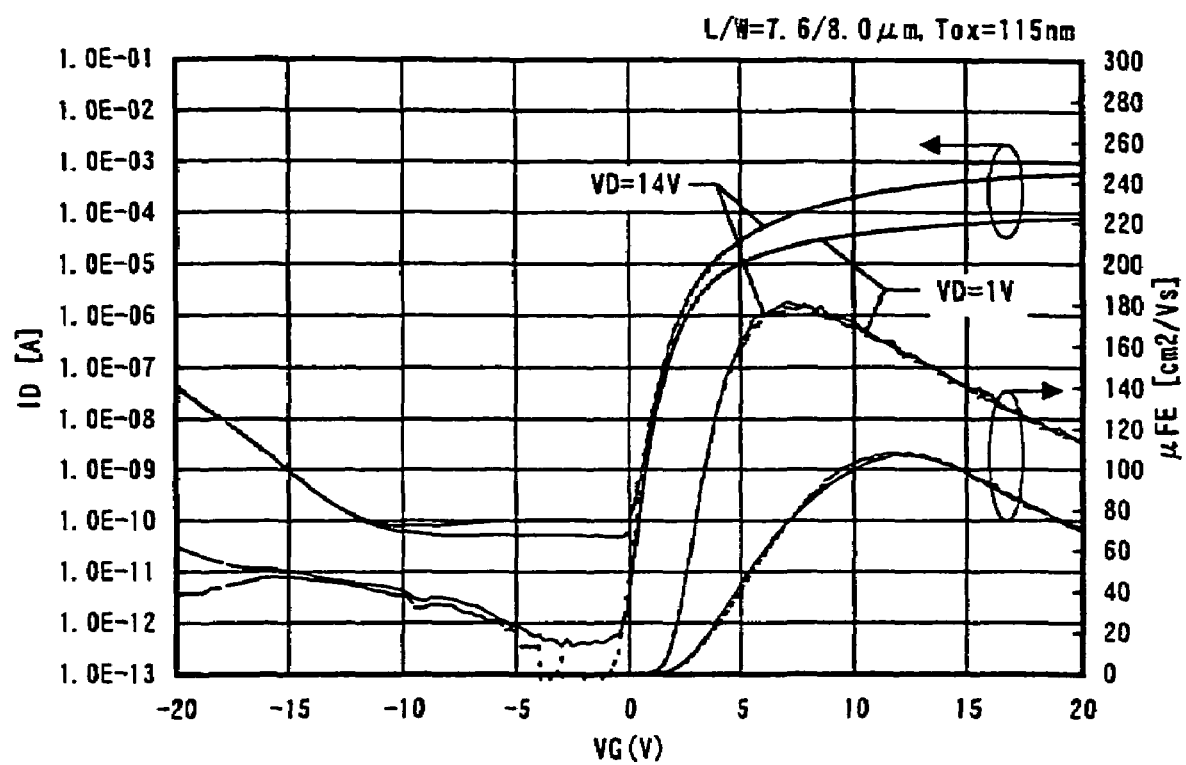
FIG. 40 is a diagram showing a graph of the relationship between drain current (ID) and gate voltage (VG) on an n-channel TFT formed in accordance with the present invention.

FIG. 40 shows a graph of relationship between drain current (ID) and gate voltage (VG) of the n-channel TFT 302 fabricated by the process steps according to the Embodiment 1 (Hereinafter referred to as ID-VG curve). FIG. 40 further shows a graph of relationship between field effect mobility ($\mu_{FE}$) and the gate voltage (VG) of the n-channel TFT. Here, a source voltage (VS) is 0V and a drain voltage (VD) is 1V or 14V. Incidentally, the n-channel TFT has a channel length (L) of 8.1 μm, a channel width (W) of 7.6 μm and a thickness of a gate insulation film (Tox) of 120 nm.

FIG. 40 shows the ID-VG curve and the field effect mobility in which the bold lines represent the characteristic before a stress test and the dotted lines represent the characteristic after the stress test. This graph proves that there is little changes in the ID-VG curve before and after the stress test and the degradation owing to hot carriers is restrained. Incidentally, the stress-test here is performed under the condition that a source at 0V, a drain at 20V and a gate voltage at 4V are applied for 60 seconds at a room temperature, in order to promote the degradation owing to the hot carriers.

Embodiment 40

Figure 41A:
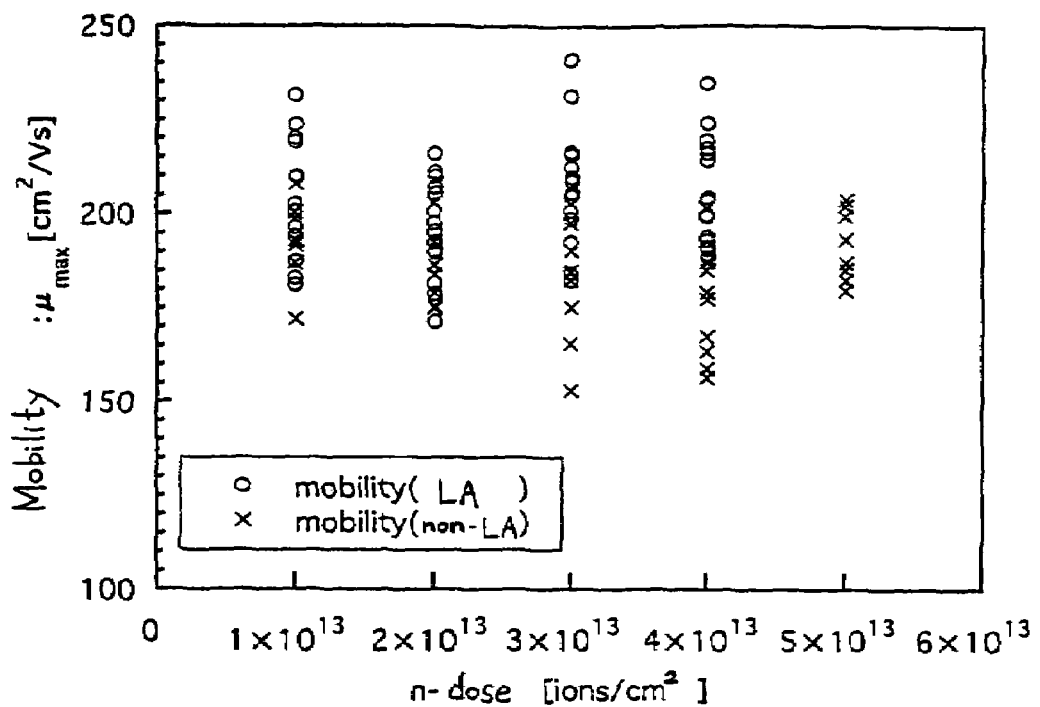
FIG. 41A-41B are diagrams showing differences in electrical characteristics between two embodiments of the present invention.
Figure 41B:
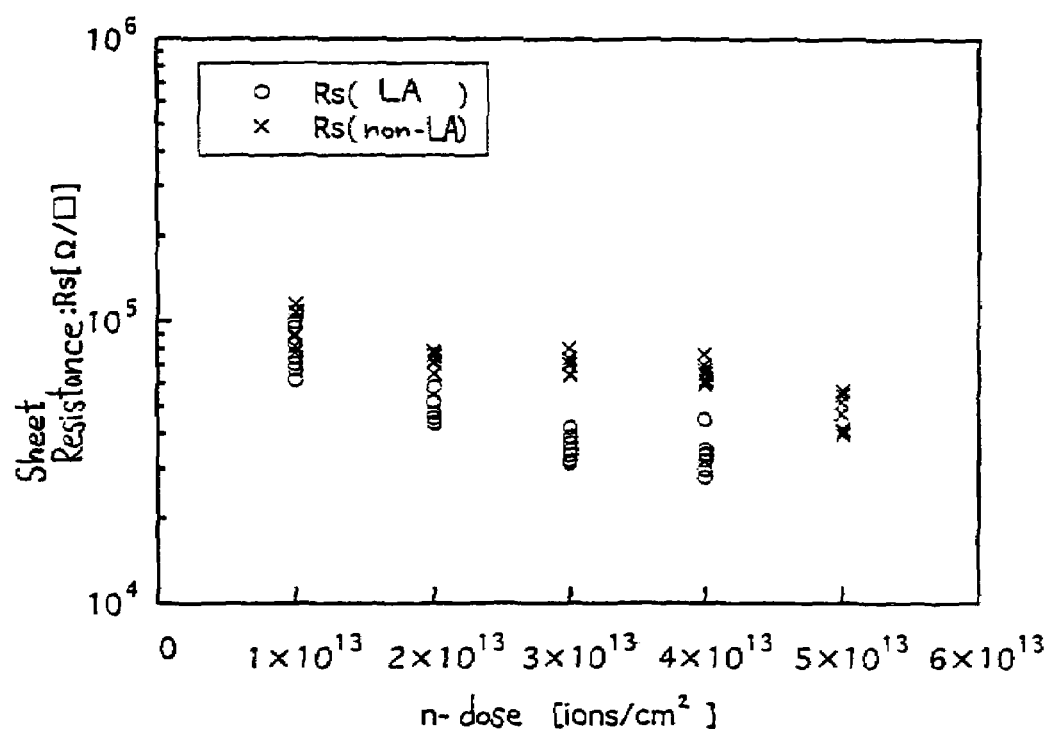

FIGS. 41A and 41B show the differences in the electric characteristics in case whether the process step shown in FIG. 15F (Embodiment 13) is performed. Incidentally, the electric characteristic in FIG. 41A shows a field effect mobility (μFE) and that in FIG. 41B shows a sheet resistance (Rs).

Embodiment 41

The present invention can also be used in case an interlayer dielectric film is formed on a known MOSTFT, and, on this interlayer dielectric film, a TFT is formed. That is, it is possible to realize a semiconductor device having a three-dimensional structure. Further, as the substrate, there can be used a SOI substrate such as SIMOX, Smart-Cut (registered trademark of SOITEC Inc.) or ELTRAN (registered trademark of Canon Inc.).

The constitution of this Embodiment can be freely combined with the constitution of any of Embodiment 1 to 38.

Embodiment 42

For the liquid crystal of the liquid crystal display device fabricated according to the invention, various liquid crystal materials can be used. As such materials, there can be enumerated TN liquid crystal, PDLC (Polymer Dispersed Liquid Crystal), FLC (Ferroelectric Liquid Crystal), AFLC (Antiferroelectric Liquid Crystal), and a mixture of FLC and AFLC.

For example, there can be used the material disclosed in, H. Furue et al.; *Charakteristics and Driving Scheme of Polymer-Stabilized Monostable FLCD Exhibiting Fast Response Time and High Contrast Ratio with Gray-Scale Capability, SID,* 1998, T. Yoshida et al.; *A Full-Color Thresholdless Antiferroelectric LCD Exhibiting Wide Viewing Angle with Fast Response Time,* 841, SID97DIGEST; 1997, or U.S. Pat. No. 5,594,569.

Particularly, in case the thresholdless antiferroelectric LCD (abbreviated to TL-AFLC) is used, the operating voltage of the liquid crystal can be reduced to about ±2.5 V, so that a power supply voltage of about 5 to 8 V is sufficient in some cases. That is, it becomes possible to operate the driving circuits and the pixel portion with the same power supply voltage, whereby the power consumption of the whole liquid crystal display device can be reduced.

Further, a ferroelectric liquid crystal or an anti-ferroelectric liquid crystal has the merit that its response speed is fast as compared with a TN liquid crystal. A crystalline TFT as used in the present invention can realize a TFT with a very fast operating speed, so that it becomes possible to realize a liquid crystal display device with a fast image response speed in which the fastness in response speed of a ferroelectric liquid crystal or an antiferroelectric liquid crystal is sufficiently utilized.

It is a matter of course that the liquid crystal display device according to this Embodiment can be effectively used as the display portion of an electric appliance such as a personal computer.

Further, the constitution of this Embodiment can be freely combined with the constitution of any of Embodiments 1 to 38 and 41.

Embodiment 43

Figure 31:
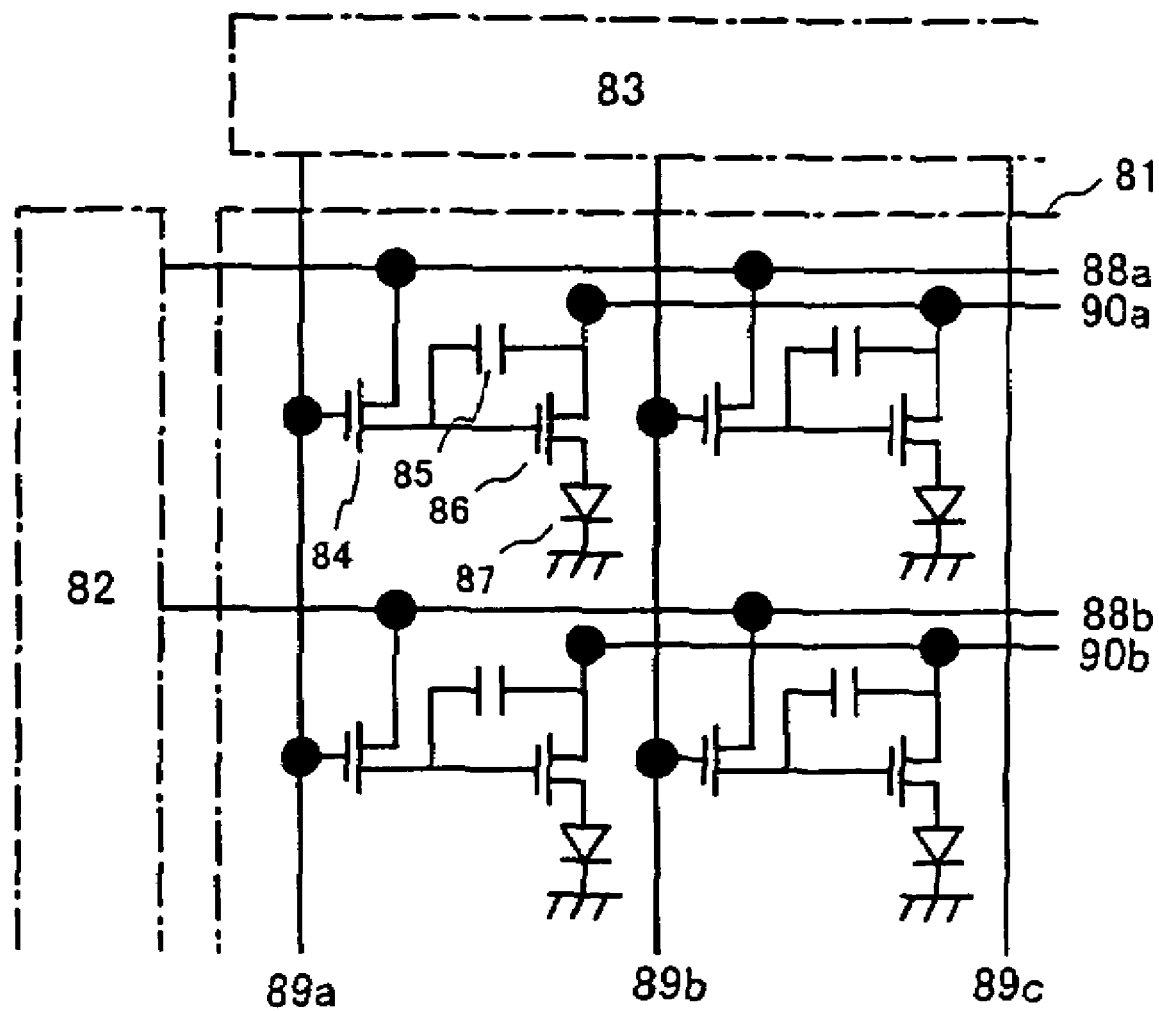
FIG. 31 is a diagram showing the structure of an active matrix type EL display device.

The present invention can also be applied to an active matrix type EL (Electroluminescence) display (which is also known as active matrix type EL display device). FIG. 31 shows an example thereof.

FIG. 31 shows a circuit diagram of the active matrix type EL display according to this Embodiment. The reference numeral 81 denotes a display region, and, in the periphery thereof, an X-direction (source side) driving circuit 82 and a Y-direction (gate side) driving circuit 83 are provided. Further, the pixels in the display region 81 each include a switching TFT 84, a capacitor 85, a current controlling TFT 86, and an EL element 87, wherein, to the switching TFT 84, there are connected an X-direction signal line (source signal line) 88a (or 88b) and a Y-direction signal line (gate signal line) 89a (or 89b, 89c). Further, to the current controlling TFT 86, power supply lines 90a and 90b are connected.

In fabricating the active matrix type EL display according to this Embodiment, the constitution according to any of Embodiments 1, 4 to 38 and 41 may be combined therewith.

Embodiment 44

Figure 32A:
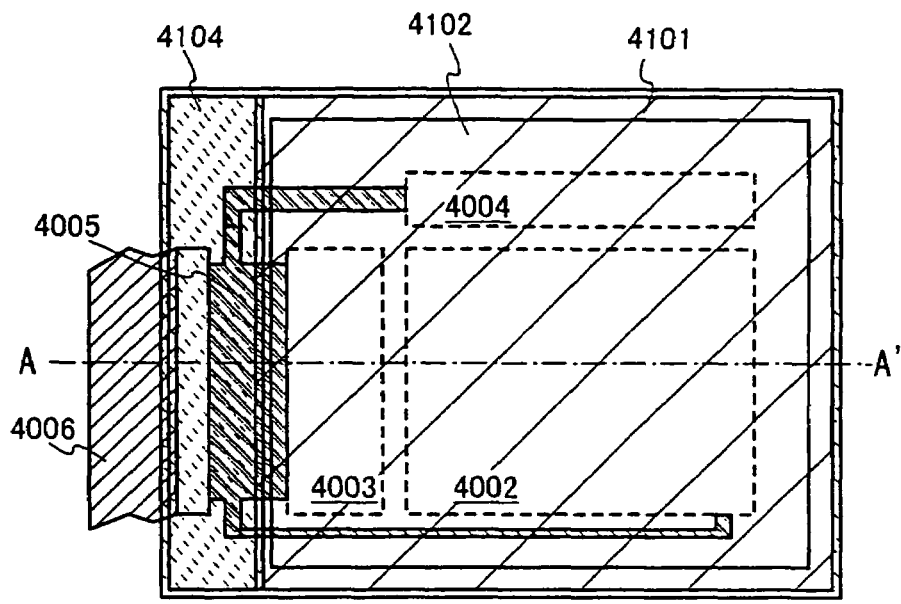
FIGS. 32A-32B are diagrams showing the upper surface structure and the sectional structure of the EL display device.

This Embodiment will be described with reference to an example of the case where an EL (electroluminescence) display device is fabricated by the use of the present invention. FIG. 32A is a top plan view of the EL display device according to the invention, and FIG. 32B is a sectional view thereof.

Referring to FIG. 32A, numeral 4001 denotes a substrate, numeral 4002 denotes a pixel portion, numeral 4003 denotes a source-side driving circuit, and numeral 4004 denotes a gate-side driving circuit, wherein the respective driving circuits lead to an FPC (Flexible Printed Circuit) 4006 via a wiring 4005 and is connected to an external apparatus.

In this case, a first sealing member 4101, a cover member 4102, a filling member 4103 and a second sealing member 4104 are provided in a state surrounding the pixel portion 4002, the source-side driving circuit 4003 and the gate-side driving circuit 4004.

Figure 32B:
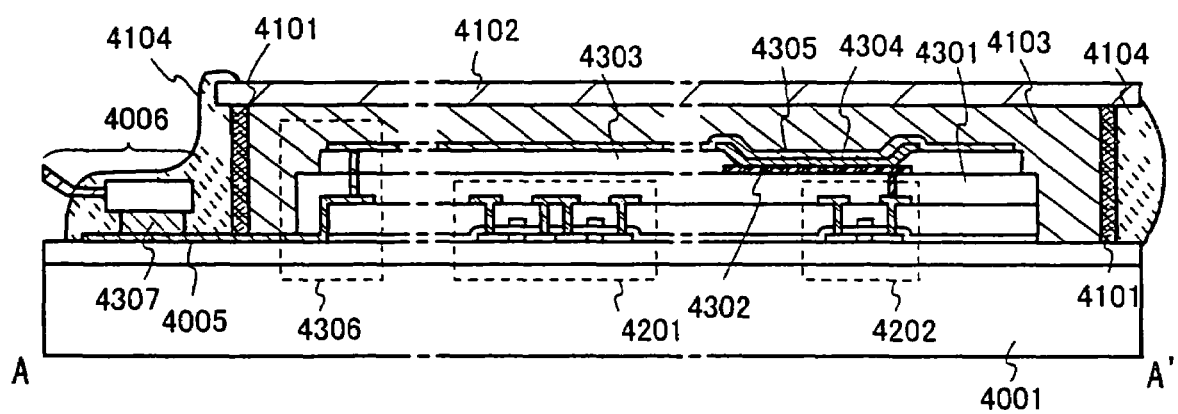

Further, FIG. 32B corresponds to a sectional view taken along the line A-A' in FIG. 32A, wherein, on the substrate 4001, there are formed a driving TFT (Here, however, an n-channel type TFT and a p-channel type TFT are shown) 4201 included in the source side driving circuit 4003 and a current controlling TFT (a TFT for controlling the current to the EL element) 4202 included in the pixel portion 4002.

In this Embodiment, as the driving TFT 4201, there are used TFTs of the same structure as that of the p-channel type TFT 301 and the n-channel type TFT 302 shown in FIG. 3C, and, as the current controlling TFTs 4202, there is used a TFT of the same structure as that of the p-channel type TFT 301 shown in FIG. 3C. Further, in the pixel portion 4002, there is provided a capacitance storage (not shown) connected to the gate of the current controlling TFT 4202.

On the driving TFT 4201 and the pixel TFT 4202, there is formed an interlayer dielectric film (planarization film) 4301 composed of a resin material, and, formed on this interlayer dielectric film 4301 is a pixel electrode (anode) 4302 which is electrically connected to the drain of the pixel TFT 4202. As the pixel electrode 4302, a transparent conductive film which has a large work function is used. As the transparent conductive film, a compound of indium oxide and tin oxide or a compound of indium oxide and zinc oxide can be used.

Further, on the pixel electrode 4302, there is formed an insulation film 4303, which has an opening formed on the pixel electrode 4302. In this opening, an EL (electroluminescence) layer 4304 is formed on the pixel electrode 4302. As the material of the EL layer 4304, a known organic EL material or inorganic EL material can be used. Further, as organic EL materials, there are a low molecular (monomer) material and a high molecular (polymer) material, but either one can be used.

As the method of forming the EL layer 4304, the known evaporation technique or application technique may be used. Further, as for the structure of the EL layer, a hole injection layer, a hole transport layer, a light emitting layer, an electron transport layer or an electron injection layer may be freely combined into a stacked layer structure or a single-layer structure.

Formed on the EL layer 4304 is a cathode 4305 comprising a conductive film with light screening properties (typically, a conductive film composed mainly of aluminum, copper or silver or a stacked layer film comprising such film and another conductive film). Further, the water content and oxygen existing in the interface between the cathode 4305 and the EL layer 4304 should desirably be removed as much as possible. Accordingly, it is necessary to take a suitable measure such as the measure of continuously forming the EL layer 4304 and the cathode 4305 in vacuum or the measure of forming the EL layer 4304 in a nitrogen or rare gas atmosphere and forming the cathode 4305 in a state kept from being touched by oxygen or water content. In this Embodiment, the above-mentioned film formation is made possible by the use of a multi-chamber type (cluster tool type) deposition apparatus.

The cathode 4305 is then electrically connected to the wiring 4005, in a region indicated by numeral 4306. The wiring 4005 is a wiring for applying a predetermined voltage to the cathode 4305 and electrically connected to the FPC 4006 through an anisotropic conductive film 4307.

In this way, an EL element comprised of the pixel electrode (anode) 4302, the EL layer 4304 and the cathode 4305 is formed. This EL element is surrounded by the first sealing member 4101 and the cover member 4102 bonded to the substrate 4001 by the first sealing member 4101 and is enclosed by a filling material 4103.

As the cover member 4102, a glass plate, a metal plate (generally a stainless steel plate), a ceramics plate, an FRP (Fiberglass-Reinforced Plastics) plate, a PVF (Polyvinyl Fluoride) film, a Mylar film, a polyester film or an acrylic film can be used. Further, there can also be used a sheet constituted in such a manner that an aluminum foil is sandwiched between PVF films or Mylar films.

However, in case the direction of the light radiated from the EL element faces the cover member side, the cover member must be made transparent. In this case, a transparent substance film such as a glass plate, a plastics plate, a polyester film or an acrylic film is used.

Further, as the filling material 4103, an ultraviolet curing resin or a thermosetting resin can be used; PVC (polyvinyl chloride), acrylic, polyimide, epoxy resin, silicone resin, PVB (polyvinyl butyral) or EVA (ethylene vinyl acetate) can be used. In case a moisture absorbing substance (preferably barium oxide) is provided within this filling material 4103, the deterioration of the EL element can be suppressed.

Further, a spacer may be incorporated within the filling member 4103. In this case, if the spacer is formed of barium oxide, then it is possible to provide the spacer itself with moisture absorbing properties. Further, in case the spacer is provided, it is effective to provide a resin film on the cathode 4305 as a buffer layer for alleviating the pressure from the spacer.

Further, the wiring 4005 is electrically connected to the FPC 4006 through the anisotropic conductive film 4307. The wiring 4005 conducts to the FPC 4006 the signals sent to the pixel portion 4002, the source side driving circuit 4003 and the gate side driving circuit 4004 and is electrically connected to an external apparatus by the FPC 4006.

Further, in this Embodiment, the second sealing member 4104 is provided so as to cover the exposed portion of the first sealing member 4101 and a portion of the FPC 4006, whereby the EL element is thoroughly shut off from the outside air, thus constituting an EL display device having the sectional structure shown in FIG. 32B. The EL display device according to this Embodiment may be fabricated in combination with the constitution according to any of Embodiments 1, 4 to 38 and 41.

Figure 33:
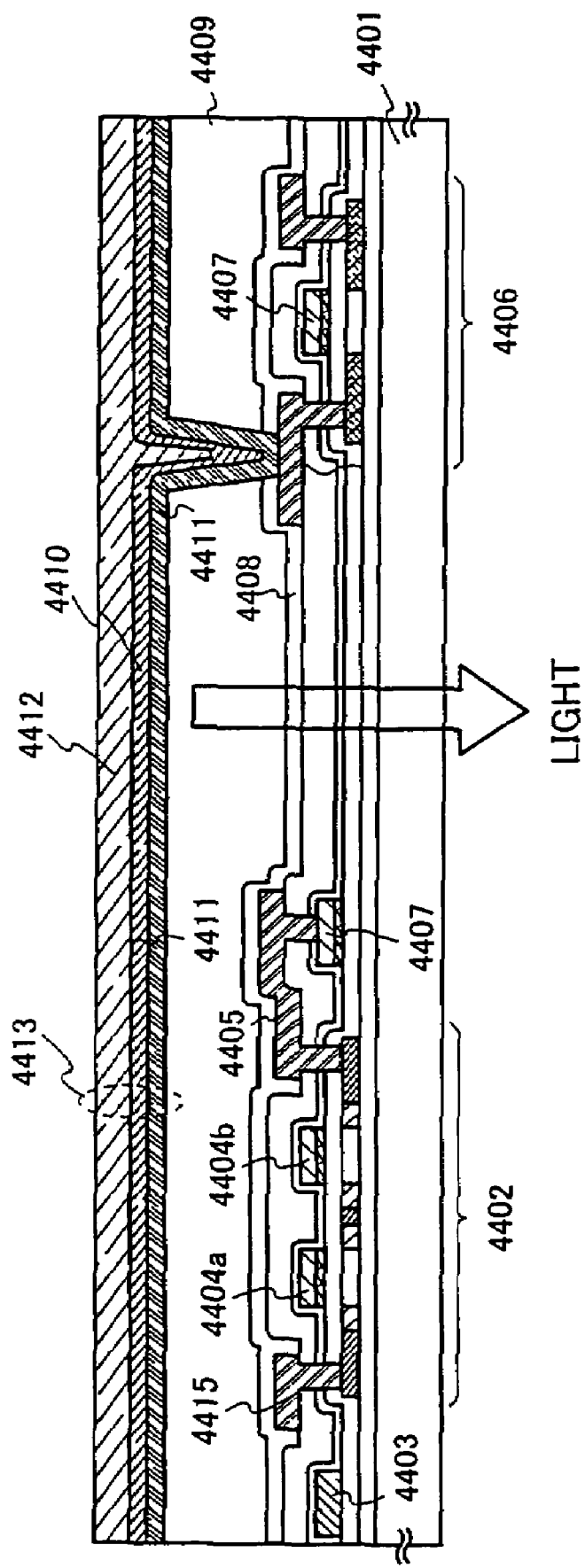
FIG. 33 is a diagram showing the sectional structure of the EL display device.
Figure 34A:
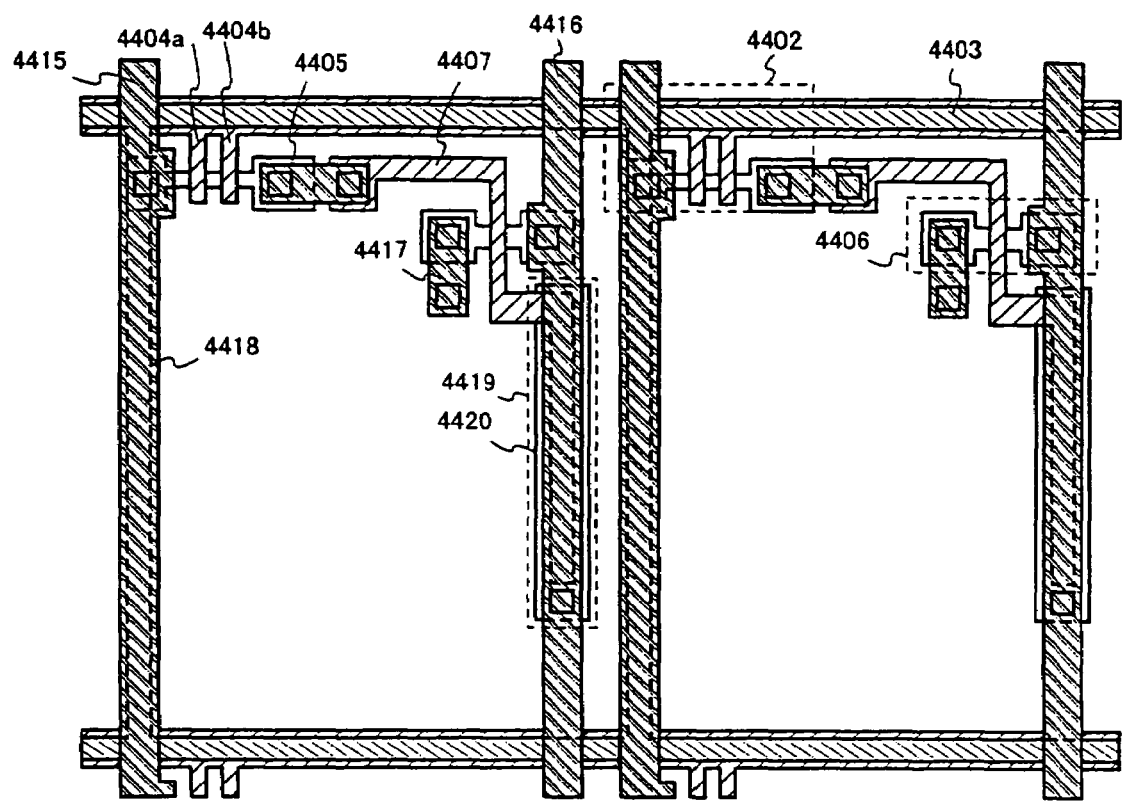
FIGS. 34A-34B are diagrams showing the upper surface structure of the pixel portion of the EL display device.
Figure 34B:
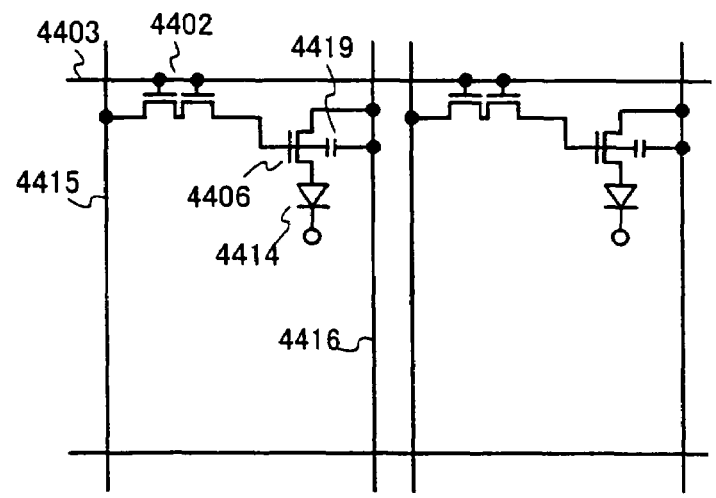

Here, FIG. 33 shows a further detailed sectional structure of the pixel portion, FIG. 34A shows the upper surface structure thereof, and FIG. 34B shows a circuit diagram thereof. In FIG. 33, FIG. 34A and FIG. 34B, common reference numerals are used, so that they may be referred to by one another.

Referring to FIG. 33, a switching TFT 4402 provided on a substrate 4401 is formed by the use of the n-channel type TFT 304 shown in FIG. 3C. Therefore, as the description of the structure, the description of the n-channel type TFT 304 can be referred to. Further, the wiring indicated by numeral 4403 is a gate wiring which electrically connects the gate electrodes 4404a, 4404b of the switching TFT 4402.

In this Embodiment, the double gate structure in which two channel forming regions are formed is employed, but it may alternatively be the single gate structure in which one channel forming region is formed or the triple gate structure in which three channel forming regions are formed.

Further, a drain wiring 4405 of the switching TFT 4402 is electrically connected to a gate electrode 4407 of a current controlling TFT 4406. The current controlling TFT 4406 is formed by the use of the p-channel type TFT 301 shown in FIG. 3C. Therefore, as the description of the structure, the description of the p-channel type TFT 301 can be referred to. In this Embodiment, the single gate structure is employed, but the double gate structure or the triple gate structure may alternatively be employed.

On the switching TFT 4402 and the current controlling TFT 4406, there is provided a first passivation film 4408, on which a planarization film 4409 composed of a resin is formed. It is very important to planarize, by the use of the planarization film 4409, the steps resulting from the TFTs. Since the EL layer which will be formed later is very thin, so that, due to the existence of such steps, defective light emission is caused in some cases. Therefore, it is desirable to perform planarization, before the formation of the pixel electrode, so that the EL layer can be formed as flat as possible.

Further, numeral 4410 denotes a pixel electrode (the anode of the EL element) comprising a transparent conductive film, and this pixel electrode 4410 is electrically connected to a drain wiring 4411 of the current controlling TFT 4406. As the pixel electrode 4410, there can be used a conductive film composed of a compound of indium oxide and tin oxide or a compound of indium oxide and zinc oxide.

On the pixel electrode 4410, an EL layer 4412 is formed. In case of FIG. 33, only one pixel is shown, but, in this Embodiment, EL layers corresponding to the respective colors, R (red), G (green) and B (blue), are made distinctly. Further, in this Embodiment, the EL layer 4412 is formed of a low-molecular organic EL material by the evaporation method. More specifically, there is employed the stacked layer structure constituted in such a manner that, as a hole injection layer, a copper phthalocyanine (CuPc) film is provided to a thickness of 20 nm, and, on this film, a tris-8-quinolinolato aluminum complex ($Alq_3$) film is provided. By adding fluorescent dyes to the $Alq_3$, the color of emitted light can be controlled.

However, what is stated above is an example of the organic EL materials which can be used for the EL layer, and therefore, this Embodiment need not be limited to the above-mentioned example at all. The EL layer (a layer for effecting light emission and the migration of the carriers therefor) may be formed by freely combining the light emitting layer, the charge transport layer or the charge injection layer. For example, in this Embodiment, an example of the case where a low-molecular organic EL material is used as the material of the EL layer is set forth, but a high-molecular organic EL material may be used instead. Further, as the material of the charge transport layer or the charge injection layer, an inorganic material such as silicon carbide can also be used. As these organic and inorganic EL materials, known materials can be used.

Next, on the EL layer 4412, a cathode 4413 comprising a light-screening conductive film is provided. In case of this Embodiment, an alloy film consisting of aluminum and lithium is used as the light-screening conductive film. Of course, a known MgAg film (an alloy film consisting of magnesium and silver) may be used instead. As the cathode material, there is used a conductive film composed of elements belonging to the group I or II of the periodic table or a conductive film to which these elements are added.

At the point of time when this cathode 4413 is formed, the EL element 4414 is completed. By the EL element 4414 mentioned here, the capacitor formed of the pixel electrode (anode) 4410, the El layer 4412 and the cathode 4413 is referred to.

Next, the upper surface structure of the pixel according to this Embodiment will be described by referring to FIG. 34A. The source of the switching TFT 4402 is connected to a source wiring 4415, and the drain thereof is connected to the drain wiring 4405. Further, the drain wiring 4405 is electrically connected to the gate electrode 4407 of the current controlling TFT 4406. The source of the current controlling TFT 4406 is electrically connected to a current supply line 4416, and the drain thereof is electrically connected to a drain wiring 4417. The drain wiring 4417 is electrically connected to a pixel electrode (anode) 4418 indicated by a dotted line.

In this case, in the region indicated by numeral 4419, a capacitance storage is formed. The capacitance storage 4419 is formed among a semiconductor film 4420 electrically connected to the current supply line 4416, an insulation film (not shown) which is the same layer constituting the gate insulating film, and the gate electrode 4407. Further, the capacitance constituted by the gate electrode 4407, the same layer (not shown) as the first interlayer dielectric film, and the current supply wiring 4416 can be also used as a capacitance storage.

In case the EL display device according to this Embodiment is fabricated, it can be practiced in free combination with the constitutions according to Embodiments 1, 4 to 38 and 41.

Embodiment 45

This Embodiment will be described with reference to an EL display device which has a pixel structure different from that of Embodiment 44. For the description of this Embodiment, FIG. 35 will be used. Concerning the portions to which the same reference numerals are used as those used in FIG. 33, the description of Embodiment 44 can be referred to.

Figure 35:
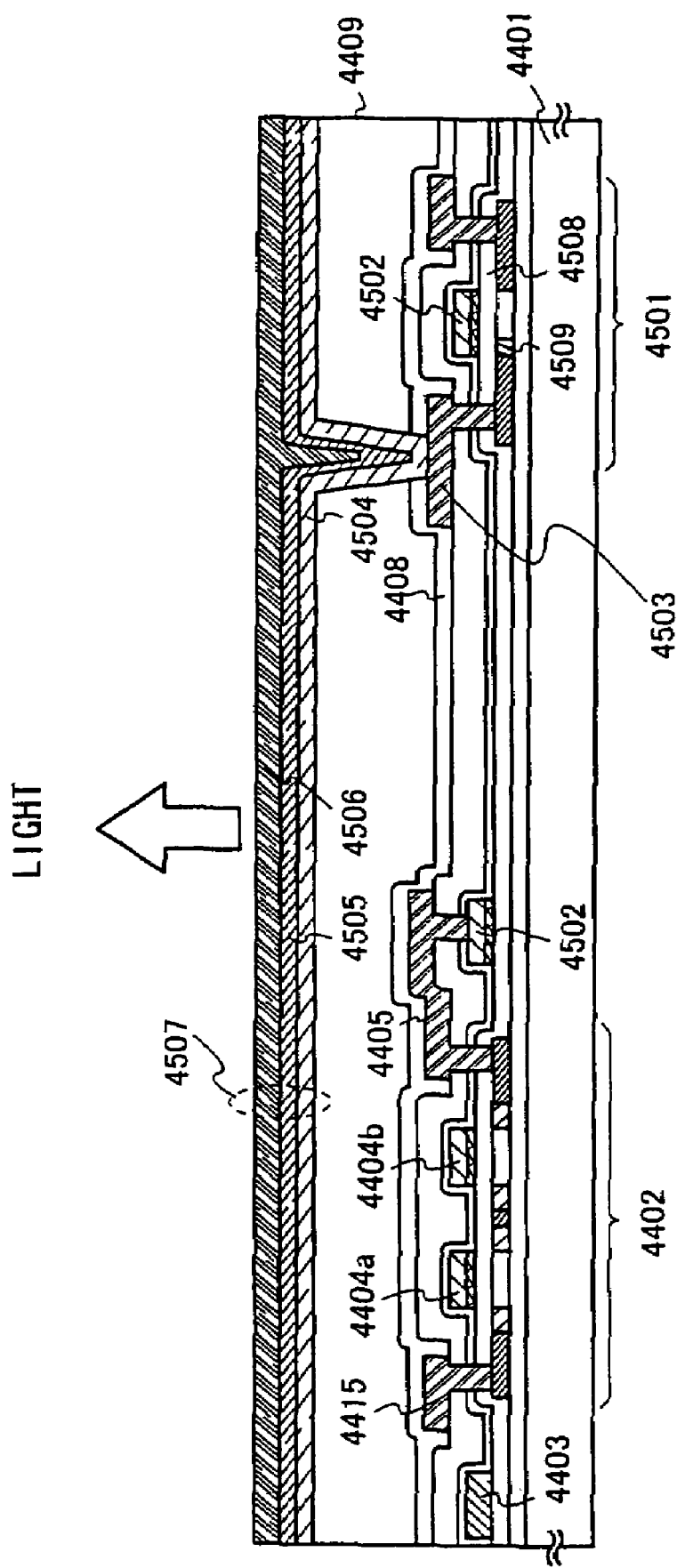
FIG. 35 is a diagram showing the sectional structure of the EL display device.

In case of the structure shown in FIG. 35, a TFT having the same structure as the n-channel type TFT 302 shown in FIG. 3C is used as a current controlling TFT 4501. Of course, a gate electrode 4502 of the current controlling TFT 4501 is connected to the drain wiring 4405 of the switching TFT 4402. Further, the drain wiring 4503 of the current controlling TFT 4501 is electrically connected to a pixel electrode 4504.

In this Embodiment, the pixel electrode 4504 functions as the cathode of the EL element and is formed by the use of a light-screening conductive film. More specifically, an alloy film consisting of aluminum and lithium is used, but a conductive film composed of elements belonging to the group I or II of the periodic table or a conductive film to which these elements are added may be used.

On the pixel electrode 4504, an EL layer 4505 is formed. In FIG. 35, only one pixel is shown, but, according to this Embodiment, an EL layer corresponding to G (green) is formed by the evaporation method and the application method (preferably, the spin coating method). More specifically, there is formed a stacked layer structure constituted in such a manner that a lithium fluoride (LiF) film with a thickness of 20 nm is provided as an electron injection layer, on which a PPV (polyparalphenylene vinylene) film with a thickness of 70 nm is provided as a light emitting layer.

Next, on the EL layer 4505, an anode 4506 comprising a transparent conductive film is provided. In case of this Embodiment, as the transparent conductive film, there is used a conductive film comprising a compound of indium oxide and tin oxide or a compound of indium oxide and zinc oxide.

At the point of time when this anode 4506 is formed, an EL element 4507 is competed. By the EL element 4507 mentioned here, the capacitor formed of the pixel electrode (cathode) 4504, the EL layer 4505 and the anode 4506 is referred to.

In this case, the fact that the current controlling TFT 4501 is of the structure according to the present invention has a very important meaning. The current controlling TFT 4501 is an element for controlling the quantity of current flowing through the EL element 4507, so that much current flows through the current controlling TFT 4501; and therefore, the current controlling TFT 4501 is also an element which is exposed to the high danger of its being deteriorated due to heat or hot carriers. Therefore, the structure according to the present invention in which, at the drain side of the current controlling TFT 4501, an LDD region 4509 is provided so as to overlap the gate electrode 4502 through a gate insulating film 4508, is very effective.

Further, the current controlling TFT 4501 according to this Embodiment is constituted in such a manner that a parasitic capacitance called gate capacitance is formed between the gate electrode 4502 and the LDD region 4509. By adjusting this gate capacitance, a function equal to the capacitance storage 4418 shown in FIGS. 34A and 34B can be provided. Particularly, in case the EL display device is operated in accordance with the digital driving method, the capacitance of the capacitance storage can be smaller than in case the EL display device is operated in accordance with the analog driving method, so that the capacitance storage can be substituted by the gate capacitance.

In case of fabricating the EL display device according to this Embodiment, it can be practiced in free combination with the constitution according to Embodiments 1, 4 to 38 and 41.

Embodiment 46

Figure 36A:
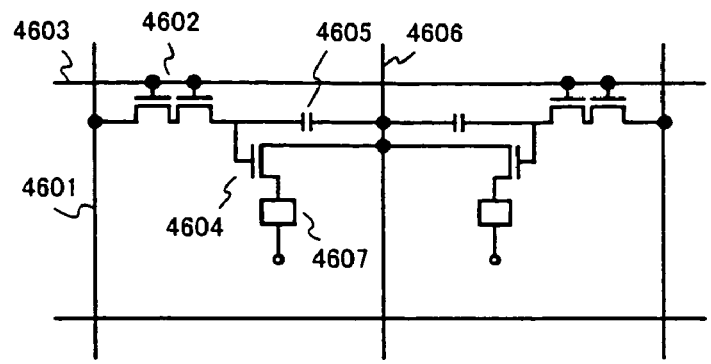
FIGS. 36A-36C are diagrams showing the circuit arrangement of the pixel portion of the EL display device.
Figure 36B:
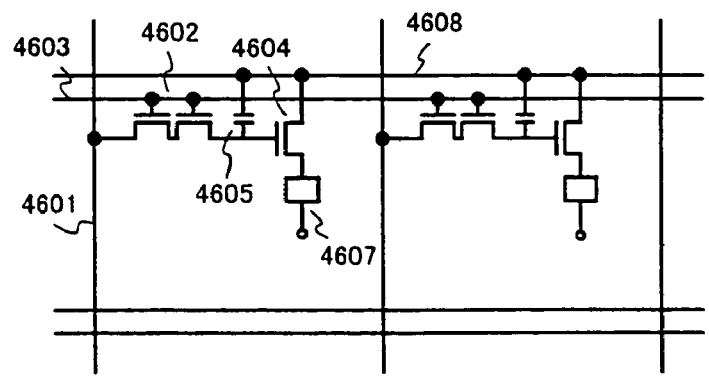
Figure 36C:
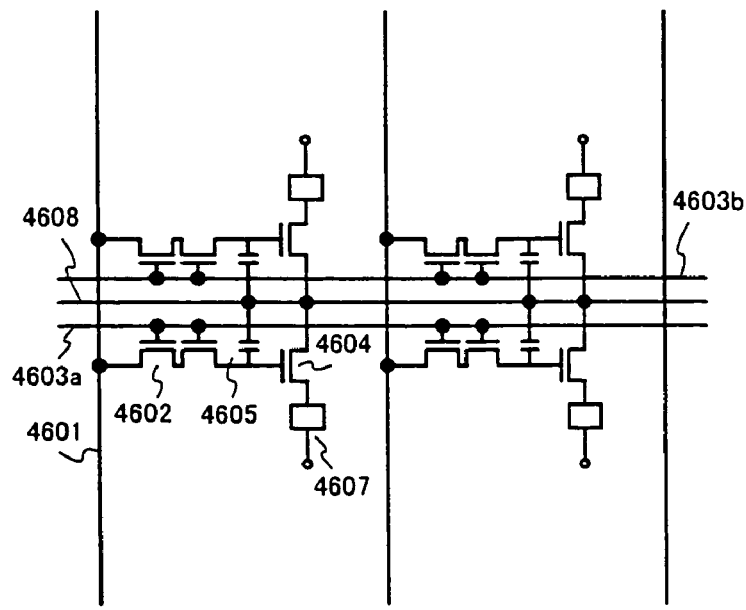

This Embodiment relates to examples of the pixel structure which can be applied to the pixel portion of the EL display device according to Embodiment 44 or 45; these examples are shown in FIGS. 36A to 36C. In this Embodiment, numeral 4601 denotes the source wiring of a switching TFT 4602, numeral 4603 denotes the gate wiring of the switching TFT 4602, numeral 4604 denotes a current controlling TFT, numeral 4605 denotes a capacitor, numerals 4606 and 4608 denote current supply lines, and numeral 4607 denotes an EL element.

FIG. 36A shows an example of the case where the current supply line 4606 is commonly used between two pixels. That is, the feature of this example lies in the point that the two pixels are formed so as to become line-symmetrical with reference to the current supply line 4606. In this case, the number of power supply lines can be reduced, so that the pixel portion can be made more minute and precise.

Further, FIG. 36B shows an example of the case where the current supply line 4608 is provided in parallel to the gate wiring 4603. In the structure shown in FIG. 36B, the current supply line 4608 and the gate wiring 4604 are provided so as not to overlap each other, but if they are wirings formed on different layers, then they can be provided so as to overlap each other through an insulation film. In this case, the occupied area can be used jointly by the power supply line 4608 and the gate Wiring 4603, so that the pixel portion can be made further minute and precise.

The feature of the structure shown in FIG. 36C lies in the point that, as in case of the structure shown in FIG. 36B, the current supply line 4608 is provided in parallel to gate wirings 4603, and further, two pixels are formed so as to become line-symmetrical with reference to the current supply line 4608. Further, it is also effective to provide the current supply line 4608 so as to overlap one of the gate wirings 4603. In this case, the number of the power supply lines can be reduced, so that the pixel portion can be made further minute and precise.

Embodiment 47

The electro-optical device and the semiconductor circuit according to the present invention can be used as the display portion and the signal processing circuit of an electric appliance. As such electric appliances, there can be enumerated a video camera, a digital camera, a projector, a projection TV, a goggle type display (head mount display), a navigation system, a sound reproducing apparatus, a note type personal computer, a game apparatus, a portable information terminal equipment (a mobile computer, a portable telephone, a portable type game machine or an electronic book) and an image reproducing apparatus with a recording medium. FIG. 37 to FIG. 39 show concrete examples of these electric appliances.

Figure 37A:
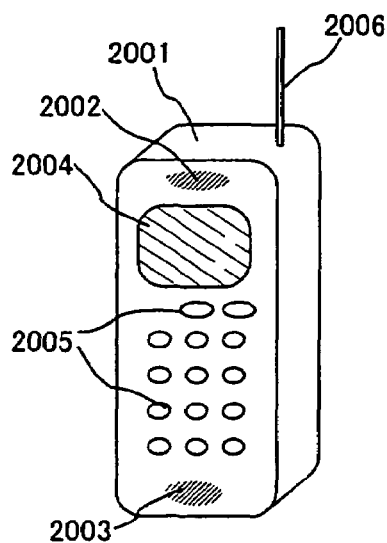
FIGS. 37A-37F are diagrams showing examples of electric appliances.

FIG. 37A shows a portable telephone, which is comprised of a main body 2001, a voice output portion 2002, a voice input portion 2003, a display portion 2004, operation switches 2005 and an antenna 2006. The electro-optical device according to the present invention can be used in the display portion 2004, while the semiconductor circuit according to the invention can be used in the voice output portion 2002, the voice input portion 2003, the CPU or the memory.

Figure 37B:
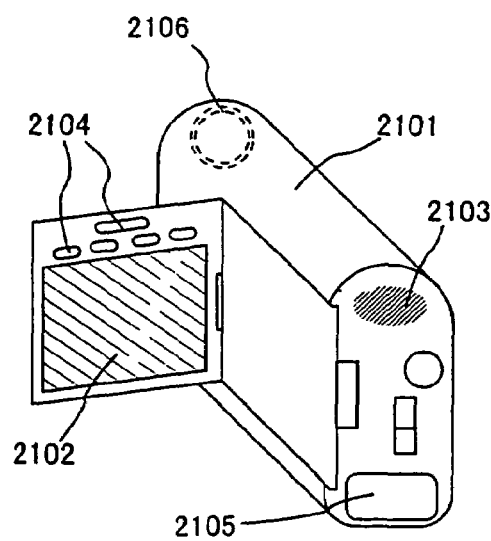

FIG. 37B shows a video camera, which is comprised of a main body 2101, a display portion 2102, a voice input portion 2103, operation switches 2104, a battery 2105, and an image receiving portion 2106. The electro-optical device according to the present invention can be used in the display portion 2102, while the semiconductor circuit according to the invention can be used in the voice input portion 2103, the CPU or the memory.

Figure 37C:
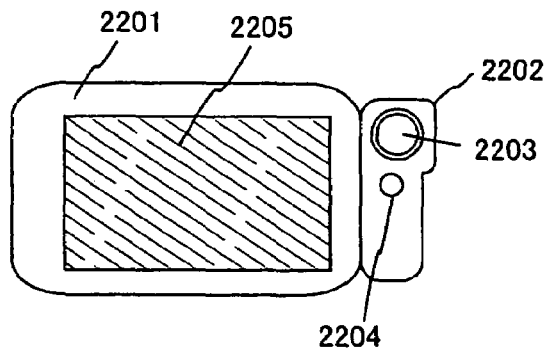

FIG. 37C shows a mobile computer, which is comprised of a main body 2201, a camera portion 2202, an image receiving portion 2203, an operation switch 2204 and a display portion 2205. The electro-optical device according to the invention can be used in the display portion 2205, while the semiconductor device according to the invention can be used in the CPU or the memory.

Figure 37D:
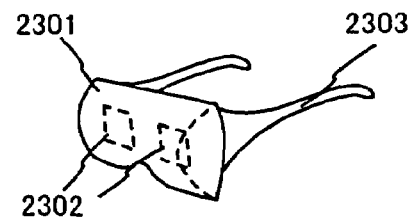

FIG. 37D shows a goggle type display, which is comprised of a main body 2301, display portions 2302, and arm portions 2303. The electro-optical device according to the invention can be used in the display portions 2302, while the semiconductor circuit according to the invention can be used in the CPU or the memory.

Figure 37E:
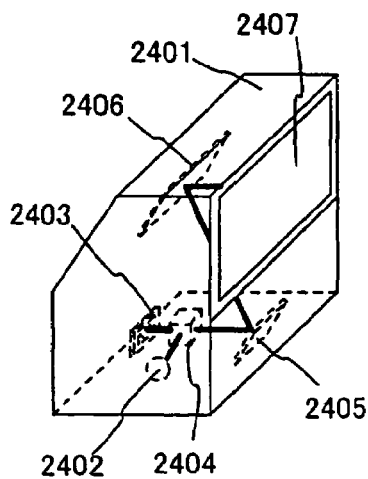

FIG. 37E shows a rear projector (projection TV), which is comprised of a main body 2401, a light source 2402, a liquid crystal display device 2403, a polarization beam splitter 2404, reflectors 2405, 2406, and a screen 2407. The invention can be used in the liquid crystal display device 2403, while the semiconductor circuit according to the invention can be used in the CPU and the memory.

Figure 37F:
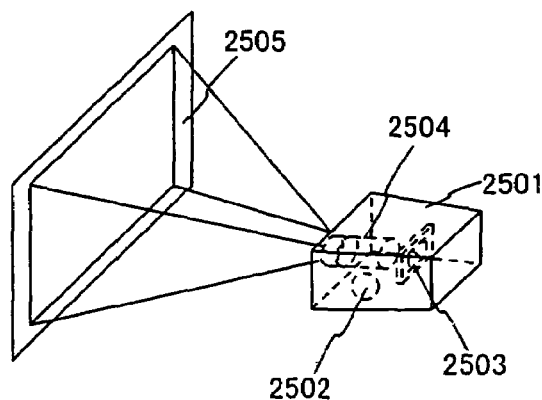

FIG. 37F shows a front projector, which is comprised of a main body 2501, a light source 2502, a liquid crystal display device 2503 and an optical system 2504 and a screen 2505. The invention can be used in the liquid crystal display device 2503, while the semiconductor circuit according to the invention can be used in the CPU and the memory.

Figure 38A:
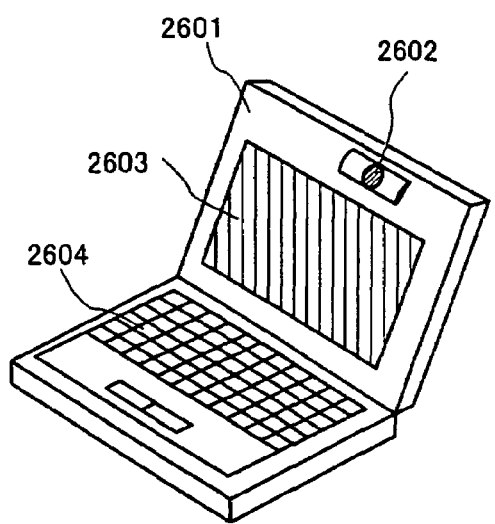
FIGS. 38A-38D are diagrams showing example of electric appliances.

FIG. 38A shows a personal computer, which includes a main body 2601, an image input portion 2602, a display portion 2603, a keyboard 2604, etc. The electro-optical device according to the invention can be used in the display portion 2603, while the semiconductor device according to the invention can be used in the CPU and the memory.

Figure 38B:
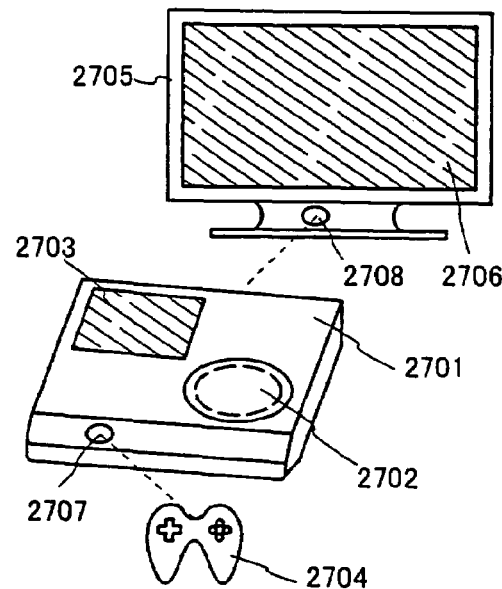

FIG. 38B shows an electronic play apparatus (game apparatus), which includes a main body 2701, a recording medium 2702, a display portion 2703 and a controller 2704. The voice and image outputted from this electronic game apparatus are reproduced by a display including a casing 2705 and a display portion 2706. As the means for communication between the controller 2704 and the main body 2701 or the means for communication between the electronic play apparatus and the display, wire communication, radio communication or optical communication can be used. This Embodiment is constituted in such a manner that infrared rays are sensed by sensor portions 2707 and 2708. The electro-optical device according to the invention can be used in the display portions 2703 and 2706, while the semiconductor device according to the invention can be used in the CPU and the memory.

Figure 38C:
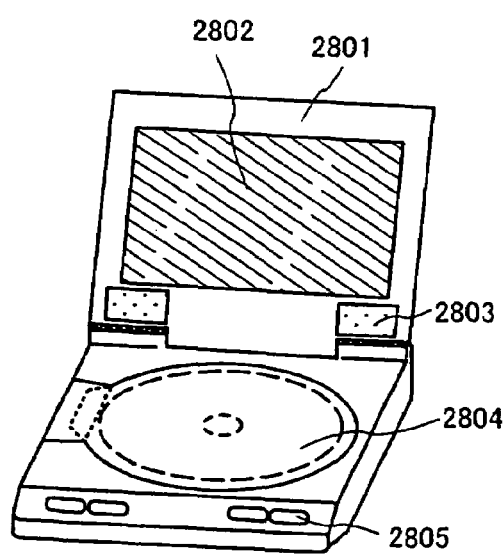

FIG. 38C shows a player (image reproducing apparatus) using a recording medium (hereinafter referred to merely as recording medium) on which a program is recorded; this player includes a main body 2801, a display portion 2802, a loudspeaker portion 2803, a recording medium 2804 and an operation switch 2805. Further, in this image reproducing apparatus, a DVD (Digital Versatile Disc), a CD or the like is used as the recording medium, and, through this apparatus, music and movies can be appreciated, games can be played, and internet communication can be performed. The electro-optical device according to the present invention can be used in the display portion 2802, the CPU and the memory.

Figure 38D:
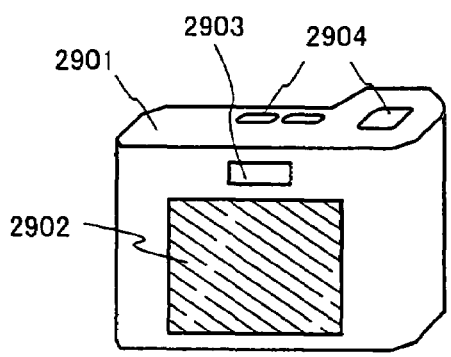

FIG. 38D shows a digital camera, which includes a main body 2901, a display portion 2902, an eye-piece portion 2903, operation witches 2904, and an image receiving portion (not shown). The electro-optical device according to the invention can be used in the display portion 2902, the CPU and the memory.

Figure 39A:
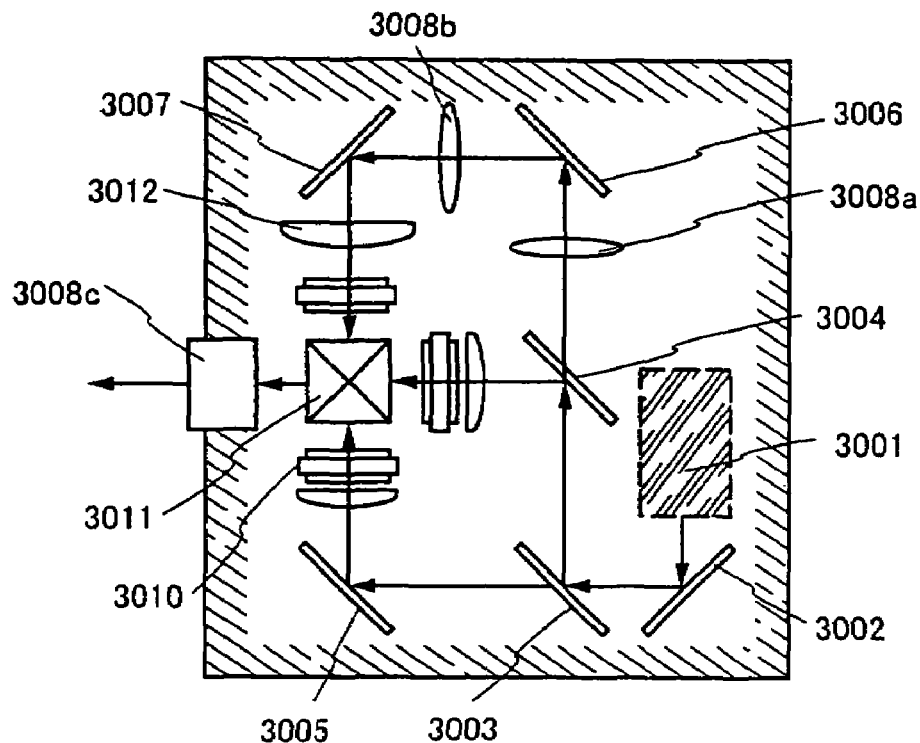
FIGS. 39A-39B are diagrams showing the structure of an optical-engine.
Figure 39B:
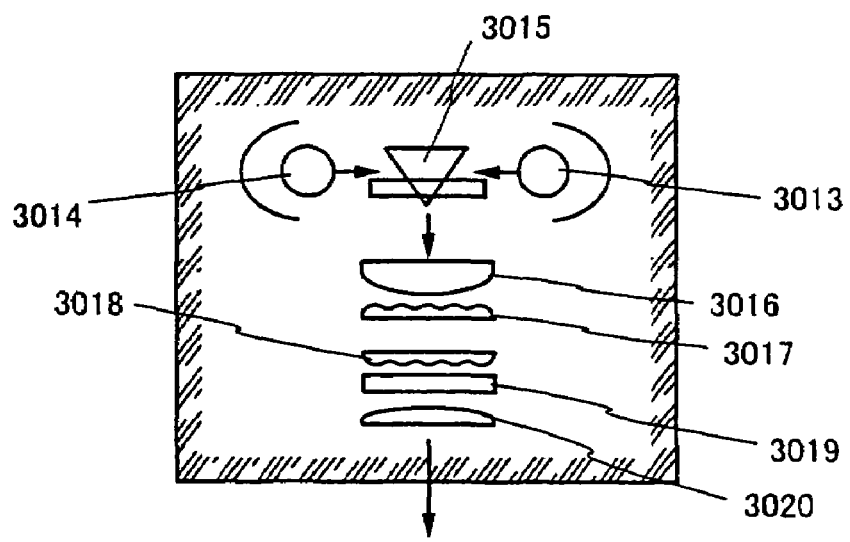

FIGS. 39 show in detail an optical engine which can be used in the rear projector shown in FIG. 37E and the front projector shown in FIG. 37F. FIG. 39A shows the optical engine, and FIG. 39B shows the optical system of the light source built in the optical engine.

The optical engine shown in FIG. 39A includes a light source optical system 3001, mirrors 3002, 3005 to 3007, dichroic mirrors 3003, 3004, optical lenses 3008a to 3008c, a prism 3011, a liquid crystal display device 3010, and a projection optical system 3012. The projection optical system 3012 is an optical system comprising a projection lens. As this Embodiment, a three-plate type using three liquid crystal display devices 3010 is shown by way of example, but a single plate type may also be used. Further, in the optical path indicated by arrows in FIG. 39A, there may be provided an optical lens, a film having a polarizing function, a film for adjusting the phase difference or an IR film.

Further, as shown in FIG. 39B, the light source optical system 3001 includes light sources 3013 and 3014, a complex prism 3015, collimator lenses 3016 and 3020, lens arrays 3017 and 3018, and a polarization conversion element 3019. In the light source optical system shown in FIG. 39B, two light sources are used, but one light source or three or more light sources may be provided. Further, somewhere of the light source optical system, an optical lens, a film having a polarizing function, a film for adjusting the phase difference or an IR film may be provided.

As mentioned above, the range of application of the present invention is very wide; and the invention can be applied to electric appliances in every field. Further, the electric appliance according to this Embodiment can be realized by using a constitution comprising any combination of Embodiments 1 to 38 and 41 to 46.

By the use of the present invention, it becomes possible to dispose, on a substrate, a circuit with an appropriate function in accordance with the specifications required by the circuit; and thus, the operating performance and the reliability of semiconductor devices could be enhanced to substantial degree.

Further, in an active matrix type liquid crystal device or the pixel portion of an electronic device of which an active matrix type EL display device is representative, a storage capacitor which has a small area yet a large capacity can be formed. Therefore, even in case of an electronic device in which the diagonal of the pixel portion is 1 inch or less, it becomes possible to secure a sufficient storage capacitor without lowering the aperture ratio.

Further, the operating performance and reliability of an electric appliance which has such an electronic device as its display portion could be enhanced.

What is claimed is:

1. A method for manufacturing a semiconductor device comprising the steps of:
   forming a crystalline semiconductor film over a substrate;
   irradiating a first light to improve the crystallinity of said crystalline semiconductor film;
   patterning said crystalline semiconductor film to form a semiconductor island;
   introducing a first n-type impurity element into said semiconductor island to form a first impurity region;
   irradiating a second light to activate said first n-type impurity element in said first impurity region;
   forming a gate insulating film on said semiconductor island;
   forming a gate electrode on said gate insulating film after the introduction of said first n-type impurity element so that said gate electrode partially overlaps said first impurity region with said gate insulating film interposed therebetween; and
   introducing a second n-type impurity element into said semiconductor island to form a second impurity region by using said gate electrode as a mask.

2. A method according to claim 1, wherein a concentration of said second n-type impurity element in said second impurity region is higher than that of said first n-type impurity element in said first impurity region.

3. A method according to claim 1, wherein each of said first and second lights is selected from the group consisting of a laser light, a halogen light and an infrared light.

4. A method according to claim 1, wherein said semiconductor device is an active matrix liquid crystal display device or an active matrix electroluminescence display device.

5. A method according to claim 1, wherein said semiconductor device is incorporated into an electric appliance selected from the group consisting of a portable telephone, a video camera, a mobile computer, a goggle type display, a rear projector, a front projector, a personal computer, an electronic play apparatus, an image reproducing apparatus and a digital camera.

* * * * *